(12) United States Patent
Maruyama et al.

(10) Patent No.: US 8,908,293 B2
(45) Date of Patent: Dec. 9, 2014

(54) DISPERSION COMPOSITION, PHOTOSENSITIVE RESIN COMPOSITION, AND SOLID-STATE IMAGE PICK-UP ELEMENT

(75) Inventors: Yoichi Maruyama, Shizuoka (JP); Yuzo Nagata, Shizuoka (JP); Hiroyuki Einaga, Shizuoka (JP); Shinichi Kanna, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 323 days.

(21) Appl. No.: 13/510,669

(22) PCT Filed: Nov. 17, 2010

(86) PCT No.: PCT/JP2010/070502
§ 371 (c)(1),
(2), (4) Date: Jun. 25, 2012

(87) PCT Pub. No.: WO2011/062198
PCT Pub. Date: May 26, 2011

(65) Prior Publication Data
US 2012/0257283 A1  Oct. 11, 2012

(30) Foreign Application Priority Data

Nov. 20, 2009 (JP) ................................. 2009-265605
Nov. 12, 2010 (JP) ................................. 2010-253806

(51) Int. Cl.
| | | |
|---|---|---|
| *G02B 1/00* | (2006.01) | |
| *G02B 1/04* | (2006.01) | |
| *B01F 17/00* | (2006.01) | |
| *C08F 290/06* | (2006.01) | |
| *G03F 7/00* | (2006.01) | |
| *G03F 7/031* | (2006.01) | |
| *G03F 7/033* | (2006.01) | |
| *C08K 3/22* | (2006.01) | |
| *G02B 3/00* | (2006.01) | |

(52) U.S. Cl.
CPC ............. *G02B 1/04* (2013.01); *B01F 17/0007* (2013.01); *B01F 17/0028* (2013.01); *C08F 290/06* (2013.01); *G03F 7/0007* (2013.01); *G03F 7/031* (2013.01); *G03F 7/033* (2013.01); *C08K 3/22* (2013.01); *G02B 3/0012* (2013.01); *C08K 2003/2241* (2013.01)
USPC .......................................................... 359/722

(58) Field of Classification Search
CPC ........... G02B 5/22; G02B 5/223; G02B 5/206
USPC .............. 359/491.01, 722, 723, 885; 524/497
See application file for complete search history.

(56) References Cited

U.S. PATENT DOCUMENTS

| | | | |
|---|---|---|---|
| 2008/0171272 A1* | 7/2008 | Nakashima et al. | 430/7 |
| 2008/0268354 A1* | 10/2008 | Suzuki | 430/7 |
| 2009/0082487 A1 | 3/2009 | Kanda | |
| 2010/0261816 A1 | 10/2010 | Kuwahara et al. | |

FOREIGN PATENT DOCUMENTS

| | | |
|---|---|---|
| JP | 2004-287409 A | 10/2004 |
| JP | 2008-046268 A | 2/2008 |
| JP | 2008-185683 A | 8/2008 |
| JP | 2009-096977 A | 5/2009 |
| JP | 2009-179678 A | 8/2009 |
| WO | 2009/054437 A1 | 4/2009 |
| WO | 2009/116442 A1 | 9/2009 |
| WO | 2010/098327 A1 | 9/2010 |

OTHER PUBLICATIONS

Notice of Reasons for Rejection, dated Jul. 22, 2014, issued in corresponding JP Application No. 2010-253806, 4 pages in English and Japanese.

* cited by examiner

*Primary Examiner* — Joseph P Martinez
(74) *Attorney, Agent, or Firm* — Sughrue Mion, PLLC

(57) ABSTRACT

A photosensitive resin composition which can form a pattern attaining high resolution and having a high refractive index and a high transmittance is provided. The photosensitive resin composition includes a dispersion composition including (A) titanium dioxide particles having an average primary particle diameter of from 1 nm to 100 nm, (B) a graft copolymer that has a graft chain having a number of atoms other than hydrogen atoms in a range of from 40 to 10,000 and (C) a solvent, and (D) a polymerizable compound, and (E) a polymerization initiator.

18 Claims, No Drawings

DISPERSION COMPOSITION, PHOTOSENSITIVE RESIN COMPOSITION, AND SOLID-STATE IMAGE PICK-UP ELEMENT

TECHNICAL FIELD

The invention relates to a dispersion composition, a photosensitive resin composition, and a solid-state image pick-up element.

BACKGROUND ART

For the purpose of use in microlenses for optical image forming systems of on-chip color filters in electronic copying machines, solid-state image pick-up elements, and the like, or use in optical interconnection to replace copper wires, photosensitive resin compositions that can form a transparent fine pattern with a high refractive index are required.

In particular, miniaturization of microlenses used in solid-state image pick-up elements is demanded in conjunction with miniaturization of solid-state image pick-up elements, and microlenses having a higher refractive index are demanded in order to achieve more efficient light concentration. In addition, in order to simplify a process for producing a solid-state image pick-up element, a negative-type photosensitive resin composition for forming a microlens that allows pattern formation in a similar manner as that in a color filter formation method is demanded.

For example, there is a disclosure of a photopolymerization composition prepared using titanium oxide particles coated with silica, which composition can provide a pattern having a high refractive index (for example, see Japanese Patent Application Laid-Open (JP-A) No. 2009-179678). Additionally, there is a disclosure of a composition for solid-state image pick-up elements prepared using a metal oxide particle in which the ratio of silicon atoms on the particle surface is 20% or more, with which composition a high refractive index and excellent pattern formability is achieved (for example, see JP-A No. 2008-185683).

SUMMARY OF INVENTION

Technical Problem

It was, however, difficult to achieve a resolution of 0.5 microns to 2 microns required for microlenses by using the negative-type photosensitive resin compositions such as those described in JP-A Nos. 2009-179678 and 2008-185683.

The invention has been made in view of the above circumstances, and it is an object of the invention to provide a dispersion composition having a high refractive index and a high transmittance, a photosensitive resin composition which can form a pattern attaining high resolution and having a high refractive index and a high transmittance, and a solid-state image pick-up element formed by using the photosensitive resin composition.

Solution to Problem

Specific aspects of the invention are as follows:

<1> A dispersion composition including (A) titanium dioxide particles having an average primary particle diameter of from 1 nm to 100 nm, (B) a graft copolymer that has a graft chain having a number of atoms other than hydrogen atoms in a range of from 40 to 10,000, and (C) a solvent.

<2> The dispersion composition according to the <1>, in which the graft chain of (B) the graft copolymer is at least one selected from the group consisting of polyester structures, polyether structures, and poly(meth)acrylic structures.

<3> The dispersion composition according to the <1> or <2>, in which (B) the graft copolymer is a graft copolymer including at least a structural unit represented by any of the following Formulae (1) to (5):

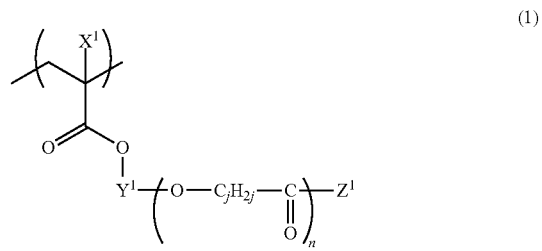

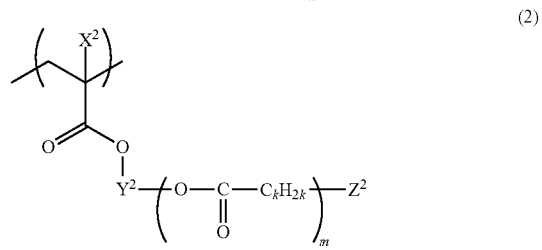

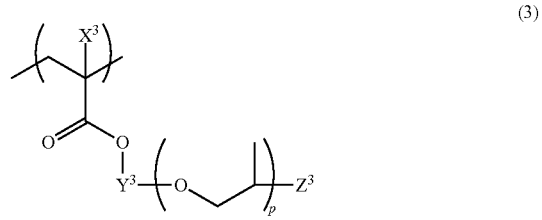

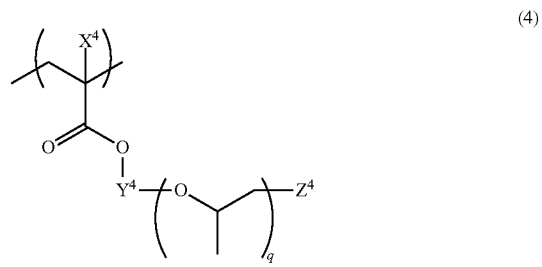

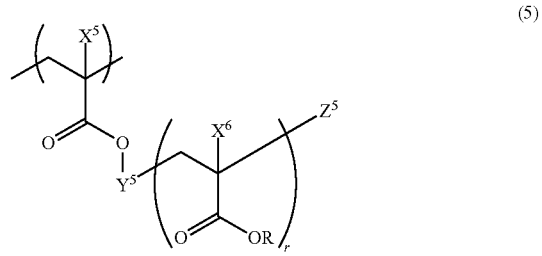

In Formulae (1) to (5), $X^1$, $X^2$, $X^3$, $X^4$, $X^5$, and $X^6$ each independently represent a hydrogen atom or a monovalent organic group; $Y^1$, $Y^2$, $Y^3$, $Y^4$, and $Y^5$ each independently represent a divalent linking group; $Z^1$, $Z^2$, $Z^3$, $Z^4$, and $Z^5$ each independently represent a hydrogen atom or a monovalent organic group; R represents a hydrogen atom or a monovalent organic group, wherein plural Rs having structures that are different from one another may be present in the copolymer;

n, m, p, q, and r each independently represent an integer of from 1 to 500; and j and k each independently represent an integer of from 2 to 8.

<4> The dispersion composition according to the <3>, in which (B) the graft copolymer is a graft copolymer including the structural unit represented by any of Formulae (1) to (5) in a range of from 10% by mass to 90% by mass with respect to a total mass of the graft copolymer.

<5> The dispersion composition according to any one of the <1> to <4>, in which (B) the graft copolymer is a graft copolymer further including a structural unit that has a functional group capable of interacting with titanium dioxide particles.

<6> The dispersion composition according to any one of the <1> to <5>, in which (B) the graft copolymer is a graft copolymer further having at least one selected from a carboxylic acid group, a sulfonate group, and a phosphate group.

<7> A photosensitive resin composition including the dispersion composition according to any one of the <1> to <6>, (D) a polymerizable compound, and (E) a polymerization initiator.

<8> The photosensitive resin composition according to the <7>, further including a binder polymer.

<9> The photosensitive resin composition according to the <7> or <8>, further including an ultraviolet absorber represented by the following Formula (I):

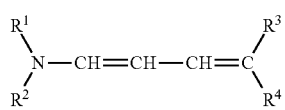

Formula (I)

In Formula (I), $R^1$ and $R^2$ each independently represent a hydrogen atom, an alkyl group having 1 to 20 carbon atoms, or an aryl group having 6 to 20 carbon atoms; $R^1$ and $R^2$ may be the same as or different from each other, but $R^1$ and $R^2$ do not simultaneously represent a hydrogen atom, and $R^1$ and $R^2$ may form a cyclic amino group together with the nitrogen atom; and $R^3$ and $R^4$ each independently represent an electron withdrawing group.

<10> The photosensitive resin composition according to any one of the <7> to <9>, in which (E) the polymerization initiator is an oxime polymerization initiator.

<11> The photosensitive resin composition according to any one of the <7> to <10>, which is used for microlens formation.

<12> A solid-state image pick-up element, including a transparent pattern formed using the photosensitive resin composition according to any one of the <7> to <11>.

<13> The solid-state image pick-up element according to the <12>, in which the formed transparent pattern is a microlens.

The dispersion composition of the invention includes, as a dispersant, (B) the graft copolymer that has a graft chain having a number of atoms other than hydrogen atoms in a range of from 40 to 10,000. For example, the graft chain functions as a steric repulsive group, and therefore good dispersibility can be realized, whereby titanium dioxide can be uniformly dispersed. Furthermore, even when the dispersion composition of the invention is stored at room temperature for a long period of time, sedimentation of the titanium dioxide particles can be suppressed over a long period of time, because of the interaction between the graft chain and a solvent. Furthermore, when a film is formed using the dispersion composition of the invention, sedimentation of the titanium dioxide particles is suppressed due to the graft chain functioning as a steric repulsive group, which allows the content of titanium dioxide to be increased, whereby a film with a high refractive index can be obtained.

In general, when a pattern is formed using a photosensitive resin composition in which a graft copolymer is used as a dispersant, developability is low, and therefore residue tend to be easily generated. On the other hand, when a pattern is formed using the photosensitive resin composition of the invention, in which a polymer having a graft chain with a specific length is used, the generation of residue, which is presumably caused by the reduction in solubility in developer, can be reduced.

In particular, when a graft copolymer including the structural unit represented by any one of Formulae (1) to (5), which are preferable embodiments of the invention, is used in the photosensitive resin composition, the hydrophilicity of the graft chain is further increased. It is assumed that, the developability of the graft copolymer is thus further increased, whereby both excellent dispersibility and the reduced generation of residue in development are achieved.

Further, when a photosensitive resin composition, which includes the dispersion composition of the invention obtained using the graft copolymer, is coated to form a coating film, the obtained coating film has good surface uniformity. This is presumed to be caused by, for example, favorable interaction between the graft chain of the graft copolymer of the invention and the solvent.

Furthermore, by using the graft copolymer having the specific structural unit and an oxime initiator in combination, a pattern with a higher resolution can be formed.

Advantageous Effects of Invention

According to the invention, there can be provided a dispersion composition having a high refractive index and a high transmittance, a photosensitive resin composition which can form a pattern attaining high resolution and having a high refractive index and a high transmittance, and a solid-state image pick-up element formed using the photosensitive resin composition.

DESCRIPTION OF EMBODIMENTS

Dispersion Composition

The dispersion composition of the invention includes at least one kind of (A) titanium dioxide particles having an average primary particle diameter of from 1 nm to 100 nm, at least one kind of (B) graft copolymer that has a graft chain having a number of atoms other than hydrogen atoms in a range of from 40 to 10,000, and (C) a solvent.

With such a constitution, the dispersion composition having a high refractive index and a high transmittance can be formed. Furthermore, in the dispersion composition of the invention, dispersibility of the titanium dioxide particles is high, and sedimentation of the titanium particles is suppressed, whereby excellent storage stability is exhibited.

(A) Titanium Dioxide Particles

Titanium dioxide particles (hereinafter, may be simply referred to as "titanium dioxide") used in the invention are not specifically restricted as long as the particles have an average primary particle diameter (hereinafter, may be simply referred to as "primary particle diameter") of from 1 nm to 100 nm. For example, those appropriately selected from commercially available titanium dioxide particles can be used.

The primary particle diameter of the titanium dioxide particles is from 1 nm to 100 nm, but preferably from 1 nm to 80 nm, and particularly preferably from 1 nm to 50 nm. When the primary particle diameter of the titanium dioxide particles exceeds 100 nm, the refractive index and the transmittance can be decreased. When the primary particle diameter of the titanium dioxide particles is below 1 nm, the dispersibility can be reduced due to aggregation.

The average primary particle diameter of the titanium dioxide particles can be calculated from photographs obtained in the observation of dispersed titanium dioxide particles under a transmission electron microscope. Specifically, projected areas of the titanium dioxide particles are measured, and an average of equivalent circular diameters corresponding to the projected areas is defined as the average primary particle diameter of the titanium dioxide particles. Here, the primary particle diameter in the invention is an arithmetical average value of equivalent circular diameters calculated with regard to 300 titanium dioxide particles.

Furthermore, in the invention, an average particle diameter can be used as an index of the primary particle diameter. That is, as the average primary particle diameter of the titanium dioxide particles of the invention, there may be used a value obtained by diluting a mixed solution or dispersion including titanium dioxide 80-fold with propylene glycol monomethyl ether acetate and then performing measurement regarding the obtained diluted solution by using dynamic light scattering. The measurement is defined as a number-average particle diameter obtained using MICROTRACK UPA-EX 150 (trade name) manufactured by Nikkiso Co., Ltd.

In the invention, the refractive index of the titanium dioxide particles is not specifically restricted. However, from the viewpoint of obtaining a high refractive index, the refractive index thereof is preferably from 1.70 to 2.70, and more preferably from 1.90 to 2.70.

In addition, the titanium dioxide particles have a specific surface area of preferably from 10 $m^2/g$ to 400 $m^2/g$, more preferably from 20 $m^2/g$ to 200 $m^2/g$, and most preferably from 30 $m^2/g$ to 150 $m^2/g$.

Furthermore, the shape of the titanium dioxide particles is not specifically restricted. The shape of the titanium dioxide particles can be, for example, rice grain-shaped, spherical, cubic, spindle-shaped, or irregular.

The titanium dioxide particles of the invention may be those subjected to a surface treatment with an organic compound. Examples of the organic compound used for the surface treatment include polyols, alkanolamines, stearic acid, silane coupling agents, and titanate coupling agents. Among these, silane coupling agents are preferable.

The surface treatment may be performed with single surface treatment agent or with a combination of two or more kinds of surface treatment agents.

Furthermore, it is preferable that the surfaces of the titanium dioxide particles are coated with an oxide such as aluminum, silicon, or zirconia. This further improves the weatherability.

Commercially available products may be preferably used as the titanium dioxide in the invention. Specific examples of the commercially available titanium dioxide include TTO series (such as TTO-51(A), TTO-51(C), or TTO-55(C)), TTO-S and TTO-V series (such as TTO-S-1, TTO-S-2, or TTO-V-3) (trade names, manufactured by ISHIHARA SANGYO KAISHA, Ltd.), and MT series (such as MT-01 or MT-05) (trade names, manufactured by TAYCA CORPORATION).

In the invention, the titanium dioxide may be used singly or in combination of two or more kinds thereof.

From the viewpoint of dispersion stability, the content of the titanium dioxide in the dispersion composition of the invention is preferably from 15% by mass to 50% by mass, more preferably from 15% by mass to 40% by mass, and particularly preferably from 20% by mass to 40% by mass, with respect to a total dispersion composition.

When the photosensitive resin composition of the invention is formed, the content of the titanium dioxide in the photosensitive resin composition is from 0.5% by mass to 90% by mass, more preferably from 1% by mass to 80% by mass, and most preferably from 2% by mass to 70% by mass, with respect to a total photosensitive composition.

In the invention, in addition to the titanium dioxide particles, inorganic particles other than titanium dioxide may be used in combination. Examples of the inorganic particles that can be used in combination include $ZrO_2$ particles and $SiO_2$ particles.

(B) Graft Copolymer

The dispersion composition of the invention includes at lest one kind of graft copolymer (hereinafter, also referred to as a "specific resin"). The graft copolymer of the invention includes at lest one kind of graft chain having a number of atoms other than hydrogen atoms in a range of from 40 to 10,000. The graft chain in this case means a chain branched from its root in the main chain of the copolymer to the terminal of the branched group. In the dispersion composition, the specific resin is a dispersion resin that imparts dispersibility to titanium dioxide particles, and has excellent dispersibility and affinity to a solvent owing to the graft chain. Therefore, the dispersion composition has excellent dispersibility of titanium dioxide and excellent dispersion stability over time. Further, when a photosensitive resin composition is formed using the dispersion composition, due to affinity of the graft chain for the polymerizable compound or for other resins which can be used in combination therewith, hardly any residue is generated by alkali development In addition, by further introducing an alkali soluble partial structure such as a carboxylic acid group or the like into the specific resin, the specific resin can function as a resin that provides developability for pattern formation by alkali development. Accordingly, when an alkali soluble partial structure is introduced into the graft copolymer included in the dispersion composition of the invention, the dispersion resin itself, which is essential for dispersing titanium dioxide particles, in the photosensitive resin composition of the invention becomes alkali-soluble. Such a photosensitive resin composition is preferable since it has excellent pattern formability in an exposed region and improved alkali developability in an unexposed region.

As (B) the graft copolymer used in the invention, the number of atoms other than hydrogen atoms per graft chain is preferably from 40 to 10,000, the number of atoms other than hydrogen atoms per graft chain is more preferably from 50 to 2,000, and the number of atoms other than hydrogen atoms per graft chain is still more preferably from 60 to 500.

When the number of atoms other than hydrogen atoms per graft chain is less than 40, the graft chain is short, and therefore, the steric repulsive effect may be reduced, and the dispersibility may be decreased. On the other hand, when the number of atoms other than hydrogen atoms per graft chain exceeds 10,000, the graft chain is excessively long, and therefore, the adsorptivity to titanium dioxide may be decreased, and dispersibility may be reduced.

Here, the number of atoms other than hydrogen atoms per graft chain corresponds to the number of atoms other than hydrogen atoms included in a branch polymer branched from the main chain, from a root atom bonded to a polymer chain configuring the main chain to the terminal of the branched polymer.

When two or more kinds of graft chains are included in the graft copolymer, it is sufficient that the number of atoms other than hydrogen atoms in at least one kind of graft chain meets the above requirement.

As the polymer structure of the graft chain, a poly(meth) acryl structure, a polyester structure, a polyurethane structure, a polyurea structure, a polyamide structure, a polyether structure, or the like may be used. In order to increase the interaction property of the graft chain with a solvent to enhance the dispersibility, a graft chain including a poly(meth)acryl structure, a polyester structure, or a polyether structure is preferable, and a graft chain including a polyester structure or a polyether structure is more preferable.

The structure of a macro monomer having such a polymer structure as a graft chain is not limited to specific structures, as long as the macro monomer has a substituent capable of reacting with the polymer main chain moiety, and satisfies the features of the invention, but preferably, macro monomers having a reactive double bond group may be suitably used.

Examples of commercially available macro monomers that can be suitably used for the synthesis of the specific resin include AA-6, AA-10, AB-6, AS-6, AN-6, AW-6, AA-714, AY-707, AY-714, AK-5, AK-30, and AK-32 (all manufactured by Toagosei Co., Ltd.); and BLEMMER PP-100, BLEMMER PP-500, BLEMMER PP-800, BLEMMER PP-1000, BLEMMER 55-PET-800, BLEMMER PME-4000, BLEMMER PSE-400, BLEMMER PSE-1300, and BLEMMER 43PAPE-600B (all manufactured by NOF Corporation). Among these, AA-6, AA-10, AB-6, AS-6, AN-6, and BLEMMER PME-4000 are preferable.

The graft chain of the specific resin used in the invention preferably includes at least one structural unit represented by any one of the following Formulae (1) to (5).

In particular, when a graft copolymer including the structural unit represented by any one of Formulae (1) to (5), which are preferable embodiments of the invention, is used in the photosensitive resin composition, the hydrophilicity of the graft chain is further increased. As a result, the developability of the graft copolymer is further increased, whereby both excellent dispersibility and the reduced residue in development can be achieved at high level.

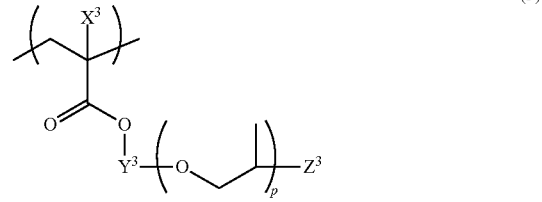
(1)

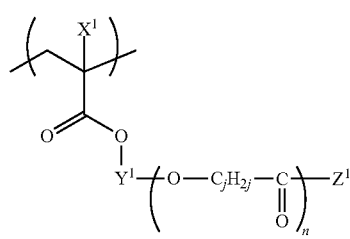
(2)

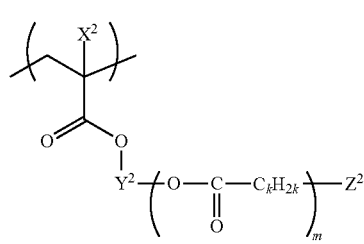
(3)

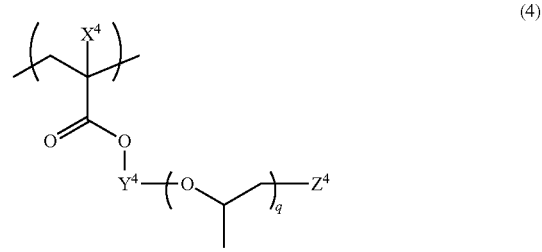
(4)

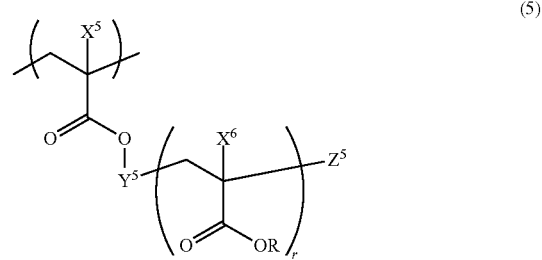
(5)

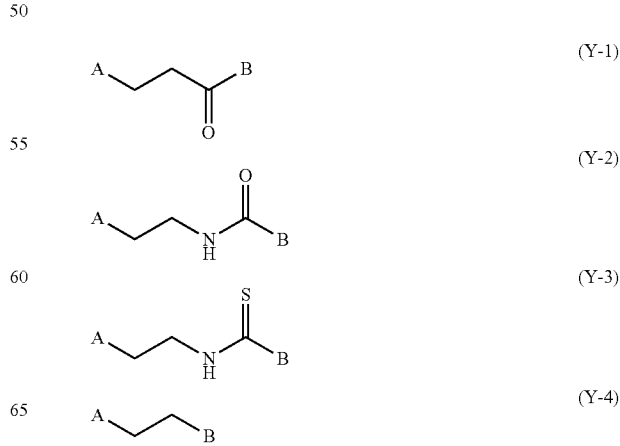

In Formulae (1) to (5), $X^1$, $X^2$, $X^3$, $X^4$, $X^5$, and $X^6$ each independently represent a hydrogen atom or a monovalent organic group. From the viewpoint of the restrictions on synthesis, a hydrogen atom or an alkyl group having 1 to 12 of carbon atoms is preferable, a hydrogen atom or a methyl group is more preferable, and a methyl group is particularly preferable.

In Formulae (1) to (5), $Y^1$, $Y^2$, $Y^3$, $Y^4$, and $Y^5$ each independently represent a divalent linking group, and the structure thereof is not particularly restricted. Specific examples thereof include the connecting group represented by the following (Y-1) to (Y-20). In the following structures, "A" represents a bond to the left terminal end group of $Y^1$, $Y^2$, $Y^3$, $Y^4$, or $Y^5$ in Formulae (1) to (5), and "B" represents a bond to the right terminal end group of $Y^1$, $Y^2$, $Y^3$, $Y^4$, or $Y^5$ in Formulae (1) to (5). Among the following structures, (Y-2) and (Y-13) are more preferable from the viewpoint of the convenience of synthesis.

(Y-1)

(Y-2)

(Y-3)

(Y-4)

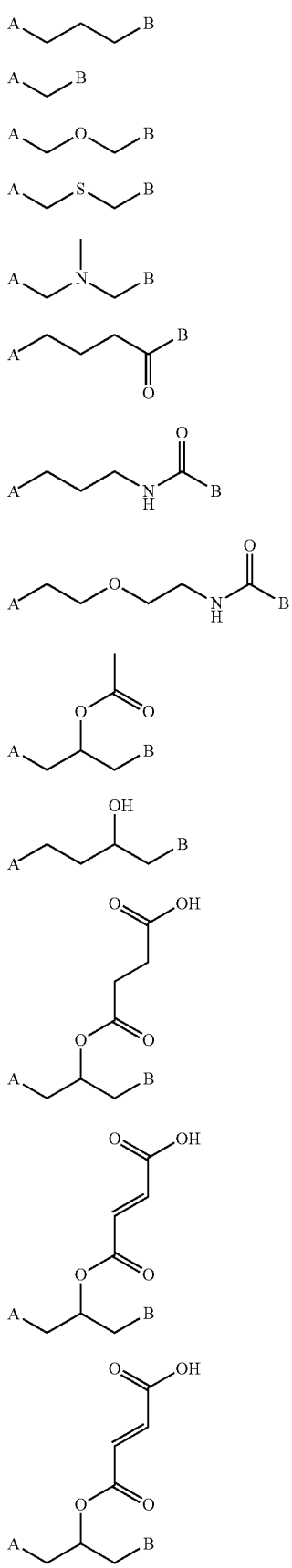
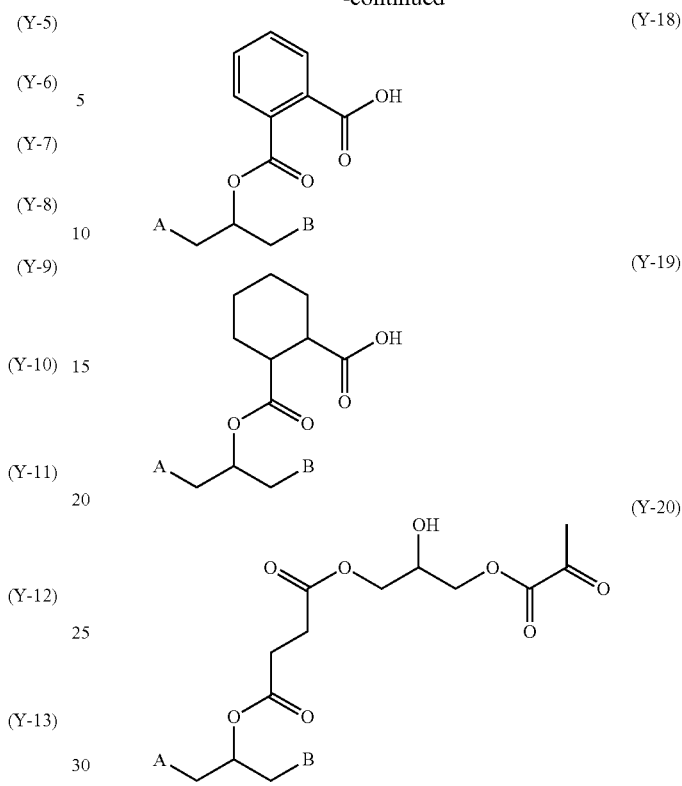

In Formulae (1) to (5), $Z^1$, $Z^2$, $Z^3$, $Z^4$, and $Z^5$ each independently represent a hydrogen atom or a monovalent organic group. Specific examples of the structures of the monovalent organic group include, but not particularly limited to, an alkyl group, a hydroxy group, an alkoxy group, an aryloxy group, a heteroaryloxy group, an alkylthioether group, an aryl thioether group, a heteroaryl thioether group, and an amino group. Among these, in order to improve dispersibility, a group having a steric repulsive effect is preferable. Specifically, an alkyl group having 5 to 24 carbon atoms is preferable, and among these, a branched-chain alkyl group having 5 to 24 carbon atoms or a cyclic alkyl group having 5 to 24 carbon atoms is more preferable.

In Formulae (1) to (5), n, m, p, q, and r each independently represent an integer of from 1 to 500, preferably an integer of from 3 to 100, and more preferably an integer of from 5 to 50.

In Formulae (1) and (2), j and k each independently represent an integer of from 2 to 8. From the viewpoint of dispersion stability and developability, it is preferable that j and k in Formulae (1) and (2) each independently represent an integer of from 4 to 6, and it is more preferable that j and k in Formulae (1) and (2) each independently represent an integer of 5.

In Formula (5), R represents a hydrogen atom or a monovalent organic group, and the structure thereof is not particularly limited. R is preferably a hydrogen atom, an alkyl group, an aryl group, or a heteroaryl group, and more preferably a hydrogen atom or an alkyl group. When R represents an alkyl group, the alkyl group is preferably a straight-chain alkyl group having 1 to 20 carbon atoms, a branched-chain alkyl group having 3 to 20 carbon atoms, or a cyclic alkyl group having 5 to 20 carbon atoms, more preferably a straight-chain alkyl group having 1 to 20 carbon atoms, and still more preferably a straight-chain alkyl group having 1 to 6 carbon atoms.

Further, with regard to R in Formula (5), two or more kinds of R that have different structures from one another may be included in the specific resin.

The structural unit represented by Formula (1) is preferably a structural unit represented by the following Formula (1A), from the viewpoint of dispersion stability and developability.

Furthermore, the structural unit represented by Formula (2) is preferably a structural unit represented by the following Formula (2A), from the viewpoint of dispersion stability and developability.

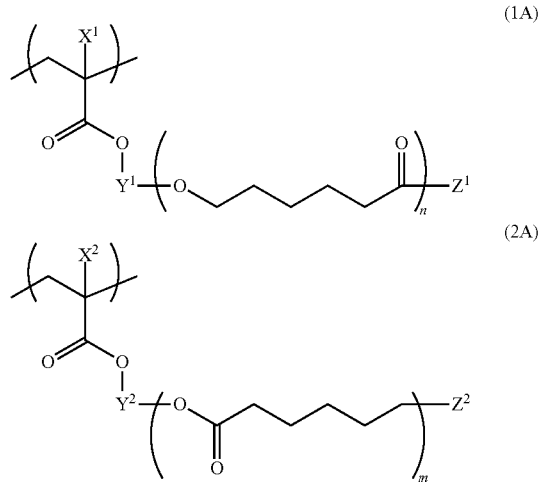

In Formula (1A), X', Y', Z' and n have the same definitions and the same preferable definitions as $X^1$, $Y^1$, $Z^1$ and n in Formula (1), respectively.

In Formula (2A), $X^2$, $Y^2$, $Z^2$ and m have the same definitions and the same preferable definitions as $X^2$, $Y^2$, $Z^2$ and m in Formula (2), respectively.

In the specific resin used in the invention, the content of the structural unit represented by any of Formulae (1) to (5) (total content in the case of plural kinds of structural units each represented by any one of Formulae (1) to (5) being included) is preferably in a range of from 10% by mass to 90% by mass, and more preferably in a range of from 30% by mass to 70% by mass, with respect to a total mass of the specific resin. When the content of the structural unit(s) is within these ranges, the dispersibility of titanium dioxide particle is enhanced, and the developability when used in the photosensitive resin composition is better. The specific resin to be used in the invention may be a combination of two or more kinds of graft copolymers whose structures are different from one another.

In Formula (5), R represents a hydrogen atom or a monovalent organic group, and the structure thereof is not particularly limited. R is preferably a hydrogen atom, an alkyl group, an aryl group, or a heteroaryl group, and more preferably a hydrogen atom or an alkyl group. Further, two or more kinds of R that have different structures from one another may be included in the specific resin. For example, when plural R are included in a structural unit represented by Formula (5), the plural R may be the same as or different from one another, or the structural units represented by Formula (5) in the specific resin may be the same as or different from one another.

In the specific resin of the invention, a functional group capable of interacting with titanium dioxide may be introduced other than the graft chain. It is preferable that the specific resin further includes a structural unit that has a functional group capable of interacting with titanium dioxide. The structure of the structural unit having a functional group capable of interacting with titanium dioxide is not particularly limited, and examples thereof include a structural unit having an acid group, a structural unit having a basic group, a structural unit having a coordinating group, a structural unit having reactivity and the like.

Examples of the acid group include a carboxylic acid group, a sulfonic acid group, a phosphoric acid group. From the viewpoint of adsorptive force to titanium dioxide and dispersibility, the acidic group selected from at least one of a carboxylic acid group, a sulfonic acid group, or a phosphoric acid group is preferable, and a carboxylic acid group is more preferable. As the acid group, these groups may be used singly or in combination of two or more kinds thereof.

Introducing such an acid group has also the advantages that the alkali developability of the specific resin can be further increased.

The content of a copolymerization component that forms the structural unit having acid group suitably used in the specific resin of the invention is from 0.1% by mol to 50% by mol. From the viewpoint of suppressing damage to the image strength due to alkali development, the content is particularly preferably from 1% by mol to 30% by mol.

Examples of the basic group include a primary amino group, a secondary amino group, a tertiary amino group, a hetero ring containing an N atom, and an amide group; and a tertiary amide group that has high adsorptive force to pigment and has high dispersibility is particularly preferable. As the basic group, these groups may be used singly or in combination of two more kinds thereof.

The content of a copolymerization component that forms the structural unit having basic group suitably used in the specific resin of the invention is from 0.01% by mol to 50% by mol. From the viewpoint of suppressing the inhibition of developability, the content is particularly preferably from 0.01% by mol to 30% by mol.

In the specific resin of the invention, a copolymerization component that forms the structural unit having any of the various acidic groups included in the above acidic groups and a copolymerization component that forms the structural unit having any of the basic groups included in the above basic groups can be appropriately combined and used as the copolymerization component.

Examples of the coordinating group or the group having reactivity include an acetyl acetoxy group, a trialkoxysilyl group, an isocyanate group, an acid anhydride residue, and an acid chloride residue. Among these, an acetyl acetoxy group having good adsorptive force to pigment and high dispersibility is particularly preferable. Each of the coordinating group and the group having reactivity may be used singly or in combination of two or more kinds thereof. The content of a copolymerization component that forms the structural unit having basic group suitably used in the specific resin of the invention The content of a copolymerization component that forms these structural units suitably used in the specific resin of the invention is from 0.5% by mol to 50% by mol. From the viewpoint of suppressing the inhibition of developability, the content is particularly preferably from 1% by mol to 30% by mol.

The structure of the functional group other than the graft chain capable of interacting with titanium dioxide is not specifically limited as long as a functional group other than the graft chain capable of interacting with titanium dioxide is contained, but is preferably a structure having at least one repeating unit obtained from a monomer represented by any one of the following Formulae (i) to (iii).

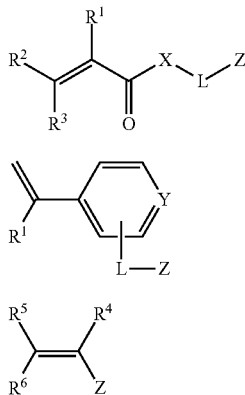

In Formulae (i) to (iii), $R^1$, $R^2$, and $R^3$ each independently represent a hydrogen atom, a halogen atom (such as fluorine, chlorine, or bromine), or an alkyl group having 1 to 6 carbon atoms (such as a methyl group, an ethyl group, or a propyl group).

It is more preferable that $R^1$, $R^2$, and $R^3$ each represent a hydrogen atom, or an alkyl group having 1 to 3 carbon atoms, and it is most preferable that $R^1$, $R^2$, and $R^3$ each represent a hydrogen atom or a methyl group. It is particularly preferable that $R^2$ and $R^3$ each represent a hydrogen atom.

X represents an oxygen atom (—O—) or an imino group (—NH—), and preferably an oxygen atom.

L is a single bond or a divalent linking group. Examples of the divalent linking group include a divalent aliphatic group (such as an alkylene group, a substituted alkylene group, an alkenylene group, a substituted alkenylene group, an alkynylene group, or a substituted alkynylene group), a divalent aromatic group (such as an arylene group or a substituted arylene group), a divalent heterocyclic group, and a combination of one of these linking groups with an oxygen atom (—O—), a sulfur atom (—S—), an imino group (—NH—), a substituted imino group (—$NR^{31}$—, wherein $R^{31}$ is an aliphatic group, an aromatic group, or a heterocyclic group), or a carbonyl group (—CO—).

The divalent aliphatic group may have a cyclic structure or a branched structure. The aliphatic group preferably has 1 to 20 carbon atoms, more preferably has 1 to 15 carbon atoms, and still more preferably has 1 to 10 carbon atoms. The aliphatic group is preferably a saturated aliphatic group rather than an unsaturated aliphatic group. Further, the aliphatic group may have a substituent. Examples of the substituent include a halogen atom, a hydroxy group, an aromatic group, and a heterocyclic group.

The divalent aromatic group preferably has 6 to 20 carbon atoms, more preferably has 6 to 15 carbon atoms, and most preferably has 6 to 10 carbon atoms. Further, the aromatic group may have a substituent. Examples of the substituent include a halogen atom, a hydroxy group, an aliphatic group, an aromatic group, and a heterocyclic group.

The divalent heterocyclic group has preferably a 5-membered ring or a 6-membered ring as its heterocyclic ring. The heterocyclic ring may be form a condensed ring with another heterocyclic ring, an aliphatic ring, or an aromatic ring. Further, the heterocyclic group may have a substituent. Examples of the substituent include a halogen atom, a hydroxy group, an oxo group (═O), a thioxo group (═S), an imino group (═NH), a substituted imino group (═N—$R^{32}$, wherein $R^{32}$ is an aliphatic group, an aromatic group, or a heterocyclic group), an aliphatic group, an aromatic group, and a heterocyclic group.

L is preferably a single bond, an alkylene group, or a divalent linking group including an oxyalkylene structure. The oxyalkylene structure is more preferably an oxyethylene structure or an oxypropylene structure. Further, L may have a polyoxyalkylene structure in which two or more oxyalkylene structures are repeated. As the polyoxyalkylene structure, a polyoxyethylene structure or a polyoxypropylene structure is preferable. The polyoxyethylene structure is represented by —$(OCH_2CH_2)_n$—, wherein n is preferably an integer of from 2 or more, and more preferably an integer of from 2 to 10.

In Formulae (i) to (iii), Z represents a functional group capable of interacting with titanium dioxide other than the graft chain, preferably a carboxylic acid group or a tertiary amino group, and more preferably a carboxylic acid. Further, Y represents a methine group or a nitrogen atom.

In Formula (iii), $R^4$, $R^5$, and $R^6$ each independently represent a hydrogen atom, a halogen atom (such as fluorine, chlorine, or bromine), or an alkyl group having 1 to 6 carbon atoms (such as a methyl group, an ethyl group, or a propyl group), Z, or —L—Z. Here, L and Z have the same definitions as L and Z above, respectively. $R^4$, $R^5$, and $R^6$ are preferably a hydrogen atom or an alkyl group having 1 to 3 carbon atoms, and more preferably a hydrogen atom.

In the invention, it is preferable that the monomer represented by Formula (i) be a compound in which $R^1$, $R^2$, and $R^3$ each are a hydrogen atom or a methyl group, L is an alkylene group or a divalent linking group including an oxyalkylene structure, X is an oxygen atom or an imino group, and Z is a carboxylic acid group.

Further, it is preferable that the monomer represented by Formula (ii) be a compound in which $R_1$ is a hydrogen atom or a methyl group, L is an alkylene group, Z is a carboxylic acid group, and Y is a methine group.

Moreover, it is preferable that the monomer represented by Formula (iii) is a compound in which $R^4$, $R^5$, and $R^6$ each are a hydrogen atom or a methyl group, and Z is a carboxylic acid group.

Representative examples of compounds represented by Formulae (i) to (iii) include: methacrylic acid; crotonic acid; isocrotonic acid; a reaction product of a compound having an addition-polymerizable double bond and a hydroxy group in a molecule thereof (for example, 2-hydroxyethyl methacrylate) and succinic anhydride; a reaction product of a compound having an addition-polymerizable double bond and a hydroxy group in a molecule thereof and phthalic anhydride; a reaction product having an addition-polymerizable double bond and a hydroxy group in a molecule thereof and tetrahydroxyphthalic anhydride; a reaction product of a compound having an addition-polymerizable double bond and a hydroxy group in a molecule thereof and trimellitic anhydride; a reaction product of a compound having an addition-polymerizable double bond and a hydroxy group in a molecule thereof and pyromellitic anhydride; acrylic acid; acrylic acid dimer; acrylic acid oligomer; maleic acid; itaconic acid; fumaric acid; 4-vinyl benzoic acid; vinyl phenol; and 4-hydroxyphenyl methacrylamide.

The content of the functional group capable of interacting with titanium dioxide, such as the monomer having an acidic group, in the specific resin is preferably from 0.05% by mass to 90% by mass, more preferably from 1.0% by mass to 80% by mass, and sill more preferably from 10% by mass to 70% by mass, with respect to the specific resin, from the viewpoints of the interaction with titanium dioxide, dispersion stability, and permeability to a developer.

The specific resin to be included in the dispersion composition of titanium dioxide according to the invention, may contain, as a structural unit derived from a copolymerization component, other structural units having various functions such as a structural unit having a functional group having an affinity to a dispersion medium used to disperse the composition, in addition to the structural unit having a graft chain and the functional group capable of interacting with titanium dioxide, for the purpose of improving various capabilities such as image strength, unless the effect of the invention is impaired.

Examples of the copolymerization components that are copolymerizable with the specific resin according to the invention include radical polymerizable compounds selected from acrylic esters, methacrylic esters, styrenes, acrylonitriles, methacrylonitriles, acrylamides, and methacrylamides.

Specific examples thereof include acrylic esters such alkyl acrylates in which the alkyl group is preferably an alkyl group having 1 to 20 carbon atoms (for example, benzyl acrylate, 4-biphenyl acrylate, butyl acrylate, sec-butyl acrylate, t-butyl acrylate, 4-t-butylphenyl acrylate, 4-chlorophenyl acrylate, pentachlorophenyl acrylate, 4-cyanobenzyl acrylate, cyanomethyl acrylate, cyclohexyl acrylate, 2-ethoxyethyl acrylate, ethyl acrylate, 2-ethylhexyl acrylate, heptyl acrylate, hexyl acrylate, isobornyl acrylate, isopropyl acrylate, methylacrylate, 3,5-dimethyl adamantyl acrylate, 2-naphthyl acrylate, neopentyl acrylate, octyl acrylate, phenethyl acrylate, phenyl acrylate, propyl acrylate, tolyl acrylate, amyl acrylate, tetrahydrofurfuryl acrylate, 2-hydroxyethyl acrylate, 3-hydroxypropyl acrylate, 2-hydroxypropyl acrylate, 4-hydroxybutyl acrylate, 5-hydroxypentyl acrylate, allyl acrylate, 2-allyloxyethyl acrylate, and propargyl acrylate);

methacrylic acid esters such as alkyl methacrylates in which the alkyl group is preferably an alkyl group having 1 to 20 carbon atoms (for example, benzyl methacrylate, 4-biphenyl methacrylate, butyl methacrylate, sec-butyl methacrylate, t-butyl methacrylate, 4-t-butylphenyl methacrylate, 4-chlorophenyl methacrylate, pentachlorophenyl methacrylate, 4-cyanophenyl methacrylate, cyanomethyl methacrylate, cyclohexyl methacrylate, 2-ethoxy ethyl methacrylate, ethyl methacrylate, 2-ethylhexyl methacrylate, heptyl methacrylate, hexyl methacrylate, isobornyl methacrylate, isopropyl methacrylate, methyl methacrylate, 3,5-dimethyl adamantyl methacrylate, 2-naphthyl methacrylate, neopentyl methacrylate, octyl methacrylate, phenethyl methacrylate, phenyl methacrylate, propyl methacrylate, tolyl methacrylate, amyl methacrylate, tetrahydrofurfuryl methacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, allyl methacrylate, 2-allyloxyethyl methacrylate, propargyl methacrylate, 2-diethylaminoethyl methacrylate, and 2-dimethylamino methacrylate); and styrenes such as styrene or alkyl styrenes (for example, methyl styrene, dimethyl styrene, trimethyl styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, and acetoxymethyl styrene), alkoxy styrenes (for example, methoxy styrene, 4-methoxy-3-methyl styrene, abd dimethoxy styrene), halogenated styrenes (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene), acrylonitrile, and methacrylonitrile.

Among these radical polymerizable compounds, methacrylic acid esters, acrylamides, methacrylamides, and styrenes are suitably used. Particularly preferable examples include benzyl methacrylate, t-butyl methacrylate, 4-t-buthyphenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3,5-dimethyladamantyl methacrylate, 2-naphthyl methacrylate, neopentyl methacrylate, phenylmethacrylate, tetrahydrofurfuryl methacrylate, 2-hydroxyethyl methacrylate, 3-hydroxypropyl methacrylate, 2-hydroxypropyl methacrylate, allyl methacrylate, acrylamide, N-methyl acrylamide, N-isopropyl acrylamide, morpholyl acrylamide, piperidyl acrylamide, N-t-butyl acrylamide, N-cyclohexyl acrylamide, N-phenyl acrylamide, N-naphthyl acrylamide, N-hydroxymethyl acrylamide, N-hydroxyethyl acrylamide, N-allylacrylamide, 4-hydroxyphenyl acrylamide, 2-hydroxyphenyl acrylamide, N,N-dimethyl acrylamide, N,N-diisopropyl acrylamide, N,N-di-t-butyl acrylamide, N,N-dicyclohexyl acrylamide, N,N-phenyl acrylamide, N,N-dihydroxyethyl acrylamide, N,N-diallyl acrylamide, methacrylamide, N-methyl methacrylamide, N-isopropyl methacrylamide, morpholyl methacrylamide, piperidyl methacrylamide, N-t-butyl methacrylamide, N-cyclohexyl methacrylamide, N-phenyl methacrylamide, N-naphthyl methacrylamide, N-hydroxymethyl methacrylamide, N-hydroxyethyl methacrylamide, N-allyl methacrylamide, 4-hydroxyphenyl methacrylamide, 2-hydroxyphenyl methacrylamide, N,N-dimethyl methacrylamide, N,N-diisopropyl methacrylamide, N,N-di-t-butyl methacrylamide, N,N-dicyclohexyl methacrylamide, N,N-phenyl methacrylamide, N,N-dihydroxyethyl methacrylamide, N,N-diallyl methacrylamide, styrene, methyl styrene, dimethyl styrene, trimethyl styrene, isopropyl styrene, butyl styrene, cyclohexyl styrene, chloromethyl styrene, trifluoromethyl styrene, ethoxymethyl styrene, acetoxymethyl styrene, methoxy styrene, 4-methoxy-3-methyl styrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethyl styrene, and 4-fluoro-3-trifluoromethyl styrene.

These radical polymerizable compounds may be used singly or in combination of two or more kinds thereof. The content of the copolymerization component in the specific resin is preferably from 0% by mol to 90% by mol, and is particularly preferably from 0% by mol to 60% by mol. When the content is in the above range, sufficient pattern formation can be attained.

The specific resin of the invention can be synthesized by conventionally known method. Examples of solvents used in the synthesis of the specific resin of the invention include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethyl formamide, N,N-dimethyl acetamide, dimethyl sulfoxide, toluene, ethyl acetate, methyl lactate, and ethyl lactate. These solvents may be used singly or in combination of two or more kinds thereof.

Specific examples of the specific resin include, but are not limited to, the following Exemplary Compounds 1 to 16 and Exemplary Compounds 20 to 71. Here, the index (wt %) showing the constitution ratio of each structural unit is based on mass.

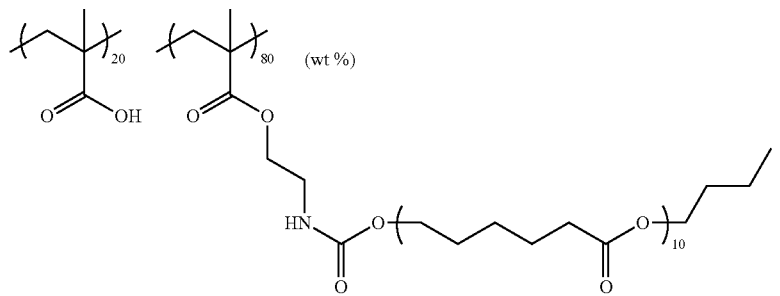
(Exemplary Compound 1)
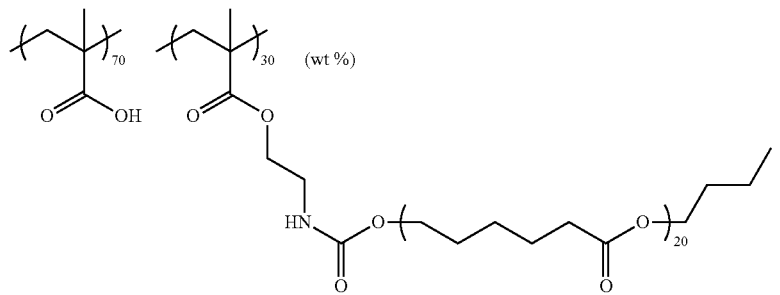
(Exemplary Compound 2)
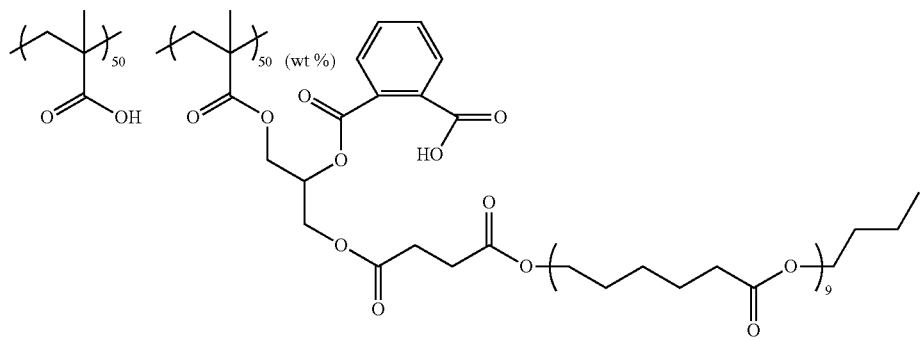
(Exemplary Compound 3)
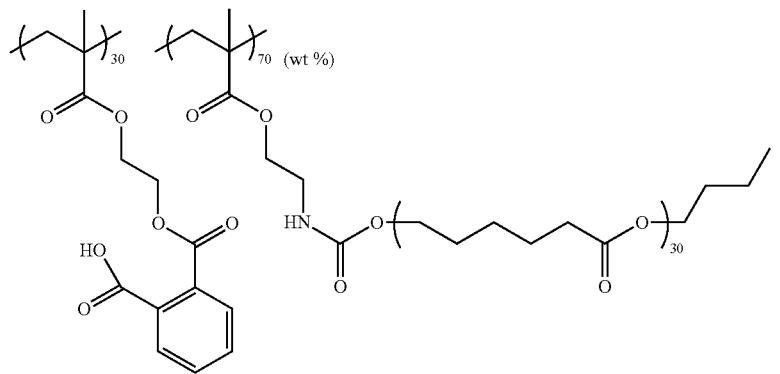
(Exemplary Compound 4)

-continued
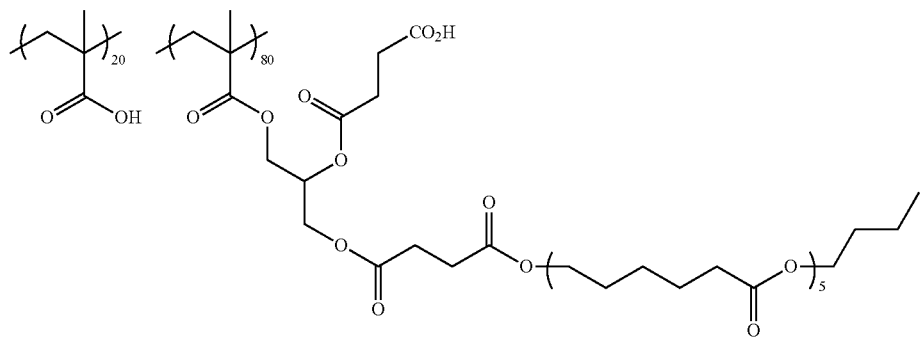
(Exemplary Compound 5)
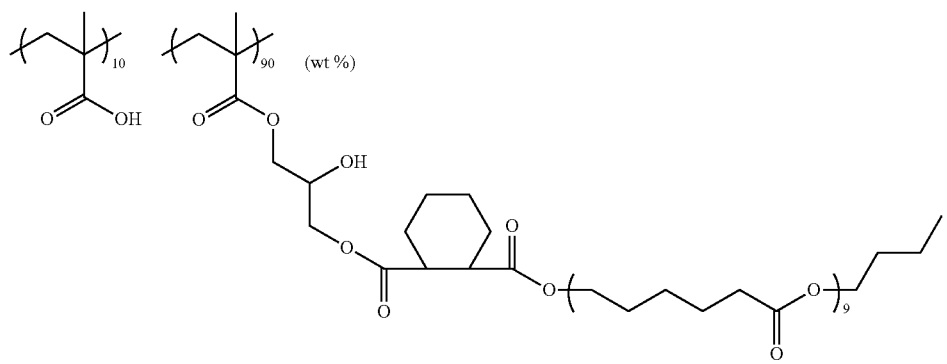
(Exemplary Compound 6)
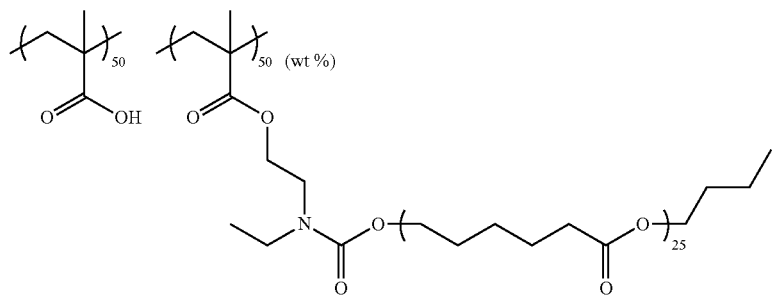
(Exemplary Compound 7)
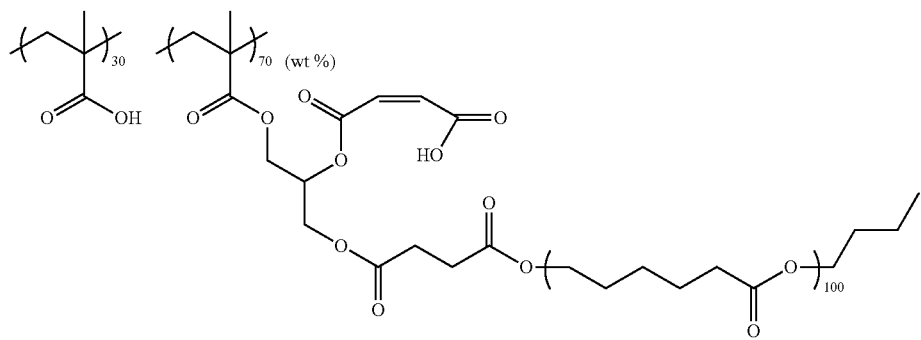
(Exemplary Compound 8)

-continued
(Exemplary Compound 9)
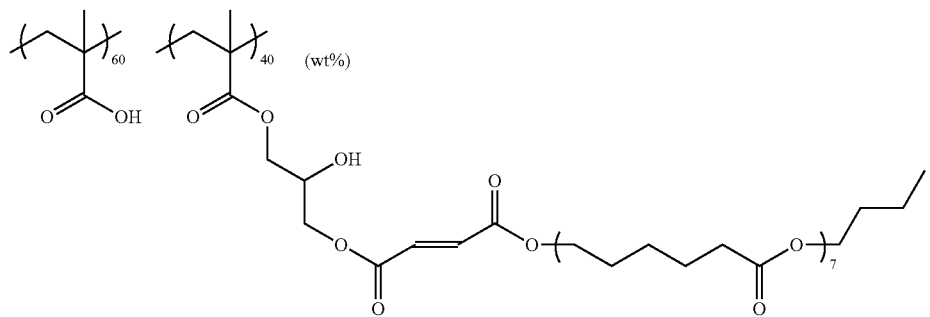
(Exemplary Compound 10)
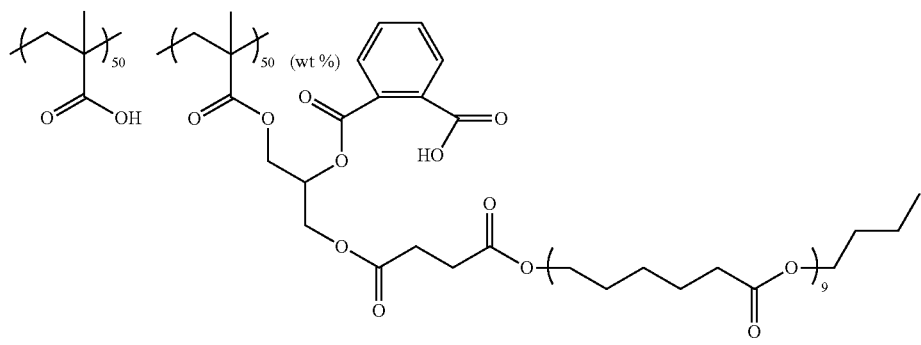
(Exemplary Compound 11)
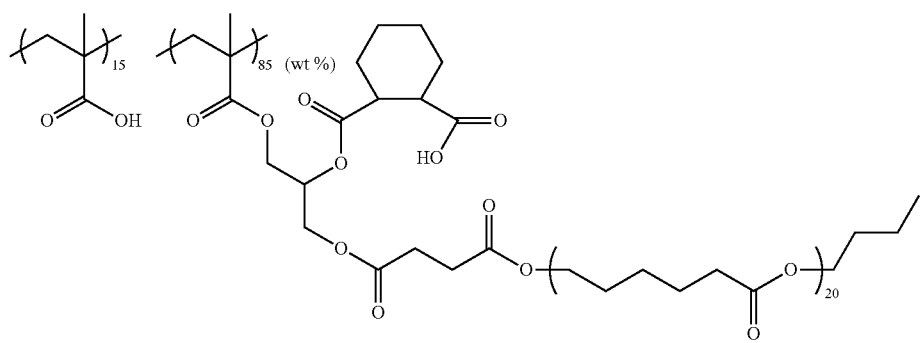
(Exemplary Compound 12)
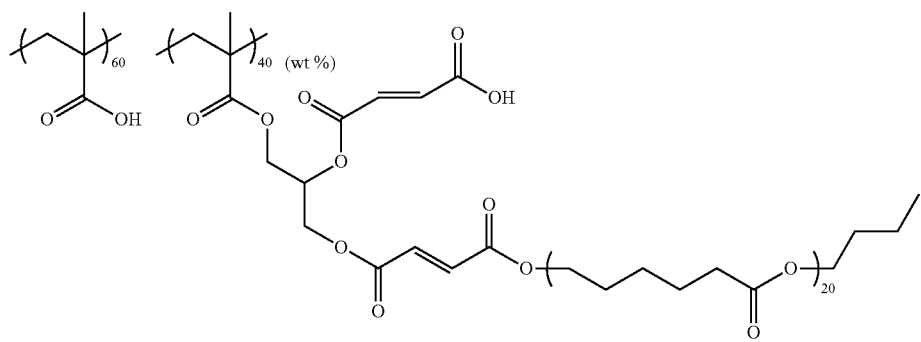

-continued
(Exemplary Compound 13)
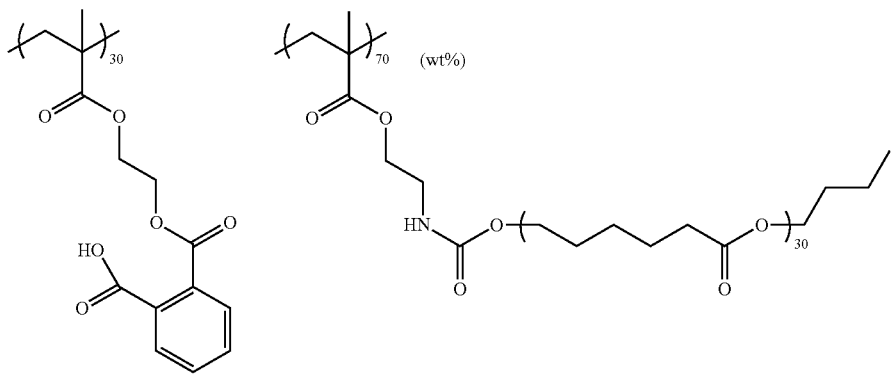
(Exemplary Compound 14)
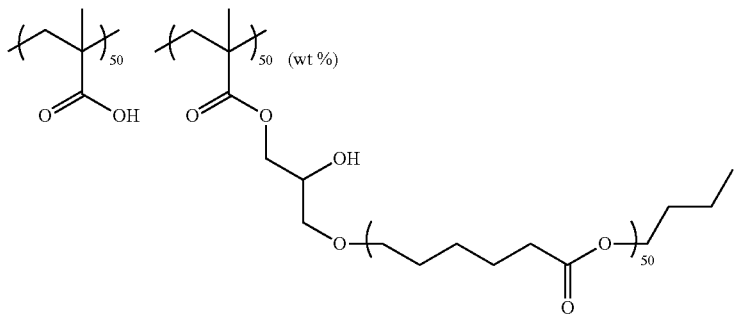
(Exemplary Compound 15)
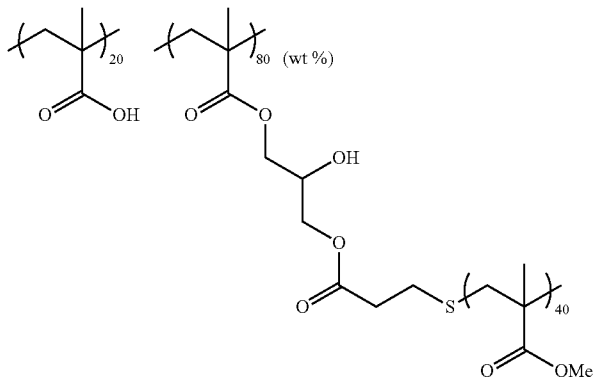
(Exemplary Compound 16)
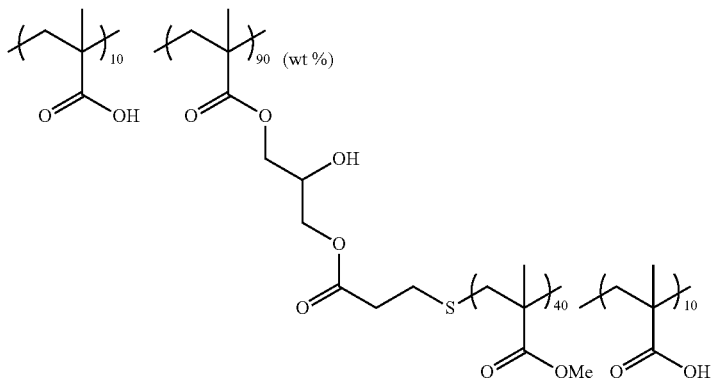

(Exemplary Compound 20)
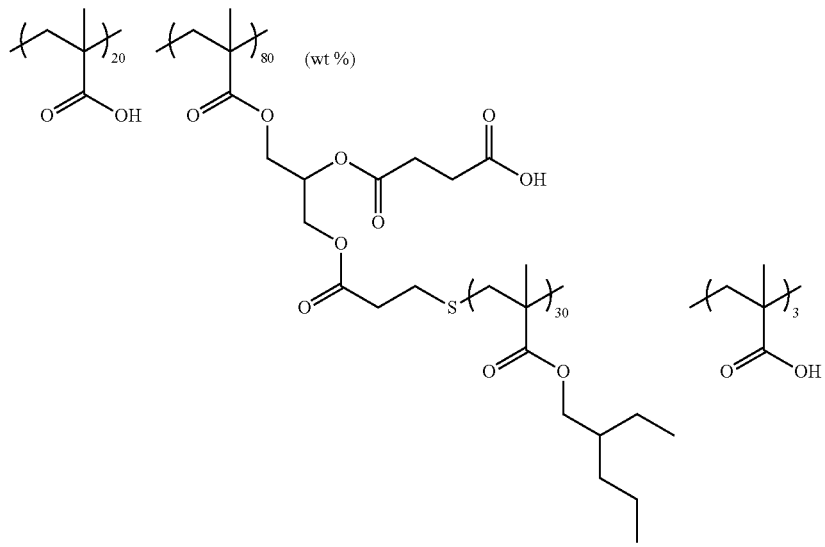
(Exemplary Compound 21)
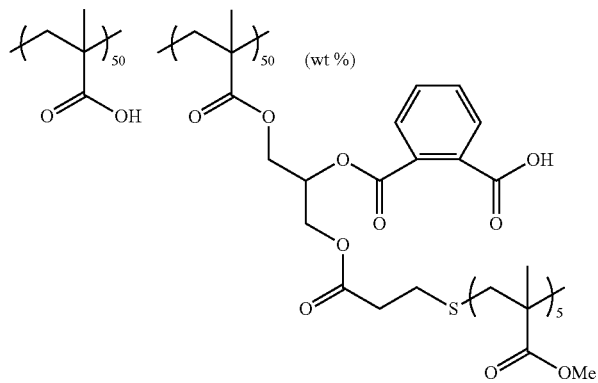
(Exemplary Compound 22)
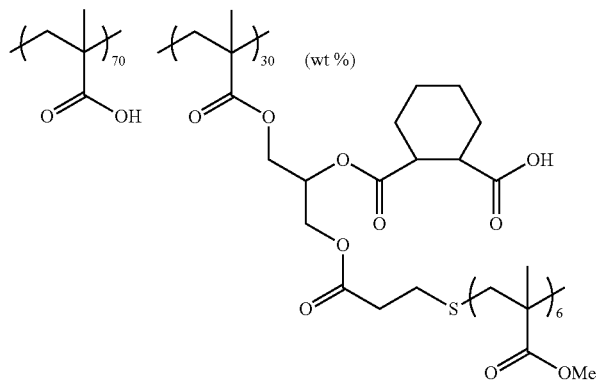

-continued
(Exemplary Compound 23)
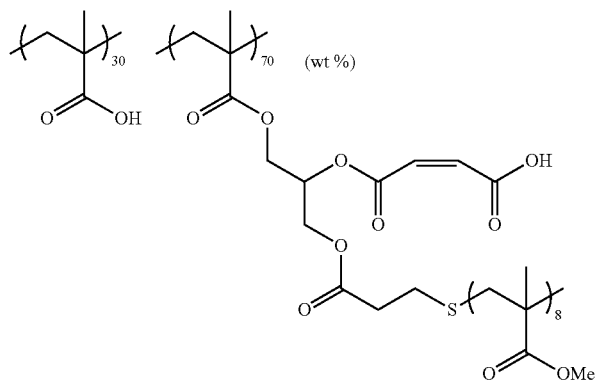
(Exemplary Compound 24)
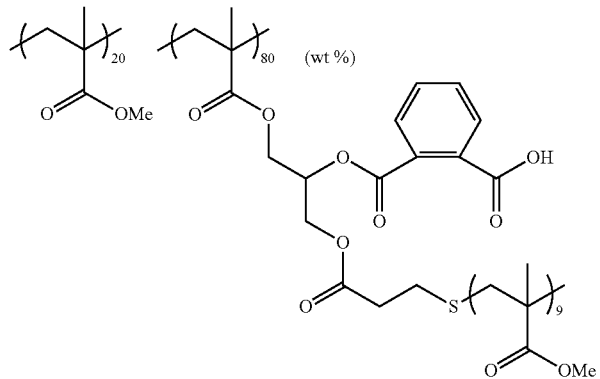
(Exemplary Compound 25)
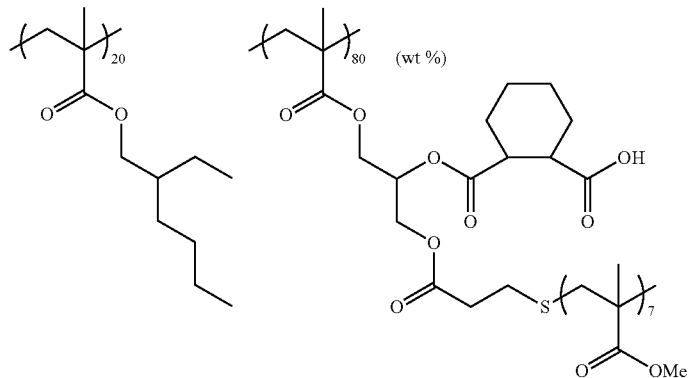
(Exemplary Compound 26)
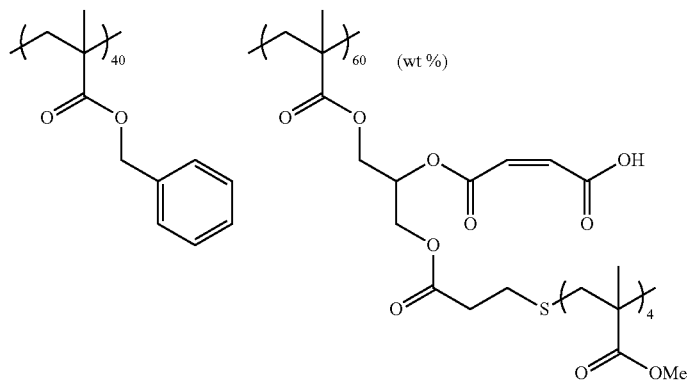

(Exemplary Compound 27)
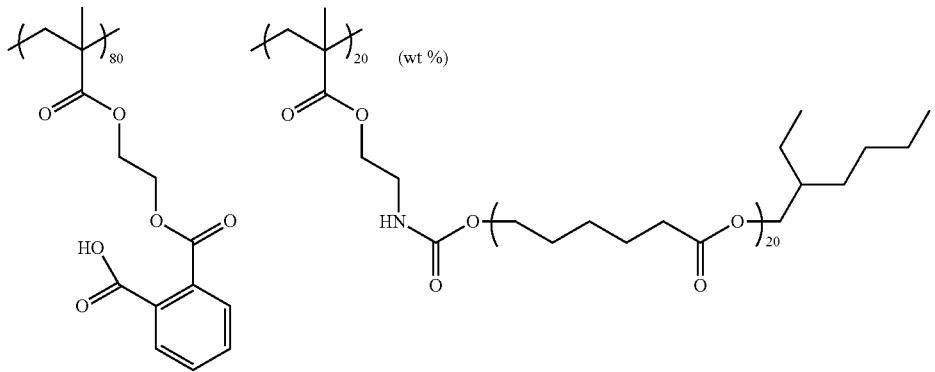
(Exemplary Compound 28)
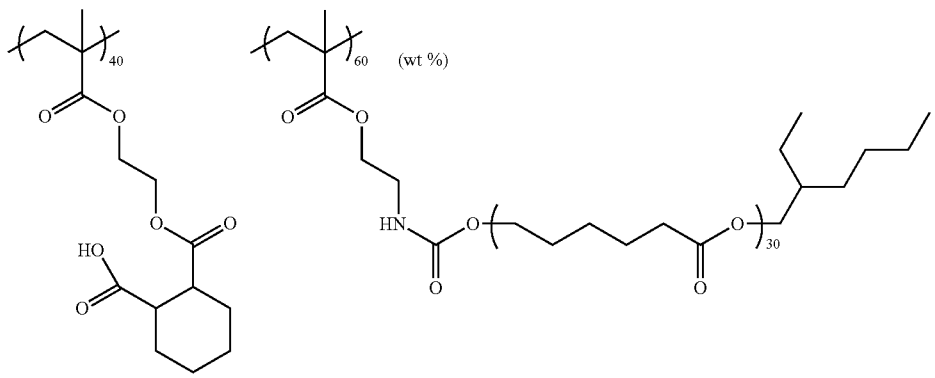
(Exemplary Compound 29)
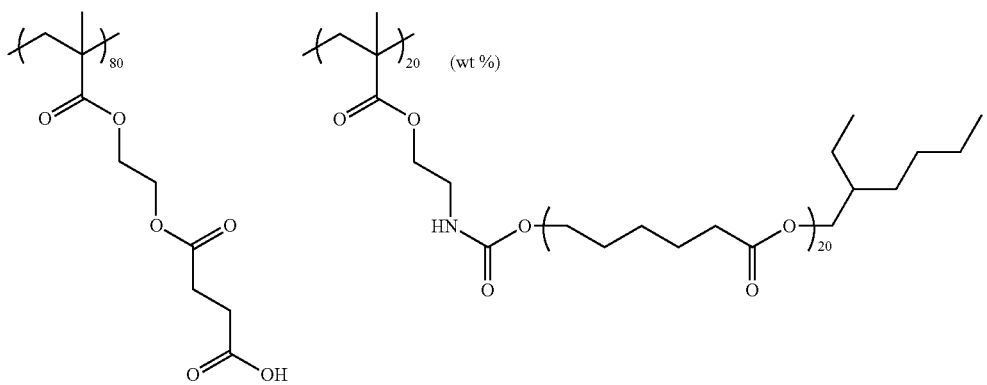
(Exemplary Compound 30)
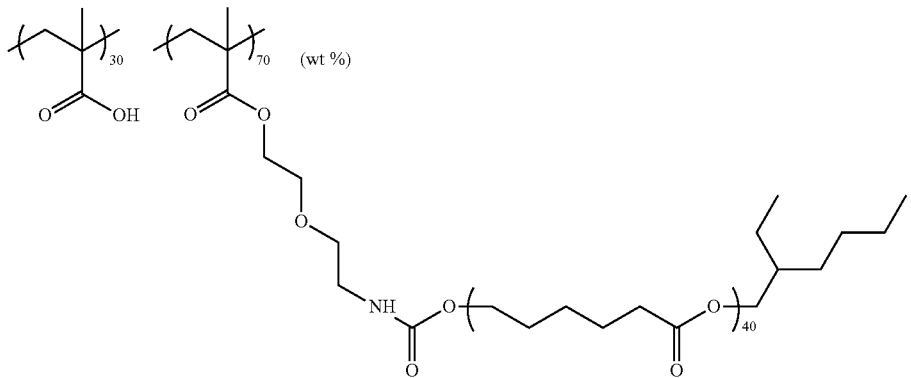

-continued
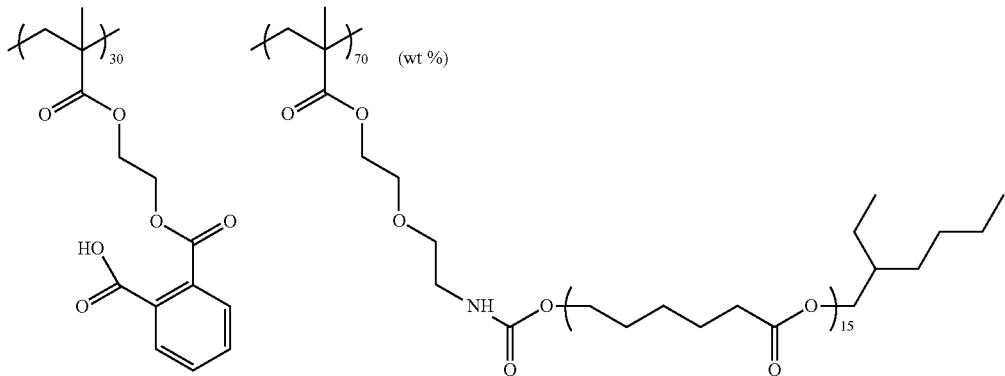
(Exemplary Compound 31)
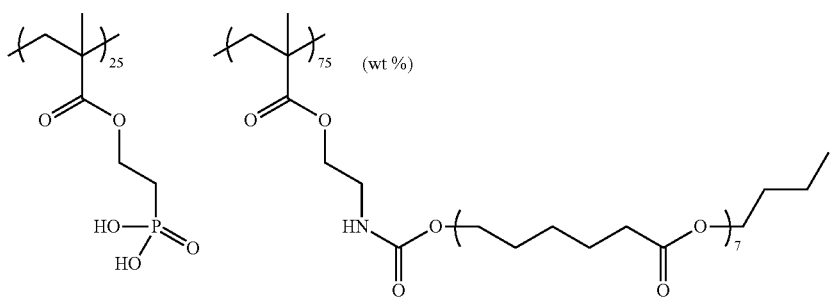
(Exemplary Compound 32)
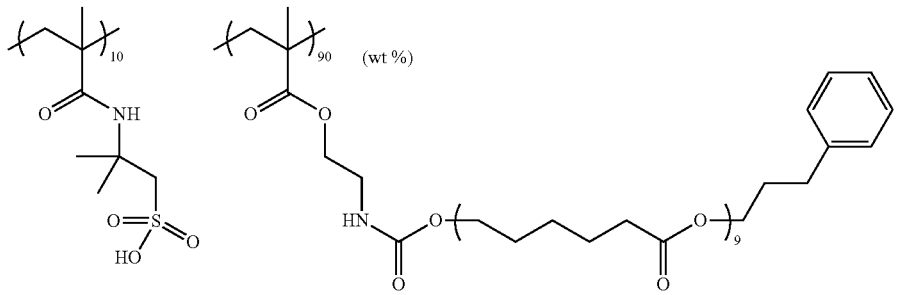
(Exemplary Compound 33)
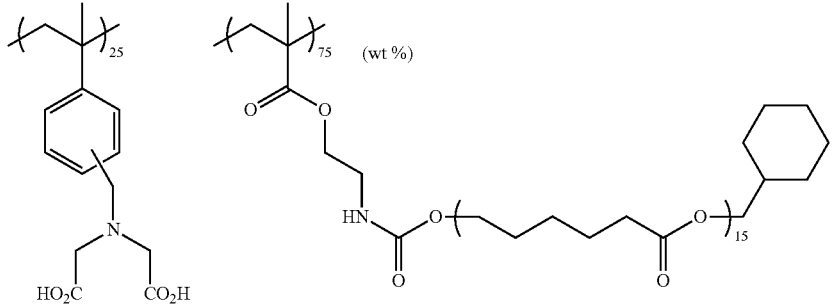
(Exemplary Compound 34)
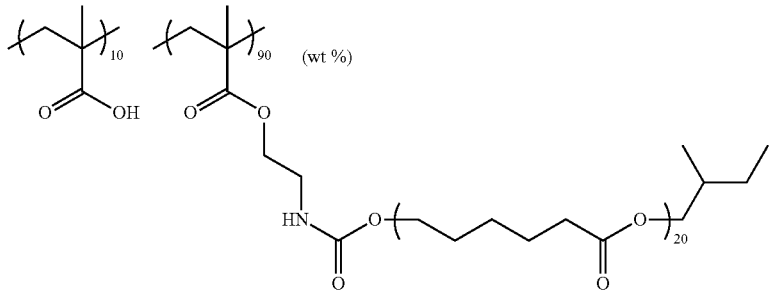
(Exemplary Compound 35)

-continued
(Exemplary Compound 36)
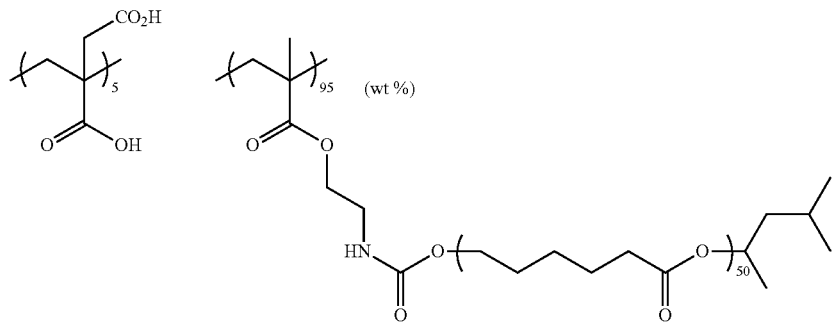
(Exemplary Compound 37)
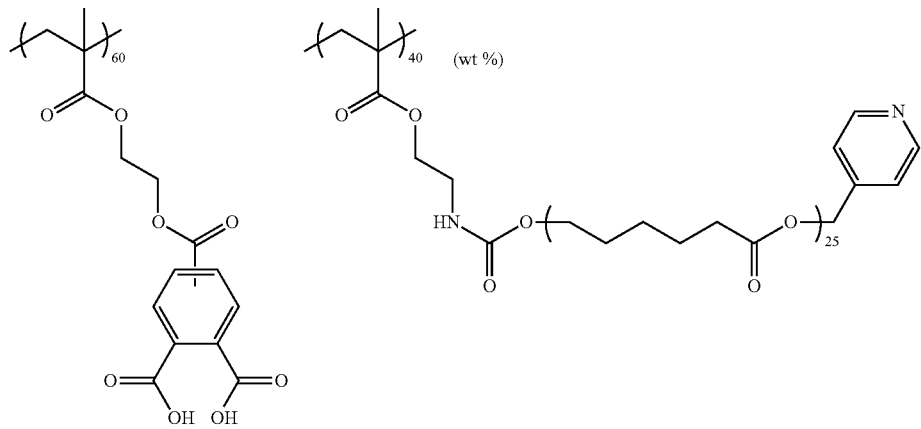
(Exemplary Compound 38)
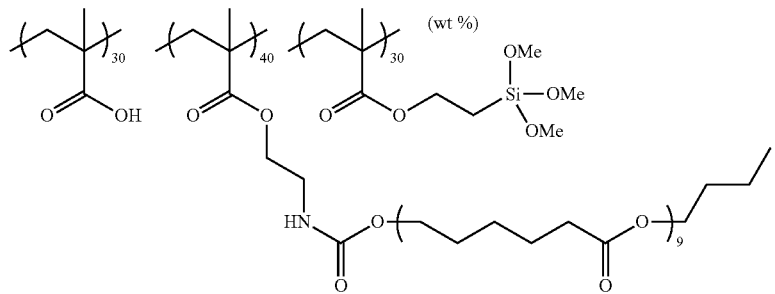
(Exemplary Compound 39)
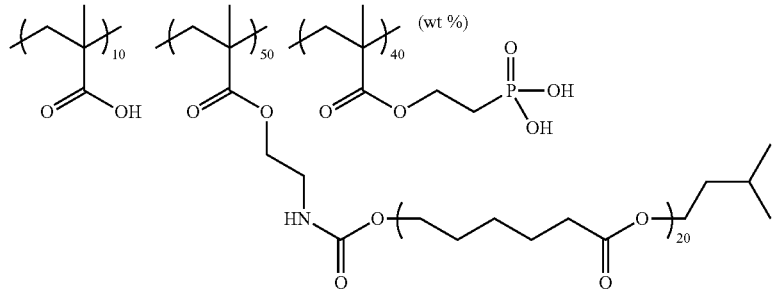

(Exemplary Compound 40)
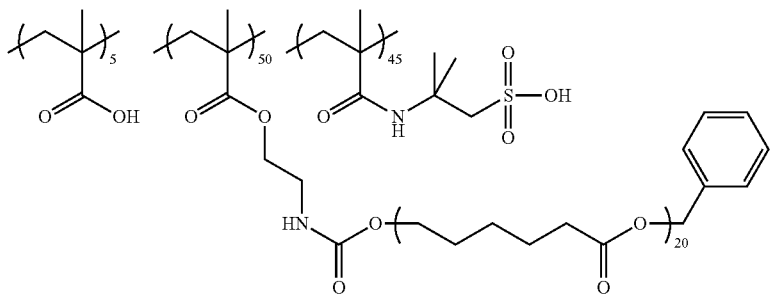
(Exemplary Compound 41)
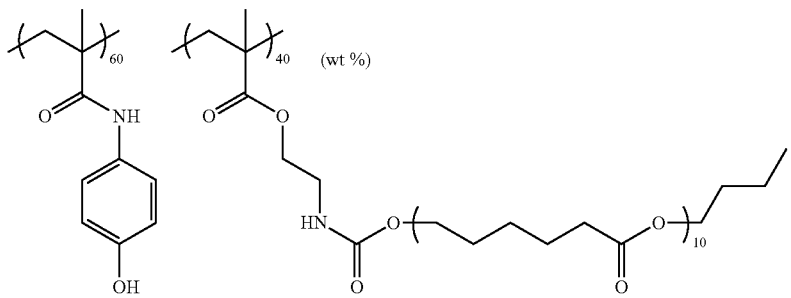
(Exemplary Compound 42)
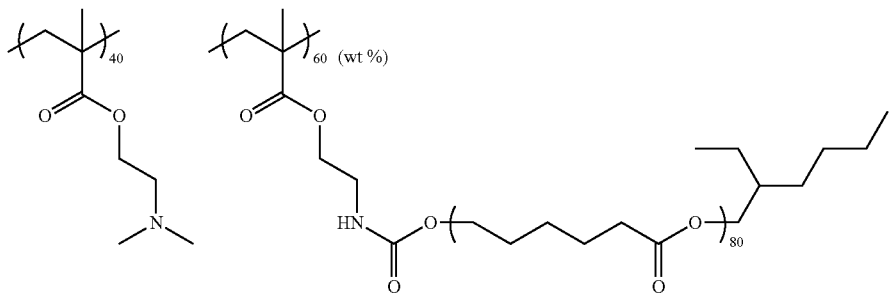
(Exemplary Compound 43)
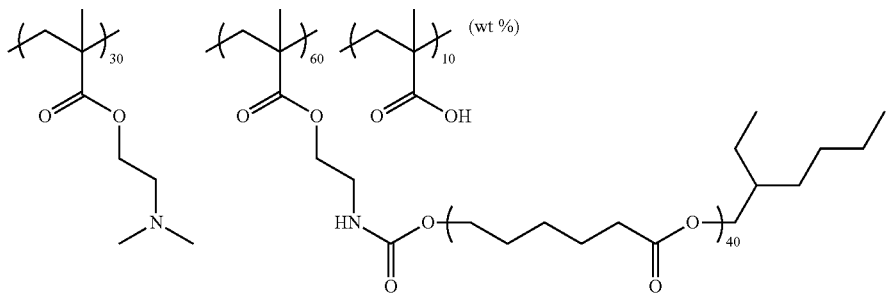
(Exemplary Compound 44)
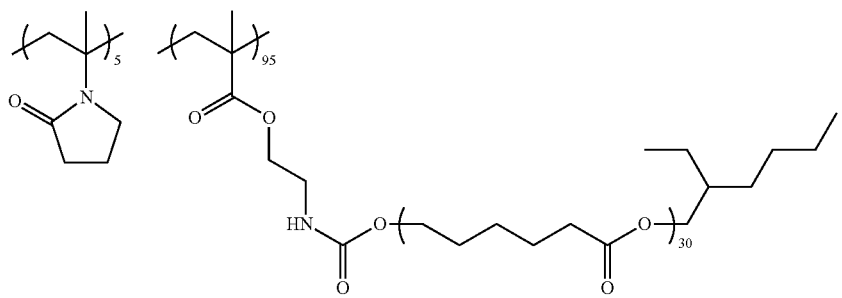

-continued
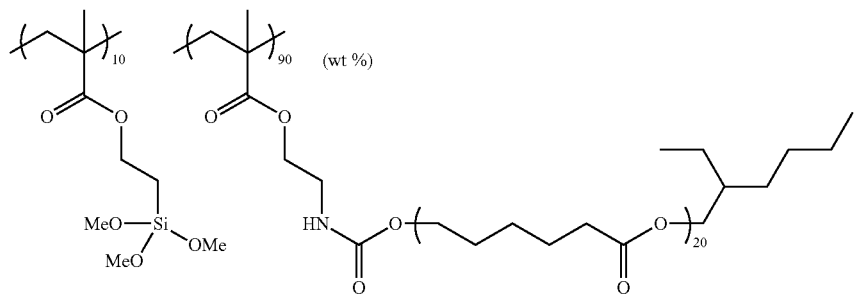
(Exemplary Compound 45)
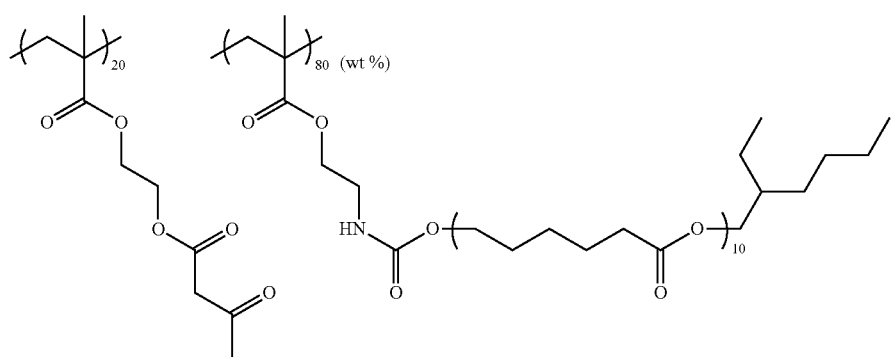
(Exemplary Compound 46)
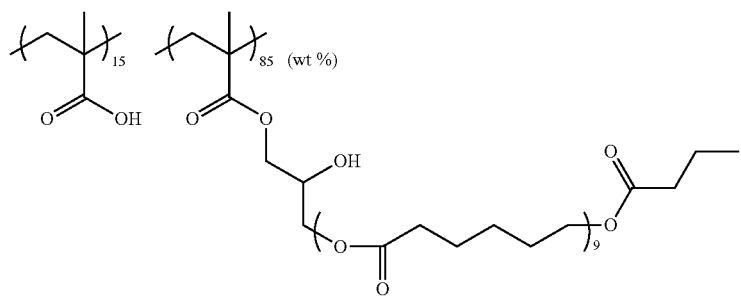
(Exemplary Compound 47)
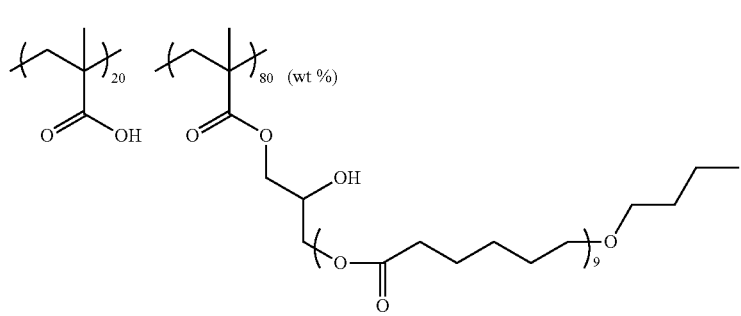
(Exemplary Compound 48)
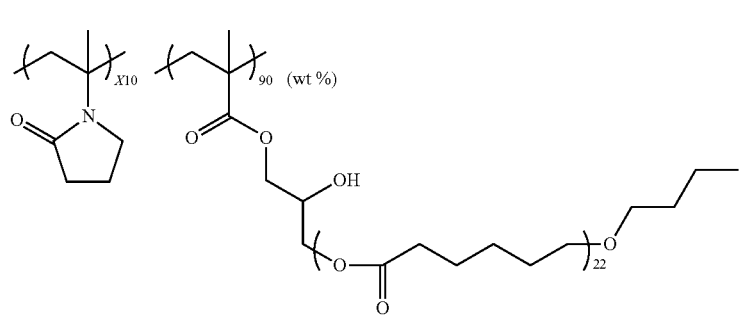
(Exemplary Compound 49)

-continued
(Exemplary Compound 50)
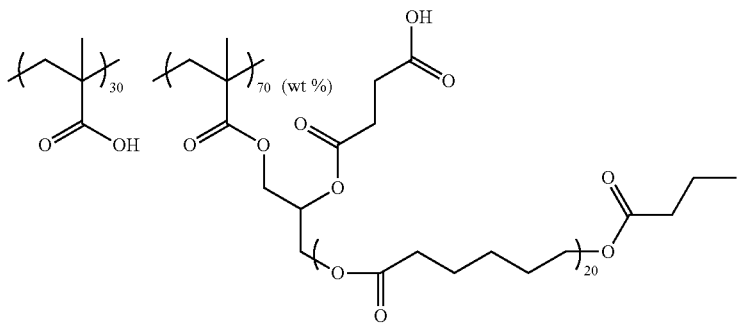
(Exemplary Compound 51)
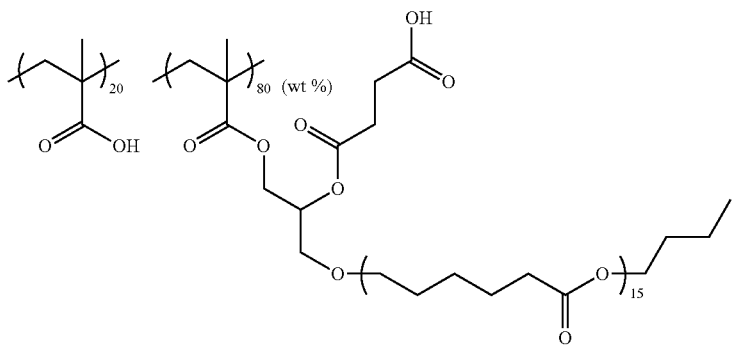
(Exemplary Compound 52)
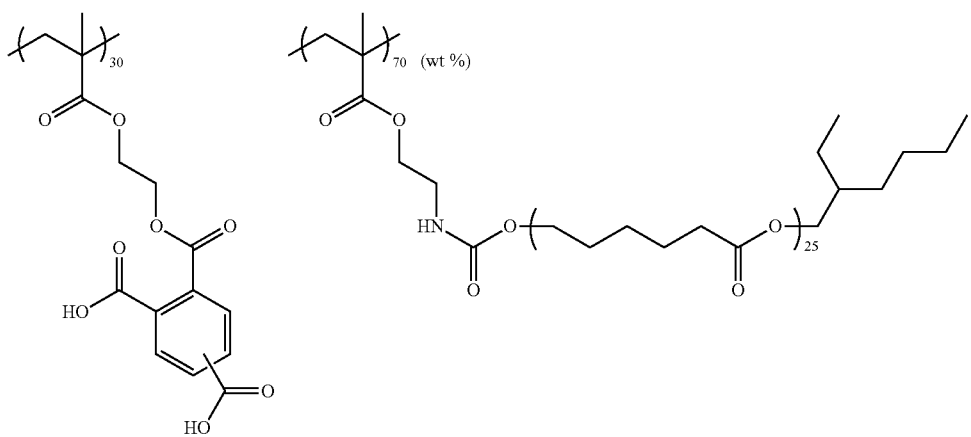
(Exemplary Compound 53)
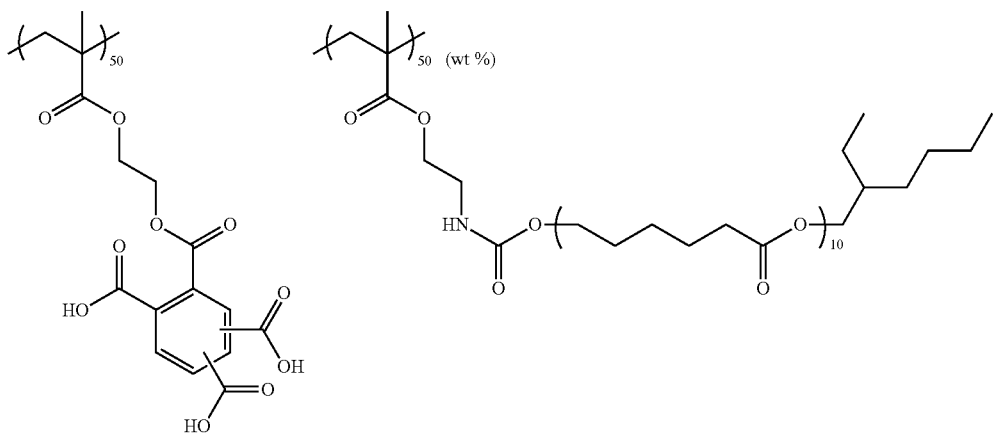

(Exemplary Compound 54)
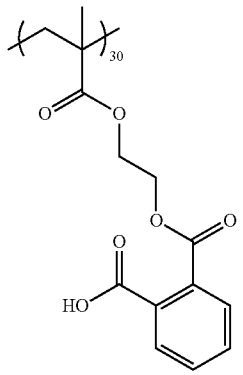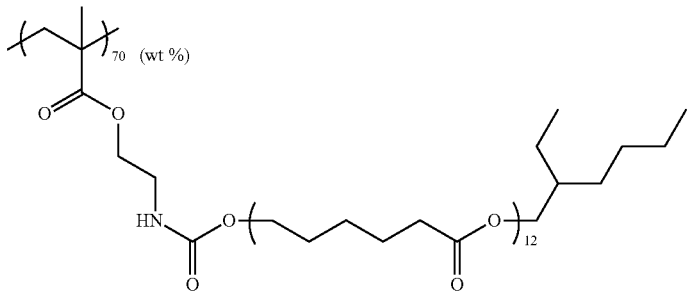
(Exemplary Compound 55)
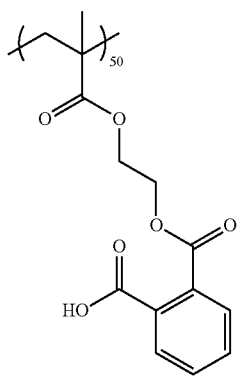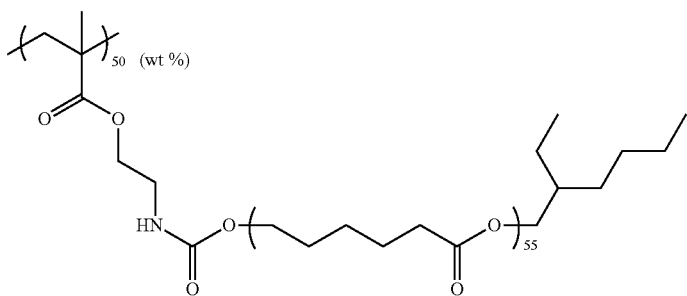
(Exemplary Compound 56)
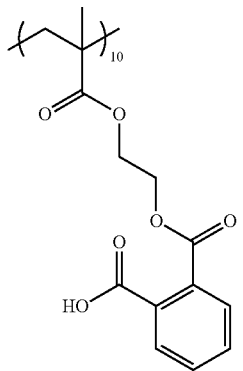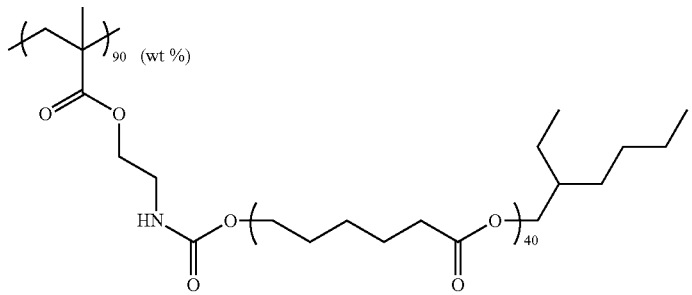
(Exemplary Compound 57)
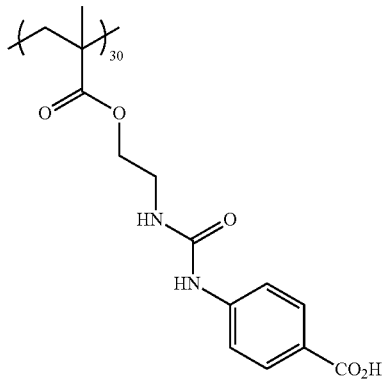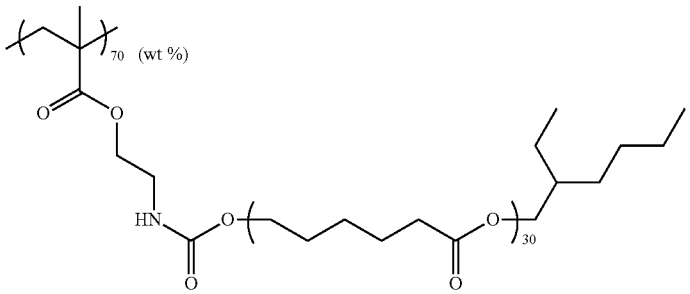

(Exemplary Compound 58)
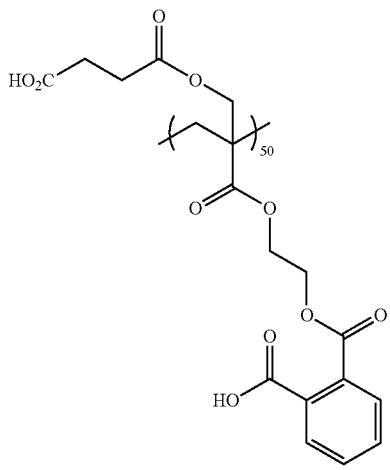
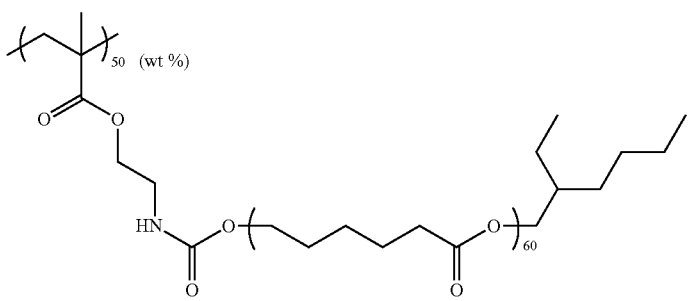
(Exemplary Compound 59)
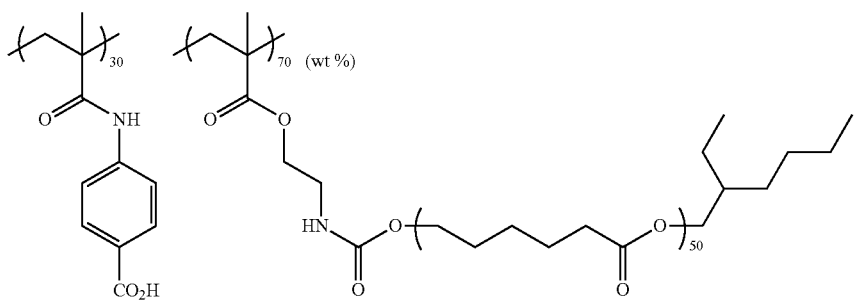
(Exemplary Compound 60)
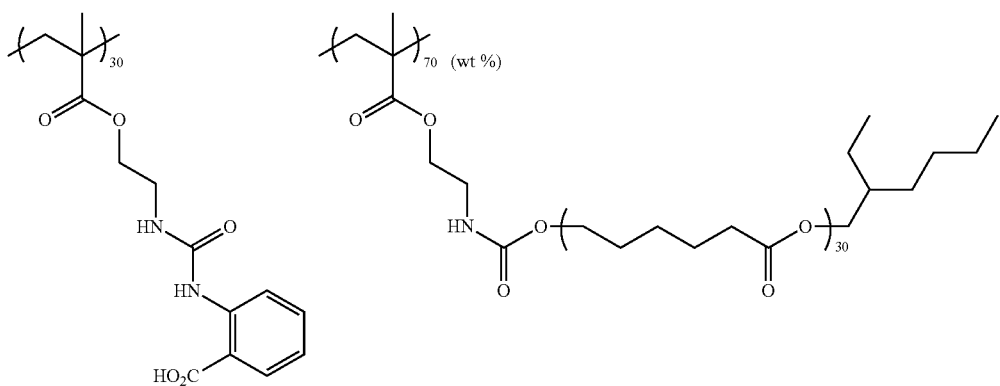

(Exemplary Compound 61)
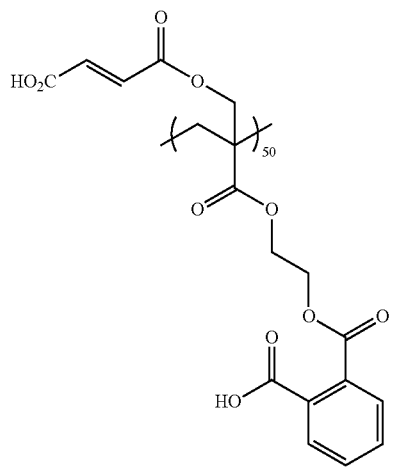
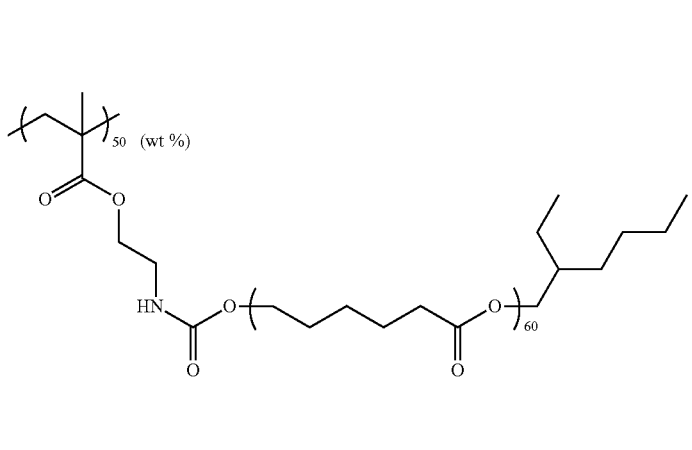
(Exemplary Compound 62)
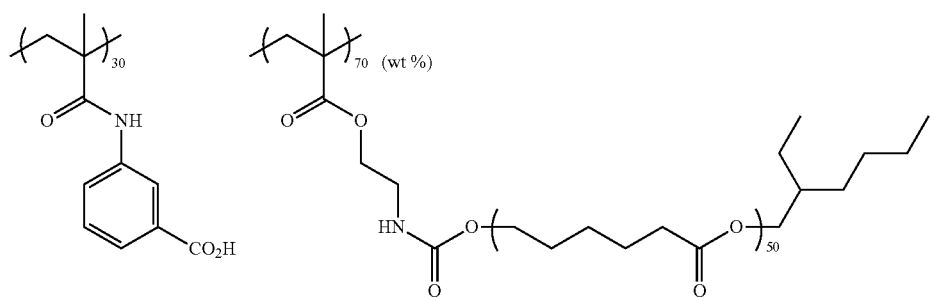
(Exemplary Compound 63)
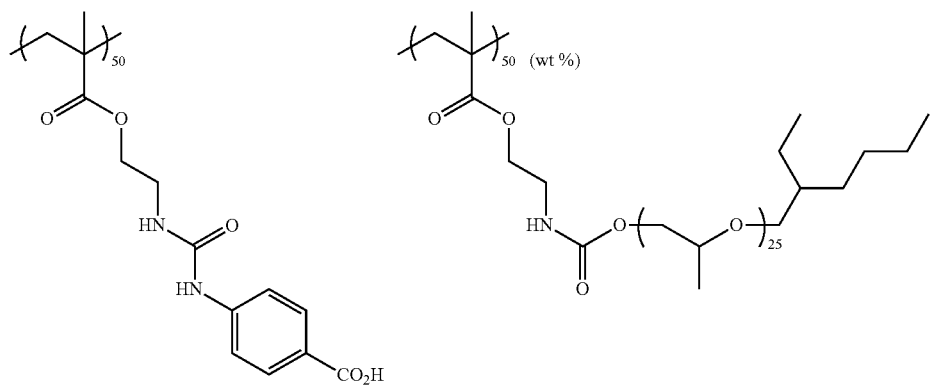
(Exemplary Compound 64)
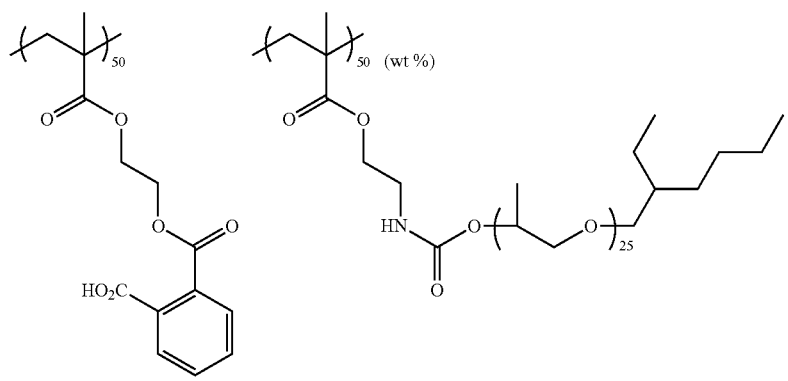

(Exemplary Compound 65)
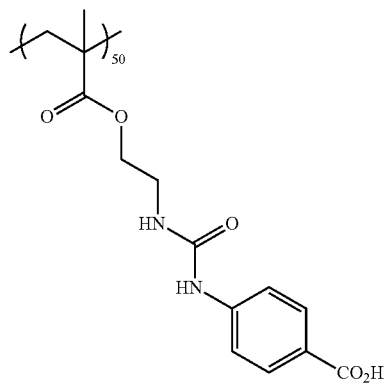 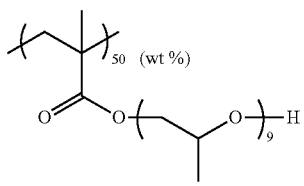
(Exemplary Compound 66)
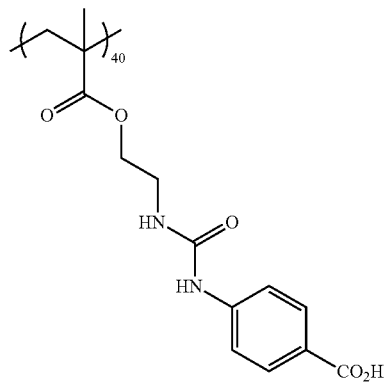 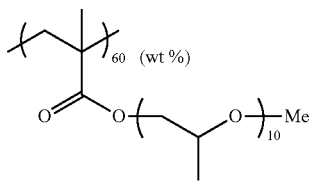
(Exemplary Compound 67)
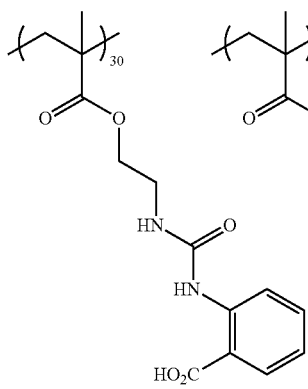 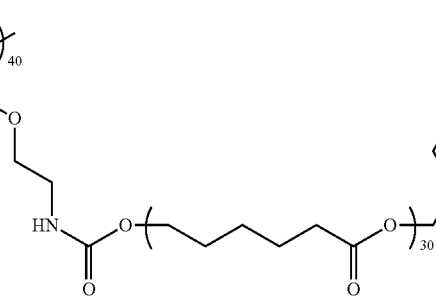 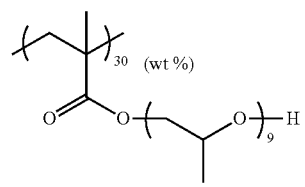
(Exemplary Compound 68)
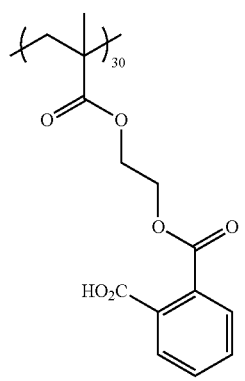 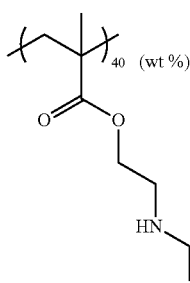 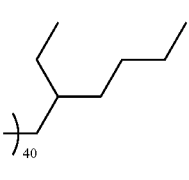

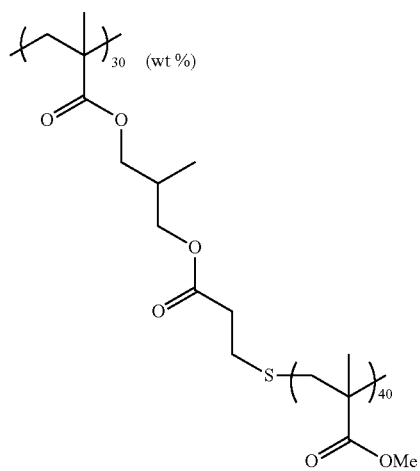
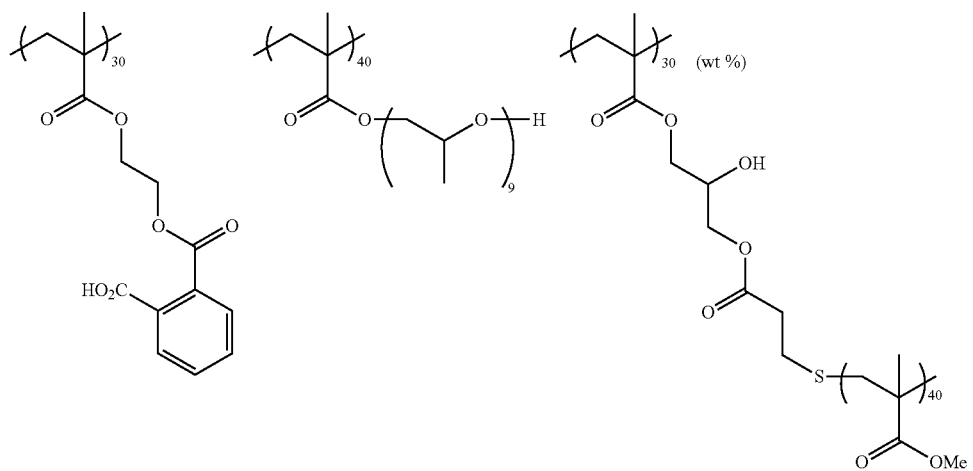
(Exemplary Compound 69)
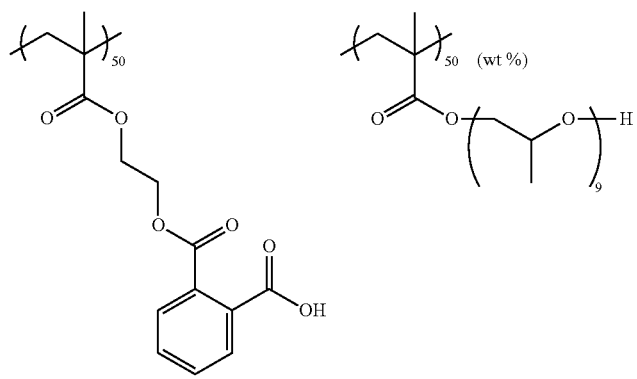
(Exemplary Compound 70)

(Exemplary Compound 71)

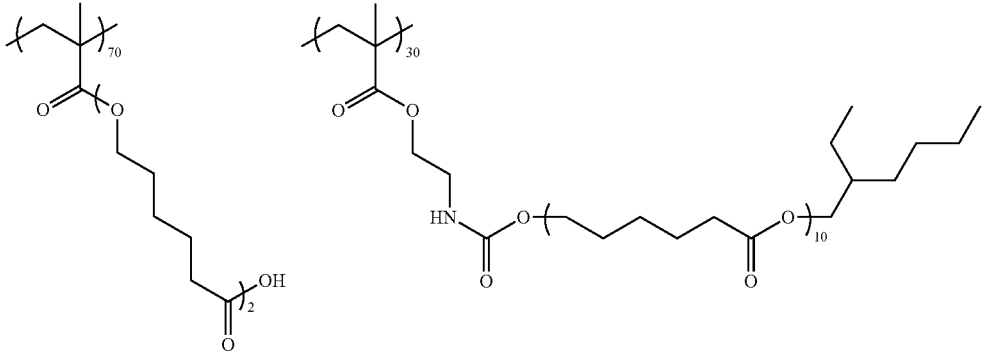

The acid value of the specific resin is preferably in a range of from 5.0 mgKOH/g to 200 mgKOH/g, more preferably in a range of from 10 mgKOH/g to 150 mgKOH/g, and still more preferably in a range of from 15 mgKOH/g to 100 mgKOH/g. When the acid value is 200 mgKOH/g or less, the separation of pattern at the time of development can be suppressed, and when the acid value is 5.0 mgKOH/g or more, good alkali developability is obtained.

In the invention, the acid value of the specific resin can be calculated, for example, from the average content of acid groups in the specific resin. A resin having a desired acid value can be obtained by changing the content of a monomer unit containing an acid group, which is a constituent of the specific resin.

The weight average molecular weight of the specific resin in the invention is preferably from 10,000 to 300,000, more preferably from 15,000 to 200,000, still more preferably from 20,000 to 100,000, and particularly preferably from 25,000 to 50,000, from the viewpoints of suppressing pattern exfoliation at the time of development and developability. Here, the weight average molecular weight of the specific resin may be measured, for example, by gel permeation chromatography (GPC).

From the viewpoint of the dispersibility and the dispersion stability, the content of the specific resin is preferably in a range of from 0.1% by mass to 50% by mass, more preferably in a range of from 5% by mass to 40% by mass, and still more preferably in a range of from 10% by mass to 30% by mass, with respect to a total solid content of the dispersion composition of the invention.

Other Resins

The dispersion composition of the invention may contain a resin (hereinafter, may be referred to as "other resins") other than the specific resin, for the purpose of controlling the dispersibility of titanium dioxide particles.

Examples of other resins that can be used in the invention include a polymer dispersant (such as a polyamideamine and a salt thereof, a polycarboxylic acid and a salt thereof, a high molecular weight unsaturated acid ester, a modified polyurethane, a modified polyester, a modified poly(meth)acrylate, a (meth)acrylate copolymer, or naphthalenesulfonic acid-formalin condensate), a polyoxyethylene alkylphosphate, a polyoxyethylene alkylamine, an alkanol amine, and a pigment derivative.

The other resins can be further classified into a straight chained polymer, a terminal end-modified polymer, a graft polymer, and a block polymer, based on the structure of the resin.

The other resins adhere to the surface of titanium dioxide particles and, if required, a pigment used in combination with the specific resin, and act to prevent re-aggregation. Accordingly, examples of preferable structures include a terminal end-modified, graft, and block polymers having a moiety which serves an anchor to the surface of pigment.

Meanwhile, the other resin has an effect of promoting adsorption of the dispersion resin by modifying the surface of pigment.

Specific examples of other resins include: "DISPERBYK-101 (polyamideamine phosphate), 107 (carboxylate), 110 (copolymer containing an acid group), 130 (polyamide), 161, 162, 163, 164, 165, 166, 170, 180 (high molecular weight copolymer)" (trade names, manufactured by BYK Chemie); "BYK-P104 and P105 (high molecular weight unsaturated polycarboxylic acid)" (trade names, manufactured by BYK Chemie); "EFKA 4047, 4050, 4010, 4165 (polyurethane compound), EFKA 4330, 4340 (block copolymer), 4400, 4402 (modified polyacrylate), 5010 (polyester amide), 5765 (high molecular weight polycarboxylic acid salt), 6220 (fatty acid polyester), 6745 (phthalocyanine derivative), 6750 (azo pigment derivative) (trade names, manufactured by BYK Chemie); "AJISPER PB821, PB822" (trade names, manufactured by Ajinomoto Fine Techno Co., Inc.); "FLOWLEN TG-710 (urethane oligomer)", "POLYFLOW No. 50E, No. 300 (acrylate copolymer)" (trade names, manufactured by Kyoeisha Chemical Co., Ltd.); "DISPARLON KS-860, 873 SN, 874, #2150 (aliphatic polyvalent carboxylic acid), #7004 (polyether ester), DA-703-50, DA-705, DA-725" (trade names, manufactured by Kusumoto Chemicals Ltd.); "DEMOL RN, N (naphthalenesulfonic acid-formalin polycondensation product), MS, C, SN—B (aromatic sulfonic acid-formalin polycondensation product)", "HOMOGENOL L-18 (high molecular polycarboxylic acid)", "EMULGEN 920, 930, 935, 985 (polyoxyethylene nonylphenyl ether)", "ACETAMIN 86 (stearylamine acetate)" (trade names, manufactured by Kao Corporation); SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, 38500 (graft polymer)" (trade names, manufactured by Lubrizol Corporation); and "NIKKOL TI06 (polyoxyethylene sorbitanmonooleate) and MYS-IEX (polyoxyethylene monostearate)" (trade names, manufactured by Nikko Chemicals Co., Ltd.). In addition, specific examples of other resins include amphoteric dispersants such as HINOACT T-8000E (trade name, manufactured by Kawaken Fine Chemicals Co., Ltd.).

These other resins may be used singly or in combination of two or more kinds thereof.

(C) Solvent

The dispersion composition of, the invention includes a solvent, and the solvent may be obtained by using various organic solvents.

Examples of the organic solvent used in the invention include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethyl formamide, dimethyl sulfoxide, γ-butyrolactone, methyl lactate, and ethyl lactate.

Any one of these solvents may be used singly, or two more kind thereof may be mixed and used. In the dispersion composition of the invention, the concentration of the solid content with respect to the solvent is preferably from 2% by mass to 60% by mass.

The method for producing the dispersion composition of the invention is not specifically restricted, and a commonly used method for producing a dispersion composition can be used. For example, the dispersion composition can be produced by mixing titanium dioxide particles, a graft copolymer, and a solvent together and then performing dispersion treatment using a rotary-type disperser (bead mill) or the like.

Photosensitive Resin Composition

The photosensitive resin composition according to the invention includes at least one dispersion composition described above, at least one (D) polymerizable compound, and at least one polymerization initiator, and if necessary, includes an additional component.

When the photosensitive resin composition includes the dispersion composition, a transparent pattern attaining excellent resolution and having a high refractive index and a high transmittance can be formed.

(D) Polymerizable Compound (D) The polymerizable compound of the invention is an addition-polymerizable compound that has at least one ethylenically unsaturated double bond, and is selected from the compounds containing at least one, preferably two or more terminal, ethylenically unsaturated bonds. Such compounds are widely known in the art, and, in the invention, any of these compounds may be used without any restriction.

These compounds have chemical forms such as a monomer, a prepolymer (i.e. a dimer, a trimer, or an oligomer) or a mixture thereof, or a copolymer thereof. Examples of the monomer and copolymer thereof include an unsaturated carboxylic acid (such as acrylic acid, methacrylic acid, itaconic acid, crotonic acid, isocrotonic acid, or maleic acid), and esters and amides thereof, and preferable examples thereof include esters of an unsaturated carboxylic acid and an aliphatic polyhydric alcohol compound and amides of an unsaturated carboxylic acid and an aliphatic polyvalent amine compound. Further, an addition reaction product of unsaturated carboxylic acid esters or unsaturated carboxylic acid amides, which have a nucleophilic substituent such as a hydroxy group, an amino group or a mercapto group, with mono-functional or poly-functional isocyanates or mono-functional or poly-functional epoxies; and a dehydration condensation reaction product of the unsaturated carboxylic acid ester or unsaturated carboxylic acid amide with a mono-functional or poly-functional carboxylic acid, are suitably used. Moreover, an addition product of unsaturated carboxylic acid esters or unsaturated carboxylic acid amides, which have an electrophilic substituent such as an isocyanate group or an epoxy group, with mono-functional or poly-functional alcohols, amines or thiols; and a substitution reaction product of unsaturated carboxylic acid esters or unsaturated carboxylic acid amides, which have a releasable substituent such as a halogen group or a tosyloxy group, with mono-functional or poly-functional alcohols, amines or thiols, are also suitably used. Furthermore, as another example, the group of compounds obtained by replacing the unsaturated carboxylic acid with an unsaturated phosphoric acid, styrene, vinyl ether or the like can also be used.

Specific examples of monomers of esters of an aliphatic polyhydric alcohol compound and an unsaturated carboxylic acid include: acrylic esters such as ethylene glycol diacrylate, triethylene glycol diacrylate, 1,3-butanediol diacrylate, tetramethylene glycol diacrylate, propylene glycol diacrylate, neopentylglycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acrlyloyloxyethyl) isocyanurate, polyester acrylate oligomer, and isocyanuric acid EO-modified triacrylate;

methacrylic acid esters such as tetramethylene glycol dimethacrylate, triethylene glycol dimethacrylate, neopentylglycol dimethacrylate, trimethylolpropane trimethacrylate, triethyloletane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, and bis-[p-(methacryloxyethoxy)phenyl]dimethyl methane;

itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate;

crotonic acid esters such as ethylene glycol dicrotonate, tetramethylene glycol dicrotonate, pentaerythritol dicrotonate, and sorbitol tetradicrotonate;

isocrotonic acid esters such as ethylene glycol diisocrotonate, pentaerythritol diisocrotonate, and sorbitol tetraisocrotonate; and maleic acid esters such as ethylene glycol dimaleate, triethylene glycol dimaleate, pentaerythritol dimaleate, and sorbitol tetramaleate.

For example, as the other esters, aliphatic alcohol esters such as those described in Japanese Examined Patent Application Publication (JP-B) No. 51-47334 and JP-A No. 57-196231, esters having an aromatic skeleton such as those described in JP-A Nos. 59-5240, 59-5241, and 2-226149, and esters containing an amino group such as those described in JP-A No. 1-165613 are also suitably used. Further, a mixture of the above ester monomers may be used.

Further, specific examples of the monomers of amides of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine tris-acrylamide, xylylene bis-acrylamide, and xylylene bis-methacrylamide.

Examples of other preferable amide monomers include a monomer having a cyclohexylene structure such as those described in JP-B No. 54-21726.

Further, addition polymerizable urethane compounds produced using the addition reaction of an isocyanate and a hydroxy group are also suitable, and specific examples of such compounds include vinyl urethane compounds having two or more polymerizable vinyl groups in a molecule thereof, which are obtained by adding a polyisocyanate compound having two or more isocyanate groups in a molecule such as those described in JP-B No. 48-41708 to vinyl monomers containing a hydroxy group represented by the following Formula (V).

In Formula (V), $R^7$ and $R^8$ each independently represent a hydrogen atom or a methyl group.

$$H_2C=C(R^7)COOCH_2CH(R^8)OH \quad\quad \text{Formula (V)}$$

Further, urethane acrylates such as those described in JP-A No. 51-37193, and JP-B Nos. 2-32293 and 2-16765, and urethane compounds having an ethylene oxide skeleton such as those described in JP-B Nod. 58-49860, 56-17654, 62-39417 and 62-39418 are also suitable. Furthermore, a photosensitive resin composition that exerts very high photosensitive speed can be obtained by using a polymerizable compound having an amino structure or a sulfide structure in a molecule, as described in JP-A Nos. 63-277653, 63-260909, and 1-105238.

Other examples include polyfunctional acrylates or methacrylates such as polyester acrylates such as those described in JP-A No. 48-64183, and JP-B Nos. 49-43191 and 52-30490, or epoxyacrylates obtained by a reaction between an epoxy resin and (meth)acrylic acid. Furthermore, examples also include specific unsaturated compounds such as those described in JP-B Nos. 46-43946, 1-40337, and 1-40336, and vinyl phosphonic acid compounds such as those described in JP-A No. 2-25493. Moreover, in some cases, a structure containing a perfluoroalkyl group such as those described in JP-A No. 61-22048 is suitably used. Furthermore, photocurable monomers or oligomers such as those described in Journal of the Adhesion Society of Japan Vol. 20, No. 7, pp. 300-308 (1984) may be used.

Details of the methods of use of these polymerizable compounds, such as the structure of the compounds, single use or use of a combination, the amount to be added, or the like, may arbitrarily be determined in accordance with the intended performance design of the compounds. For example, the method may be selected from the following viewpoint.

From the viewpoint of sensitivity, a structure having a high content of unsaturated groups per one molecule is preferable, and in many cases, bifunctionality or higher functionality is desirable. Further, in order to increase the strength of a cured film, trifunctionality or higher functionality is desirable. Also, it is effective to use a method of controlling both the sensitivity and the strength by using compounds having different functionalities and/or different polymerizable groups (for example, acrylic acid esters, methacrylic acid esters, styrene compounds, and vinyl ether compounds) in combination.

The selection and the method of use of the polymerizable compounds are also important factors for the compatibility with other components (for example, a polymerization initiator, and a light-shielding material (pigment, dye or the like) such as titanium dioxide) contained in the photosensitive resin composition and for the dispersibility. For example, the compatibility may be increased by the use of a compound with low purity, or by the use of a combination of two or more kinds of other components. Moreover, in some cases, a specific structure may be selected for the purpose of improving the adhesion to a hard surface such as a substrate.

The content of (D) the polymerizable compound is preferably in a range of from 5% by mass to 90% by mass, more preferably in a range of from 10% by mass to 85% by mass, and still more preferably in a range of from 20% by mass to 80% by mass, with respect to a total solid content of the photosensitive resin composition.

The content within the above range is preferable, because both the adhesion sensitivity and the developability are good, without the refractive index being decreased.

(E) Polymerization Initiator

It is preferable that the photosensitive resin composition of the invention further includes a polymerization initiator, from the viewpoint of further improving the sensitivity.

As the polymerization initiator used in the invention, those known as polymerization initiators, which are described below, may be used.

The polymerization initiator used in the invention is not particularly limited as far as it has an ability of initiating the polymerization of the polymerizable compound, and may be selected as appropriate from known polymerization initiators. For example, compounds having sensitivity to light within the ultraviolet to visible region are preferable. Further, the polymerization initiator may be an activating agent that is capable of interacting with a photo-excited sensitizer to give an active radical, or may be an initiator which is capable of initiating cationic polymerization depending on the kind of monomer.

Further, it is preferable that the polymerization initiator contains at least one compound which has a molecular absorption coefficient of about 50 in the wavelength region of from about 300 nm to about 800 nm (more preferably from 330 nm to 500 nm).

Examples of the polymerization initiator in the invention include halogenated hydrocarbon derivatives (for example, those having a triazine skeleton, and those having an oxadiazole skeleton); acyl phosphine compounds such as acyl phosphine oxide; hexaarylbiimidazole; oxime compounds such as oxime derivatives; organic peroxides; thio compounds; ketone compounds; aromatic onium salts; keto oxime ethers; aminoacetophenone compounds; and hydroxyacetophenone. Among these, oxime compounds are preferable.

Examples of the halogenated hydrocarbon compounds having a triazine skeleton include compounds described in Wakabayashi et. al., Bull. Chem. Soc. Japan, 42, 2924 (1969), compounds such as those described in British Patent No. 1388492, compounds such as those described in JP-A No. 53-133428, compounds such as those described in German Patent No. 3337024, compounds such as those described in F. C. Schaefer et. al., J. Org. Chem., 29, 1527 (1964), compounds such as those described in JP-A No. 62-58241, compounds such as those described in JP-A No. 5-281728, compounds such as those described in JP-A No. 5-34920, and compounds such as those described in U.S. Pat. No. 4,212,976.

Examples of the compounds described in U.S. Pat. No. 4,212,976 include compounds having an oxadiazole skeleton (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, and 2-tribromomethyl-5-styryl-1,3,4-oxadiazole).

Further, examples of the polymerization initiator other than those described above include acridine derivatives (for example, 9-phenylacridine, and 1,7-bis(9,9'-acridinyl)heptane), N-phenylglycine and the like, polyhalogen compounds (for example, carbon tetrabromide, phenyltribromomethylsulfone, and phenyl trichloromethyl ketone), coumarins (for example, 3-(2-benzofuranoyl)-7-diethylamino coumarin, 3-(2-benzofuroyl)-7-(1-pyrrolidinyl)coumarin, 3-benzoyl-7-diethylamino coumarin, 3-(2-methoxybenzoyl)-7-diethylamino coumarin, 3-(4-dimethylaminobenzoyl)-7-diethylamino coumarin, 3,3'-carbonylbis(5,7-di-n-propoxycoumarin), 3,3'-carbonylbis(7-diethylamino coumarin), 3-benzoyl-7-methoxycoumarin, 3-(2-furoyl)-7-diethylamino coumarin, 3-(4-diethylamino cinnamoyl)-7-diethylamino coumarin, 7-methoxy-3-(3-pyridylcarbonyl)coumarin, 3-benzoyl-5,7-dipropoxycoumarin, 7-benzotriazol-2-ylcoumarin, and coumarin compounds such as those described in, for example, JP-A Nos. 5-19475, 7-271028, 2002-363206, 2002-363207, 2002-363208, and 2002-363209), acylphosphine oxides (for example, bis(2,4,6-trimethylbenzoyl)-phenylphosphine oxide, bis(2,6-dimethoxybenzoyl)-2,4,4-trimethyl-pentylphenylphosphine oxide, and LUCIRIN TPO (trade name, manufactured by BASF Corporation)), metallocenes (for example, bis(η5-2,4-cyclopentandien-1-yl)-bis(2,6-difluoro-3-(1H-pyrrol-1-yl)-phenyl)titanium, and η5-cyclopentandienyl-η6-cumenyl-iron(1+)-hexafluorophosphate(1−)), and compounds such as those described in JP-A No. 53-133428, JP-B Nos. 57-1819 and 57-6096, and U.S. Pat. No. 3,615,455.

Examples of the ketone compounds include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid and tetramethyl esters thereof, 4,4'-bis(dialkylamino)benzophenones (for example, 4,4'-bis(dimethylamino)benzophenone, 4,4'-bis(dicyclohexylamino)benzophenone, 4,4'-bis(diethylamino)benzophenone, and 4,4'-bis(dihydroxyethylamino) benzophenone), 4-methoxy-4'-dimethylamino benzophenone, and 4,4'-dimethoxybenzophenone), 4-dimethylamino benzophenone, 4-dimethylamino acetophenone, benzyl, anthraquinone, 2-t-butylanthraquinone, 2-methylanthraquinone, phenanthraquinone, xanthone, thioxanthone, 2-chloro thioxanthone, 2,4-diethyl thioxanthone, fluorenone, 2-benzyl-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomers, benzoin, benzoin ethers (for example, benzoin methyl ether, benzoin ethyl ether, benzoin propyl ether, benzoin isopropyl ether, benzoin phenyl ether, and benzoin dimethyl ketal), acridone, chloroacridone, N-methylacridone, N-butylacridone, and N-butyl-chloroacridone.

As the polymerization initiator, a hydroxyacetophenone compound, an aminoacetophenone compound, or an acyl phosphine compound may also be preferably used. More specifically, for example, an aminoacetophenone initiator described in JP-A No. 10-291969, and an acyl phosphine oxide initiator such as those described in Japanese Patent No. 4225898 are also applicable.

As the hydroxyacetophenone initiator, IRGACURE-184, DAROCUR-1173, IRGACURE-500, IRGACURE-2959, and IRGACURE-127 (trade names, manufactured by Ciba Japan) may be used. Examples of commercially available products of the aminoacetophenone initiator include IRGACURE-907, IRGACURE-369, and IRGACURE-379 (trade names, manufactured by Ciba Japan). As the aminoacetophenone initiator, compounds whose absorption wavelength is matched to a long wavelength light source of 365 nm, 405 nm, or the like, such as those described in JP-A No. 2009-191179, may be used. Commercially available products of the acyl phosphine initiator such as IRGACURE-819 or DAROCUR-TPO (trade names, manufactured by Ciba Japan) may also be used.

The polymerization initiator is more preferably an oxime compound. Specific examples of the oxime initiator, which can be used, include compounds described in JP-A No. 2001-233842, compounds described in JP-A No. 2000-80068, and compounds described in JP-A No. 2006-342166.

Examples of the oxime compound including an oxime derivative, which is preferably used as the polymerization initiator in the invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include compounds such as those described in J. C. S. Perkin II (1979) pages 1653 to 1660, J. C. S. Perkin 11 (1979) pages 156 to 162, Journal of Photopolymer Science and Technology (1995) pages 202 to 232, and JP-A No. 2000-66385, and compounds such as those described in JP-A No. 2000-80068, Japanese National Phase Publication No. 2004-534797, and JP-A No. 2006-342166.

Examples of commercially available products thereof include IRGACURE OXE-01 (manufactured by Ciba Japan) and IRGACURE OXE-02 (manufactured by Ciba Japan).

Further, as the oxime ester compounds other than those described above, compounds in which oxime is linked to the N-position of carbazole, as described in Japanese National Phase Publication No. 2009-519904; compounds in which a hetero substituent is introduced into a benzophenone moiety, as described in U.S. Pat. No. 7,626,957; compounds in which a nitro group is introduced into a dye moiety, as described in JP-A No. 2010-15025 and U.S. Patent Publication No. 2009-292039; ketooxime compounds described in WO 2009/131189; compounds containing a triazine skeleton and an oxime skeleton in the same molecule, as described in U.S. Pat. No. 7,556,910; compounds which has an absorption maximum at 405 nm and has good sensitivity to a g-line light source, as described in JP-A No. 2009-221114; or the like may be used.

Further, cyclic oxime compounds described in JP-A Nos. 2007-231000 and 2007-322744 may also be used preferably. Among the cyclic oxime compounds, cyclic oxime compounds condensed to a carbazole dye, as described in JP-A Nos. 2010-32985 and 2010-185072, are particularly preferable from the viewpoint of its high light absorptivity and in order to attain a high sensitivity.

Furthermore, compounds having an unsaturated bond at a specific moiety of an oxime compound, as described in JP-A No. 2009-242469, may be used preferably because a high sensitivity is attained by regenerating an active radical from a polymerization inactive radical.

Most preferably, oxime compounds having a specific substituent as described in JP-A No. 2007-269779, and oxime compounds having a thioaryl group as described in JP-A No. 2009-191061 may be used.

Specifically, as the oxime compound, a compound represented by the following Formula (OX-1) is preferable. Here, the oxime compound according to the invention may be an oxime compound in which the N—O bond of the oxime is in the (E) form or an oxime compound in which the N—O bond of the oxime is in the (Z) form, or an oxime compound in which the N—O bond of the oxime is a mixture of the (E) form and the (Z) form.

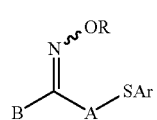

(OX-1)

(In Formula (OX-1), R and B each independently represent a monovalent substituent; A represents a divalent organic group; and Ar represents an aryl group.)

In Formula (OX-1), the monovalent substituent represented by R is preferably a monovalent nonmetallic atomic group.

Examples of the monovalent nonmetallic atomic group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. Further, the substituents described above may be further substituted by another substituent.

Examples of the substituent include a halogen atom, an aryloxy group, an alkoxycarbonyl group, an aryloxycarbonyl group, an acyloxy group, an acyl group, an alkyl group, and an aryl group.

The alkyl group which may have a substituent is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group; a heptacenyl group, a pyranthrenyl group, and an ovalenyl group.

The acyl group which may have a substituent is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group, which may have a substituent, include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocyclic group that contains a nitrogen atom, an oxygen atom, a sulfur atom, or a phosphorous atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isooxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxanthryl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsufanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, 3-nitrophenylthiocarbonyl group, a 4-fluorophenylthiocarbonyl group, 4-cyanophenylthiocarbonyl group, and a 4-methoxyphenylthiocarbonyl group.

In Formula (OX-1), the monovalent substituent represented by B represents an aryl group, a heterocyclic group, an arylcarbonyl group, or a heterocyclic carbonyl group. These groups may further have one or more substituents. Examples of the substituents include the substituents described above. Further, the substituents may further be substituted by another substituent.

Among these, the structures shown below are particularly preferable.

In the structures described below, Y, X, and n have the same definitions and the same preferable definitions as Y, X, and n in Formula (OX-2) described below, respectively.

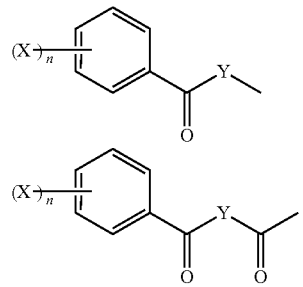

In Formula (OX-1), examples of the divalent organic group represented by A include an alkylene group having 1 to 12 carbon atoms, a cycloalkylene group, and an alkynylene group. These groups may have one or more substituents. Examples of the substituents may include the substituents described above. Further, the substituents may further be substituted by another substituent.

Among these, from the viewpoints of enhancing the sensitivity, and suppressing coloring due to heat-aging, A in Formula (OX-1) is preferably an unsubstituted alkylene group, an alkylene group substituted by an alkyl group (such as a methyl group, an ethyl group, a tert-butyl group, or a dodecyl group), an alkylene group substituted by an alkenyl group (such as a vinyl group or an allyl group), or an alkylene group substituted by an aryl group (such as a phenyl group, a p-tolyl group, a xylyl group, a cumenyl group, a naphthyl group, an anthryl group, a phenanthryl group, or a styryl group).

In Formula (OX-1), the aryl group represented by Ar is preferably an aryl group having 6 to 30 carbon atoms, which may have a substituent. Examples of the substituent include the same substituents as the substituents introduced into the substituted aryl groups, which are exemplified above as the specific examples of the aryl group which may have a substituent.

Among these, from the viewpoints of enhancing the sensitivity and suppressing coloring due to heat-aging, a substituted or unsubstituted phenyl group is preferable.

In Formula (OX-1), the structure of "SAr", which is formed by Ar and the adjacent S in Formula (OX-1), is preferably the structure shown below, from the viewpoint of sensitivity. Here, Me represents a methyl group, and Et represents an ethyl group.

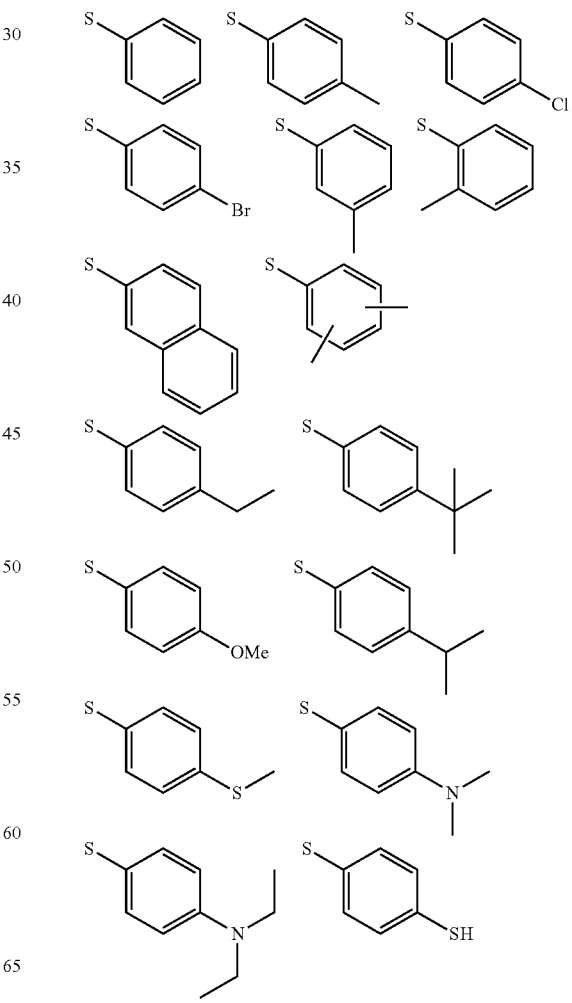

-continued

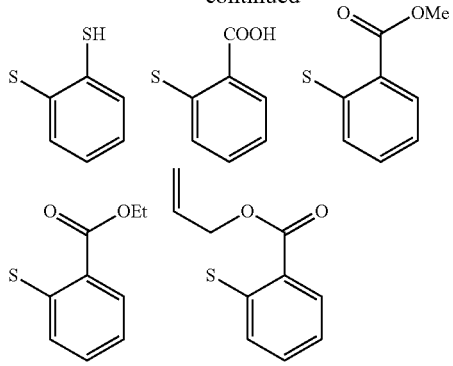

The oxime compound is preferably a compound represented by the following Formula (OX-2).

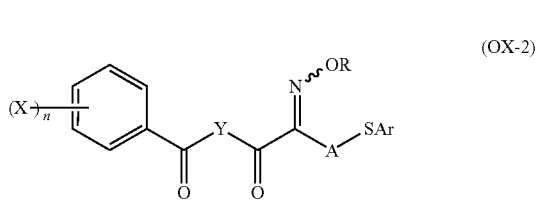

(OX-2)

(In Formula (OX-2), R and X each independently represent a monovalent substituent; A and Y each independently represent a divalent organic group; Ar represents an aryl group; and n represents an integer of from 0 to 5.)

R, A, and Ar in Formula (OX-2) have the same definitions and the same preferable definitions as R, A, and Ar in Formula (OX-1), respectively.

In Formula (OX-2), examples of the monovalent substituent represented by X include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents. Examples of the substituents may include the substituents described above. Further, the substituents may further be substituted by another substituent.

Among these, X in Formula (OX-2) is preferably an alkyl group, from the viewpoints of the solvent solubility and improvement in absorption efficiency in a long wavelength region.

Further, n in Formula (2) represents an integer of from 0 to 5, and preferably represents an integer of from 0 to 2.

Examples of the divalent organic group represented by Y in Formula (OX-2) include the structures shown below. Here, in the groups shown below, the "*" sign indicates a bonding site at which Y bonds to the adjacent carbon atom in Formula (OX-2).

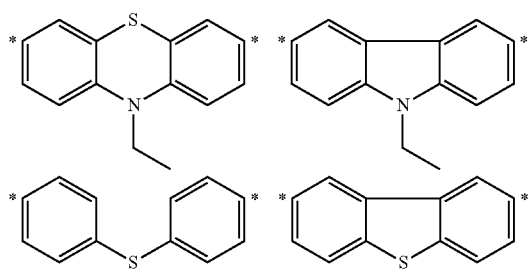

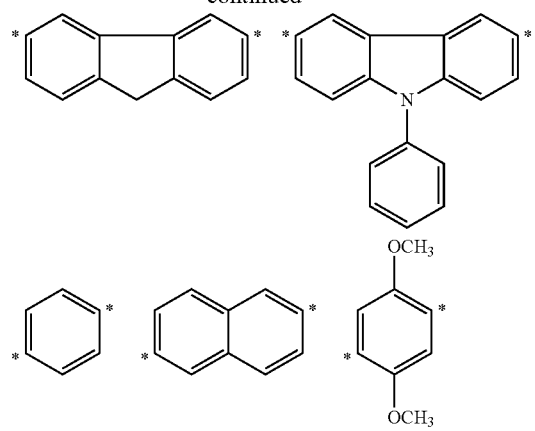

Among these, from the viewpoint of enhancement in sensitivity, the following structures are preferable.

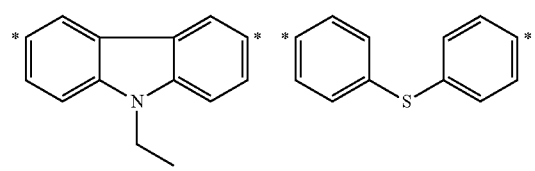

Moreover, the oxime compound is preferably a compound represented by the following Formula (OX-3).

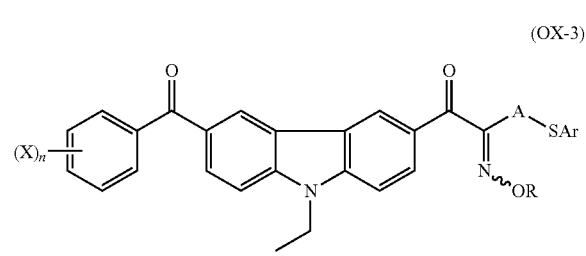

(OX-3)

In Formula (OX-3), R and X each independently represent a monovalent substituent; A represents a divalent organic group; Ar represents an aryl group; and n represents an integer of from 0 to 5.

R, X, A, Ar, and n in Formula (OX-3) have the same definitions and the same preferable definitions as R, X, A, Ar, and n in Formula (OX-2), respectively.

Specific examples (C-4) to (C-13) of the oxime compound which is preferably used are shown below, but the invention is not limited to these specific examples.

(C-4) 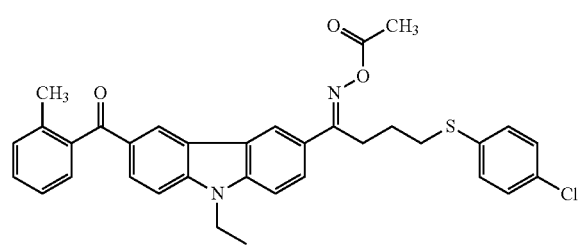

(C-10) 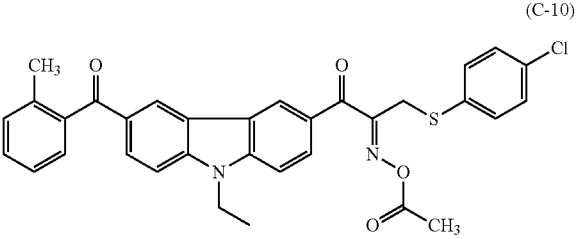

(C-5) 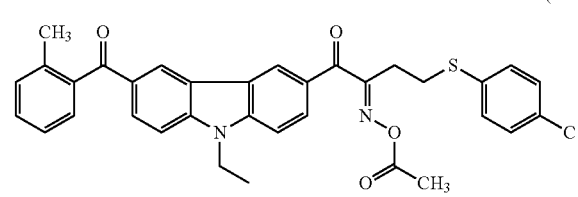

(C-11) 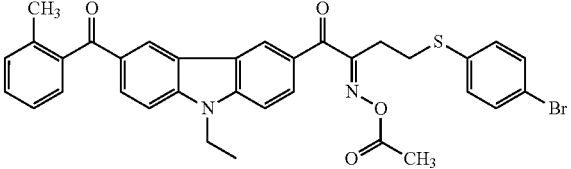

(C-6) 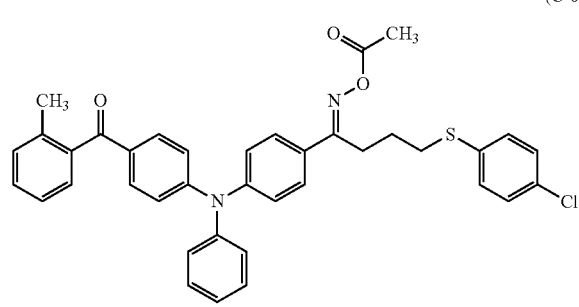

(C-12) 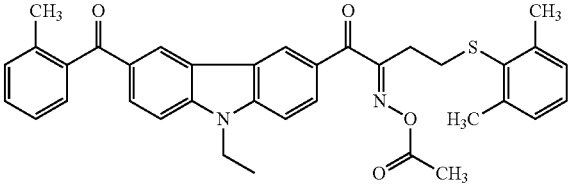

(C-13)

(C-7) 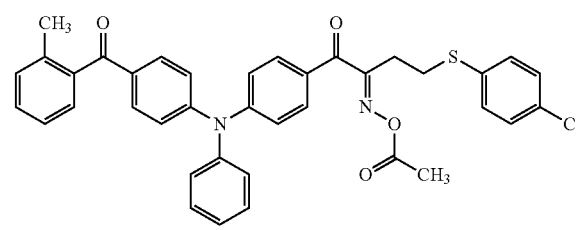

(C-8) 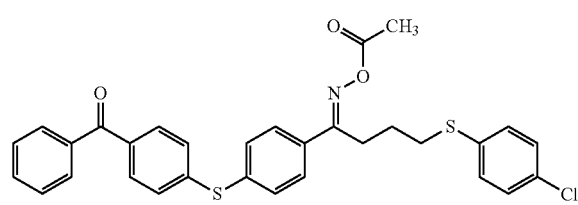

(C-9) 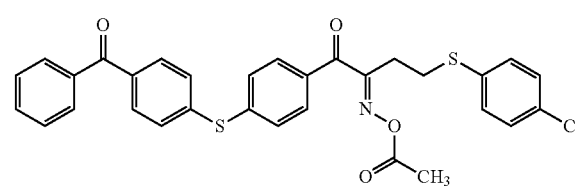

The oxime compound has a maximum absorption wavelength in a wavelength region of from 350 nm to 500 nm, preferably has an absorption wavelength in a wavelength region of from 360 nm to 480 nm, and particularly preferably has a high absorbance at 365 nm and 455 nm.

The molar absorption coefficient of the oxime compound at 365 nm or 405 nm is preferably from 1,000 to 300,000, more preferably from 2,000 to 300,000, and particularly preferably from 5,000 to 200,000, from the viewpoint of the sensitivity.

The molar absorption coefficient of a compound may be determined by a known method, specifically, for example, through measurement using an ultraviolet/visible light spectrophotometer (trade name: CARRY-5 SPECTROPHOTOMETER, manufactured by Varian), and using an ethyl acetate solvent, at a concentration of 0.01 g/L.

In the invention, two or more polymerization initiators may be used in a combination as required.

From the viewpoint of exposure sensitivity, the (E) polymerization initiator used in the photosensitive resin composition of the invention is preferably a compound selected from the group consisting of trihalomethyl triazine compounds, benzyl dimethyl ketal compounds, α-hydroxy ketone compounds, α-amino ketone compounds, acyl phosphine compounds, phosphine oxide compounds, metallocene compounds, oxime compounds, trialyl imidazole dimers, onium compounds, benzothiazole compounds, benzophenone compounds, acetophenone compounds and derivatives thereof, cyclopentadiene-benzene-iron complexes and salts thereof, halomethyl oxadiazole compounds, and 3-aryl-substituted coumarin compounds.

Trihalomethyl triazine compounds, α-amino ketone compounds, acyl phosphine compounds, phosphine oxide compounds, oxime compounds, triallyl imidazole dimers, onium compounds, benzophenone compounds, and acetophenone compounds are more preferable, and at least one compound selected from the group consisting of trihalomethyl triazine compounds, α-amino ketone compounds, oxime compounds, triallyl imidazole dimers, and benzophenone compounds is most preferable.

In particular, when the photosensitive resin composition of the invention is used to prepare a color filter of a solid-state image pick-up element, a fine pattern should be formed in a sharp shape. Therefore it is important that the fine pattern is developed without remaining residues in the unexposed portions as well as curing property of the composition. From this point of view, it is particularly preferable to use an oxime compound as the polymerization initiator. In particular, in the case of forming a fine pattern in a solid-state image pick-up element, a stepper exposure apparatus is used for the exposure for curing, but there are cases in which the exposure apparatus is damaged by halogen, and thus the addition amount of the polymerization initiator should also be suppressed to a low value. Considering these points, in order to form a fine pattern such as in a solid-state image pick-up element, it is most preferable to use an oxime compound as (E) the polymerization initiator.

The content of (E) the polymerization initiator included in the photosensitive resin composition of the invention is preferably from 0.1% by mass to 50% by mass, more preferably from 0.5% by mass to 30% by mass, and even more preferably from 1% by mass to 20% by mass, with respect to a total solid content of the photosensitive resin composition. When the content is within the above ranges, good sensitivity and pattern formability can be obtained The content of titanium dioxide is preferably in a range of from 0.1% by mass to 60% by mass, more preferably in a range of from 1% by mass to 40% by mass, and still more preferably in a range of from 5% by mass to 30% by mass, with respect to a total solid content of the photosensitive resin composition, from the viewpoints of achieving a required resolution and imparting the developability.

The photosensitive resin composition of the invention may further contain an optional component if necessary, as described in detail below. Hereinafter, the optional component, which may be contained in the photosensitive resin composition, is explained.

Sensitizer

The photosensitive resin composition of the invention may contain a sensitizer for the purpose of improving radical generation efficiency of (E) the photopolymerization initiator, and shifting the sensitive wavelength to a longer wavelength.

The sensitizer that can be used in the invention is preferably a sensitizer capable of sensitizing (E) the polymerization initiator by the electron transfer mechanism or the energy transfer mechanism.

Examples of the sensitizer include sensitizers that are classified into the following compound groups and have an absorption wavelength in a range of from 300 nm to 450 nm.

Examples of the sensitizers include polynuclear aromatic groups (for example, phenanthrene, anthracene, pyrene, perylene, triphenylene, and 9,10-dialkoxy anthracene), xanthenes (for example, fluorescein, eosin, erythrosine, Rhodamine B, and rose bengal), thioxanthones (isopropylthioxanthone, diethylthioxanthone, and chlorothioxanthone), cyanines (for example, thiacarbocyanine, and oxacarbocyanine), merocyanines (for example, merocyanine, and carbomerocyanine), phthalocyanines, thiazines (for example, thionine, Methylene Blue, and Toluidine Blue), acridines (for example, acridine orange, chloroflavin, and acriflavine), anthraquinones (for example, anthraquinone), squaryliums (for example, squarylium), acridine orange, coumarins (for example, 7-diethylamino-4-methylcoumarin), ketocoumarin, phenothiazines, phenazines, styryl benzenes, azo compounds, diphenylmethane, triphenylmethane, distyryl benzenes, carbazoles, porphyrin, spiro compounds, quinacridone, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone or Michler's ketone, and heterocyclic compounds such as N-aryloxazolidinone.

More preferable examples of the sensitizer that can be used in the invention include compounds represented by following Formulae (e-1) to (e-4).

(e-1)

In Formula (e-1), $A^1$ represents a sulfur atom or $NR^{50}$, wherein $R^{50}$ represents an alkyl group or an aryl group; $L^1$ represents a non-metal atomic group that forms a basic nucleus of the dye, together with $A^1$ and carbon atoms which are adjacent to $L^1$; $R^{51}$ and $R^{52}$ each independently represent a hydrogen atom or a monovalent non-metal atomic group, and $R^{51}$ and $R^{52}$ may be linked to each other to form an acidic nucleus of the dye. W represents an oxygen atom or a sulfur atom.

(e-2)

In Formula (e-2), $Ar^1$ and $Ar^2$ each independently represent an aryl group, and $Ar^1$ and $Ar^2$ are linked with each other with the bond —$L^2$— therebetween. Here, —$L^2$— represents —O— or —S—. Further, W has the same definition as W in Formula (OX-1).

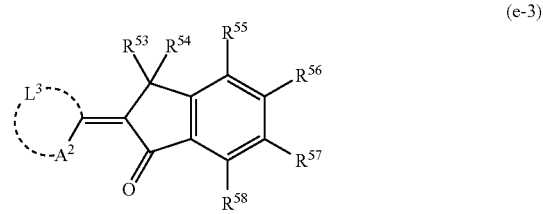

(e-3)

In Formula (e-3), $A^2$ represents a sulfur atom or $NR^{59}$; $L^3$ represents a non-metal atomic group that forms a basic nucleus of the dye together with $A^2$ and carbon atoms; $R^{53}$, $R^{54}$, $R^{55}$, $R^{56}$, $R^{57}$, and $R^{58}$ each independently represent a monovalent non-metal atomic group; and $R^{59}$ represents an alkyl group or an aryl group.

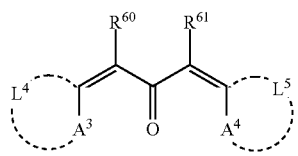

(e-4)

In Formula (e-4), $A^3$ and $A^4$ each independently represent —S— or —$NR^{62}$, wherein $R^{62}$ represents a substituted or unsubstituted alkyl group, or a substituted or unsubstituted aryl group; $L^4$ represents a non-metal atomic group that forms a basic nucleus of the dye together with $A^3$ and carbon atoms, which are adjacent to $L^4$; $L^5$ represents a non-metal atomic group that forms a basic nucleus of the dye together with $A^4$ and carbon atoms, which are adjacent to $L^5$; $R^{60}$ and $R^{61}$ each independently represent a monovalent non-metal atomic group, or may be linked to each other to form an aliphatic or aromatic ring.

From the viewpoint of light absorption efficiency to the deep portion and the decomposition efficiency of an initiator, the content of the sensitizer in the photosensitive resin composition is preferably from 0.1% by mass to 20% by mass, and more preferably from 0.5% by mass to 15% by mass, in terms of solid content.

These sensitizers may be used singly or in combination of two or more kinds thereof.

In addition to the above sensitizers, examples of preferable sensitizers that may be contained in the photosensitive resin composition include at least one compound selected from the compounds represented by following Formula (II) and the compounds represented by Formula (III).

These compounds may be used singly or in combination of two or more kinds thereof.

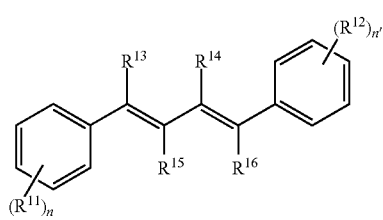

(II)

In Formula (II), $R^{11}$ and $R^{12}$ each independently represent a monovalent substituent; $R^{13}$, $R^{14}$, $R^{15}$, and $R^{16}$ each independently represent a hydrogen atom or a monovalent substituent; and n represents an integer of from 0 to 5, and n' represents an integer of from 0 to 5, but both n and n' do not simultaneously represent 0. When two or more of n are contained, each $R^{11}$ may be the same as or mutually different from one another. When two or more n' is contained, each $R^{12}$ may be the same as or mutually different from one another. The Formula (II) is not limited to one of the isomers thereof based on the double bonds.

The molar extinction coefficient ε of the compound represented by Formula (II) is preferably 500 $mol^{-1} \cdot L \cdot cm^{-1}$ at a wavelength of 365 nm, more preferably 3,000 $mol^{-1} \cdot L \cdot cm^{-1}$ at a wavelength of 365 nm, and most preferably 20,000 $mol^{-1} \cdot L \cdot cm^{-1}$ at a wavelength of 365 nm. From the viewpoint of the light absorption efficiency, it is preferable that the value of the molar extinction coefficient ε at each wavelength be within the above range, since the effect of increasing the sensitivity is high.

Preferable examples of the compounds represented by Formula (II) are shown below, but the invention is not limited to these compounds.

In this specification, chemical formulae may be described by simplified structural formulae, and, in such cases, solid lines or the like represent hydrocarbon groups, unless elements or substituents are otherwise specified.

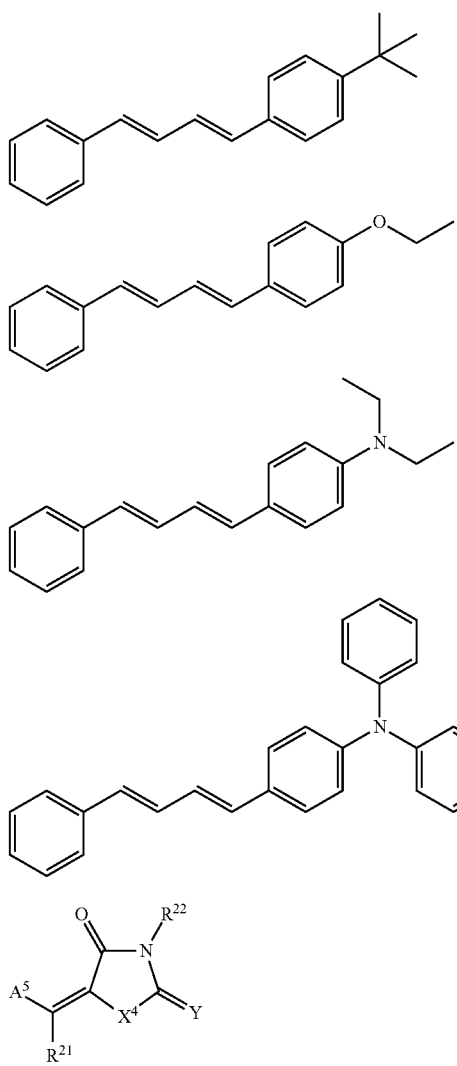

(III)

In Formula (III), $A^5$ represents an aromatic or hetero ring which may have a substituent; $X^4$ represents an oxygen atom, a sulfur atom, or —$N(R^{23})$—; and Y represents an oxygen atom, a sulfur atom, or —$N(R^{23})$—. $R^{21}$, $R^{22}$, and $R^{23}$ each independently represent a hydrogen atom or a monovalent non-metal atomic group, and $A^5$, $R^{21}$, $R^{22}$, and $R^{23}$ may be bonded with one another to form an aliphatic or aromatic ring.

In Formula (III), $R^{21}$, $R^{22}$, and $R^{23}$ each independently represent a hydrogen atom or a monovalent non-metal atomic group. When $R^{21}$, $R^{22}$, and $R^{23}$ each represent a monovalent non-metal atomic group, $R^{21}$, $R^{22}$, and $R^{23}$ each are preferably a substituted or unsubstituted alkyl group, a substituted or unsubstituted aryl group, a substituted or unsubstituted alkenyl group, a substituted or unsubstituted aromatic heterocyclic residue, a substituted or unsubstituted alkoxy group, a substituted or unsubstituted alkylthio group, a hydroxy group, or a halogen atom.

In a compound represented by Formula (III), Y is preferably an oxygen atom or —N($R^{23}$)—, from the viewpoint of improving the decomposition efficiency of the photopolymerization initiator. $R^{23}$ represents a hydrogen atom or a monovalent non-metal atomic group. Further, Y is most preferably —N($R^{23}$)—.

Preferable examples of the compounds represented by Formula (III) are shown below, but the invention is not limited to these compounds. The isomers based on the double bond that connects the acidic nucleus and the basic nucleus are not specified, and the invention is not limited to either one of the isomers.

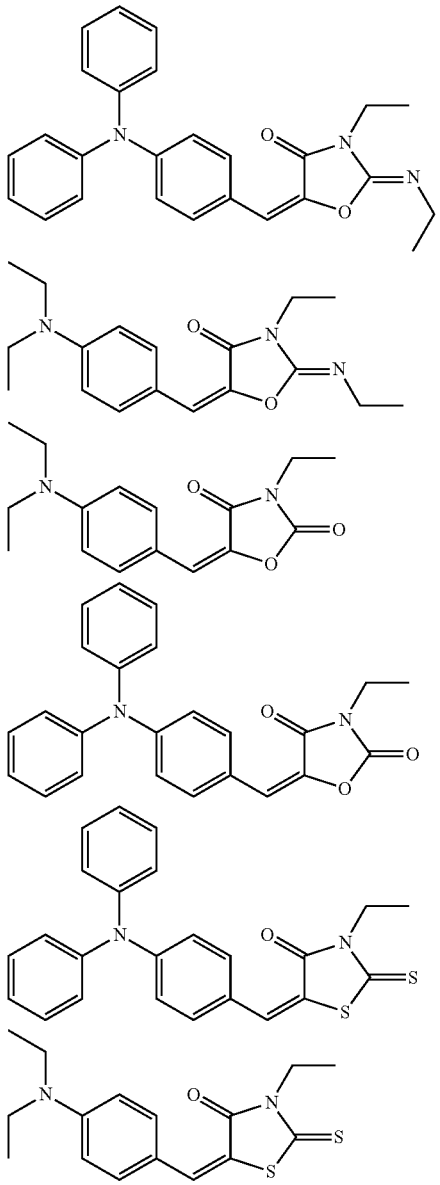

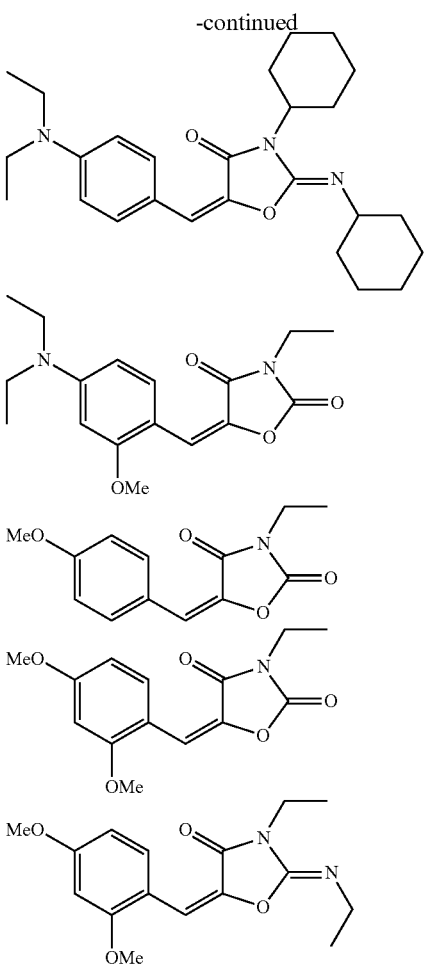

Co-sensitizer

It is preferable that the photosensitive resin composition of the invention further contain a co-sensitizer.

In the invention, the co-sensitizer functions to further increase the sensitivity of (E) the polymerization initiator or a sensitizer to the actinic radiation, or to suppress the polymerization inhibition of (D) the polymerizable compound caused by oxygen.

Examples of such co-sensitizers include amines, such as compounds as disclosed in "Journal of Polymer Society", Vol. 10, p. 3173 written by M. R. Sander, et al., JP-B No. 44-20189, JP-A No. 51-82102, JP-A No. 52-134692, JP-A No. 59-138205, JP-A No. 60-84305, JP-A No. 62-18537, JP-A No. 64-33104, and Research Disclosure No. 33825. More specifically, examples of co-sensitizers include triethanol amine, ethyl-p -dimethylaminobenzoate, p-formyldimethylaniline, and p-methylthiodimethylaniline.

Examples of other co-sensitizers include thiols and sulfides, for example, thiol compounds as disclosed in JP-A No. 53-702, JP-B No. 55-500806, and JP-A No. 5-142772, and disulfide compounds as disclosed in JP-A No. 56-75643. More specifically, examples of other co-sensitizers include 2-mercaptobenzothiazole, 2-mercaptobenzoxazole, 2-mercaptobenzimidazole, 2-mercapto-4(3H)-quinazoline, and β-mercaptonaphthalene.

Still other examples of co-sensitizers include amino acid compounds (for example, N-phenylglycine), organic metal compounds as disclosed in JP-B No. 48-42965 (for example, tributyl tin acetate), a hydrogen donor as disclosed in JP-B No. 55-34414, and sulfur compounds (for example, trithiane) as disclosed in JP-A No. 6-308727.

From the viewpoint of increasing the curing rate based on the balance of the polymerization growth rate and the chain transfer, the amount of the co-sensitizers is preferably in a range of 0.1% by mass to 30% by mass, more preferably in a range of 1% by mass to 25% by mass, and still more preferably in a range of 1.5% by mass to 20% by mass, with respect to a total solid content in the photosensitive resin composition.

Polymerization Inhibitor

In the invention, in order to prevent unnecessary polymerization of the polymerizable compound having an ethylenically unsaturated double bond during the manufacture or the storage of the photosensitive resin composition, it is preferable to add a polymerization inhibitor.

Examples of the polymerization inhibitor that can be used in the invention include phenolic hydroxy group-containing compounds, N-oxide compounds, piperidine-1-oxyl free radical compounds, pyrrolidine-1-oxyl free radical compounds, N-nitrosophenyl hydroxylamines, diazonium compounds, cationic dyes, sulfide group-containing compounds, nitro group-containing compounds, and transition metal compounds such as $FeCl_3$ or $CuCl_2$.

The following is a more preferable aspect of the polymerization inhibitor.

The phenolic hydroxy group-containing compound is preferably a compound selected from the group consisting of hydroquinone, p-methoxyphenol, di-t-butyl-p-cresol, pyrogallol, t-butyl catechol, benzoquinone, 4,4-thiobis(3-methyl-6-t-butylphenol), 2,2'-methylenebis(4-methyl-6-t-butylphenol), phenol resins, and cresol resins.

The N-oxide compound is preferably a compound selected from the group consisting of 5,5-dimethyl-1-pyrroline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide.

The piperidine-1-oxyl free radical compound is preferably a compound selected from the group consisting of piperidine-1-oxyl free radical, 2,2,6,6-tetramethyl piperidine-1-oxyl free radical, 4-oxo-2,2,6,6-tetramethyl piperidine-1-oxyl free radical, 4-hydroxy-2,2,6,6-tetramethyl piperidine-1-oxyl free radical, 4-acetamide-2,2,6,6-tetramethyl piperidine-1-oxyl free radical, 4-maleimide-2,2,6,6-tetramethyl piperidine-1-oxyl free radical, and 4-phosphonoxy-2,2,6,6-tetramethyl piperidine-1-oxyl free radical.

The pyrrolidine-1-oxyl free radical compound is preferably 3-carboxyproxyl free radical (3-carboxy-2,2,5,5-tetramethylpyrrolidine-1-oxyl free radical).

The N-nitrosophenylhydroxylamine is preferably a compound selected from the group consisting of N-nitrosophenylhydroxylamine cerium (III) salt and N-nitrosophenylhydroxylamine aluminum salt.

The diazonium compound is preferably a compound selected from the group consisting of 4-diazophenyldimethylamine hydrogensulfate, 4-diazodiphenylamine tetrafluoroborate and 3-methoxy-4-diazodiphenylamine hexafluorophosphate.

Examples of suitable polymerization inhibitors that can be used in the invention are shown below, but the invention is not restricted to these examples. Examples of phenol polymerization inhibitors are shown in the following compounds (P-1) to (P-24).

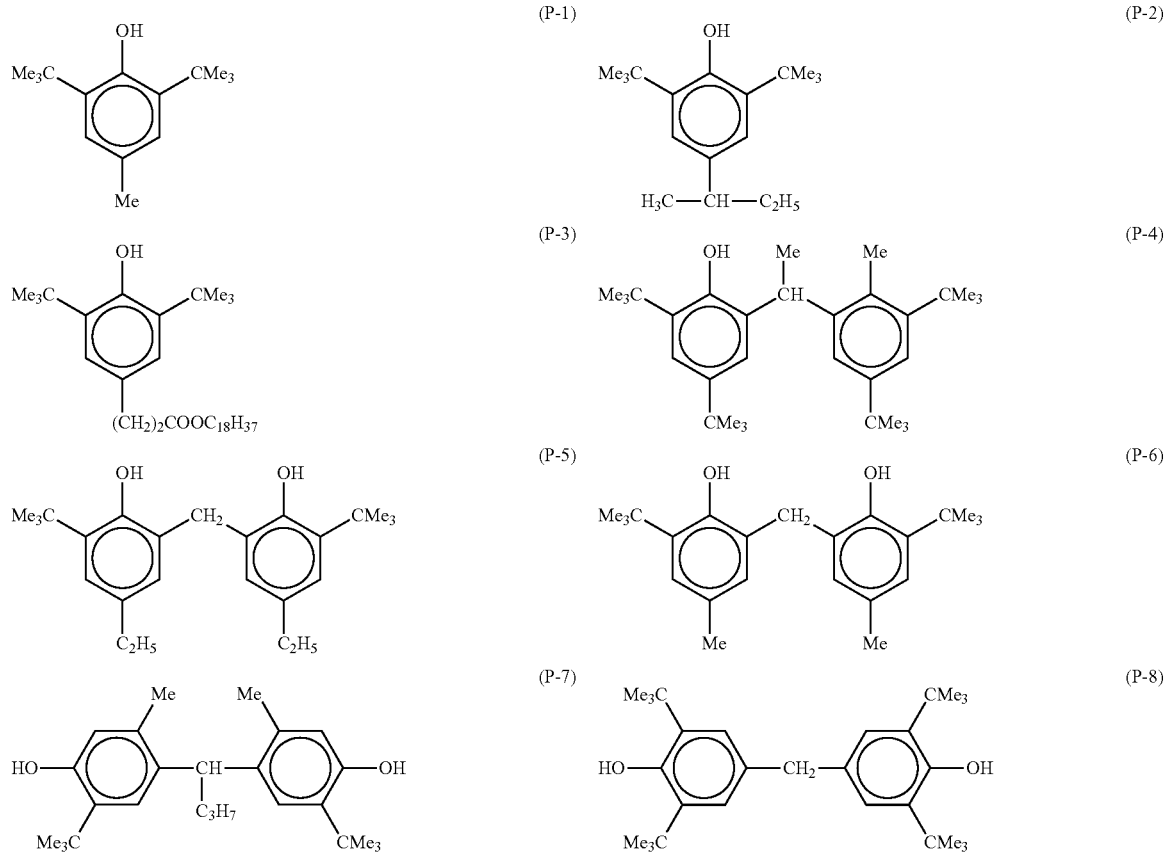

-continued
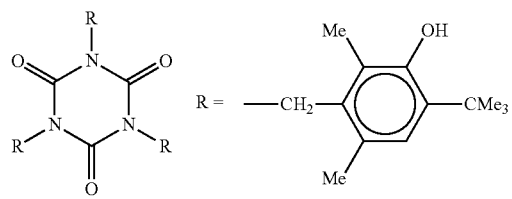 (P-9)
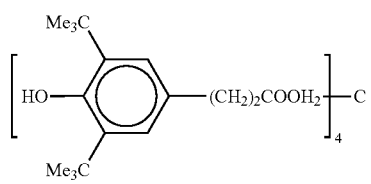 (P-10)
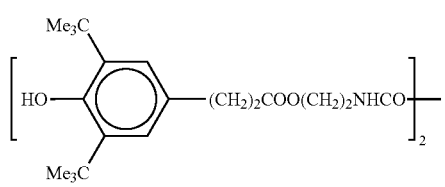 (P-11)
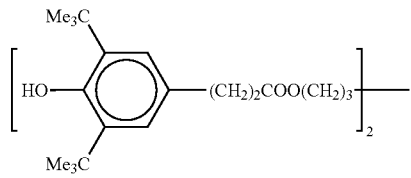 (P-12)
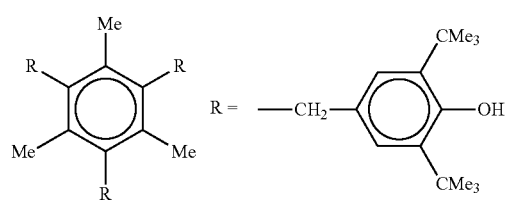 (P-13)
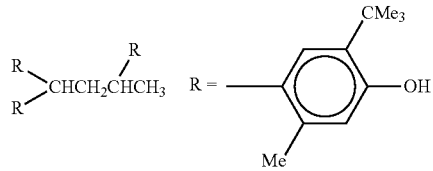 (P-14)
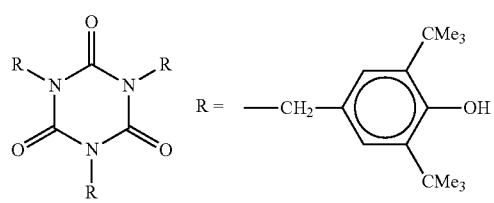 (P-15)
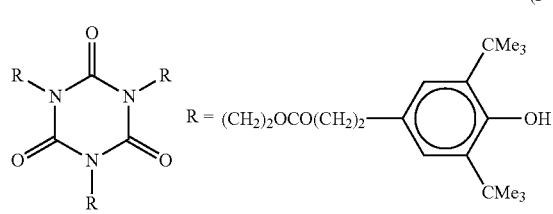 (P-16)
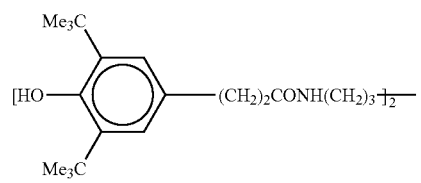 (P-17)
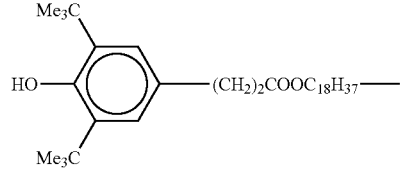 (P-18)
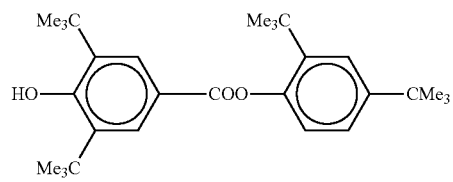 (P-19)
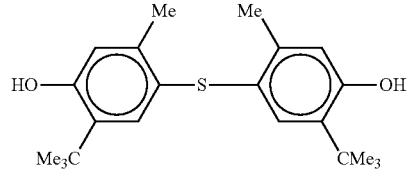 (P-20)
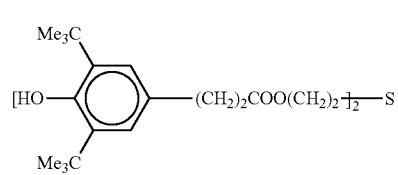 (P-21)
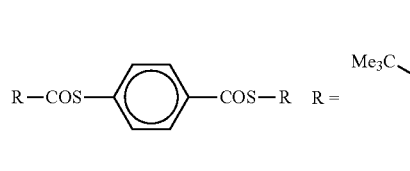 (P-22)
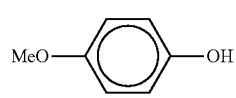 (P-23)
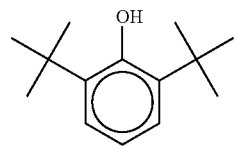 (P-24)

Examples of amine polymerization inhibitors include the following Exemplary Compounds (N-1) to (N-7).

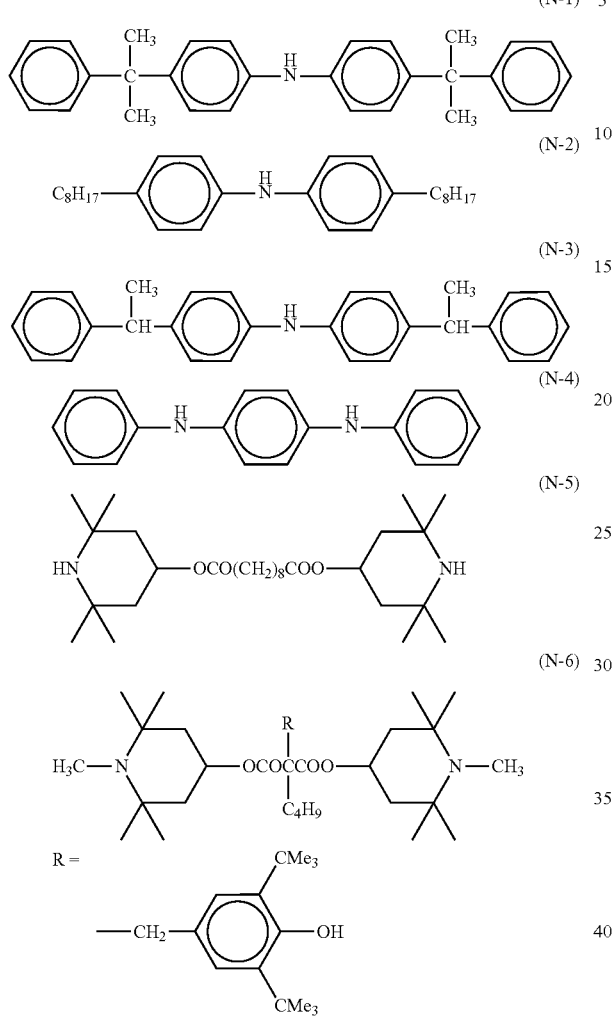

Examples of sulfur-containing polymerization inhibitors are shown in the following Exemplary Compounds (S-1) to (S-5).

| | |
|---|---|
| $(C_{18}H_{37}OCOCH_2CH_2)_2S$ | (S-1) |
| $(C_{12}H_{25}OCOCH_2CH_2)_2S$ | (S-2) |
| $(C_{13}H_{27}OCOCH_2CH_2)_2S$ | (S-3) |
| $(C_{14}H_{29}OCOCH_2CH_2)_2S$ | (S-4) |
| $(CH_2OCOCH_2CH_2SC_{12}H_{25})_4C$ | (S-5) |

Examples of the phosphite polymerization inhibitors are shown in the following Exemplary Compounds (R-1) to (R-5).

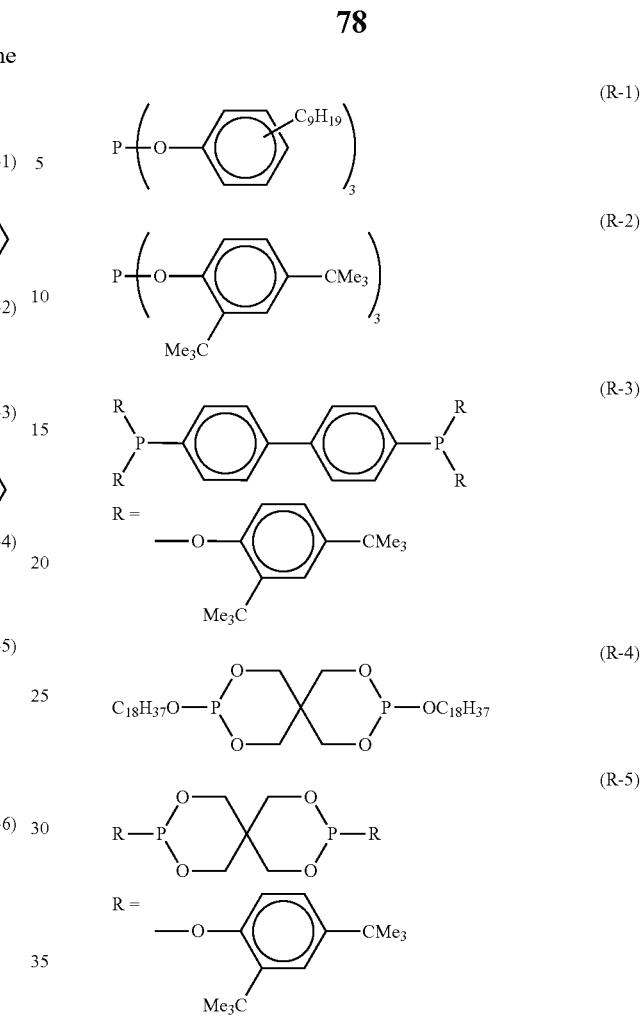

Furthermore, each of the following compounds can also be used as a suitable polymerization inhibitor.

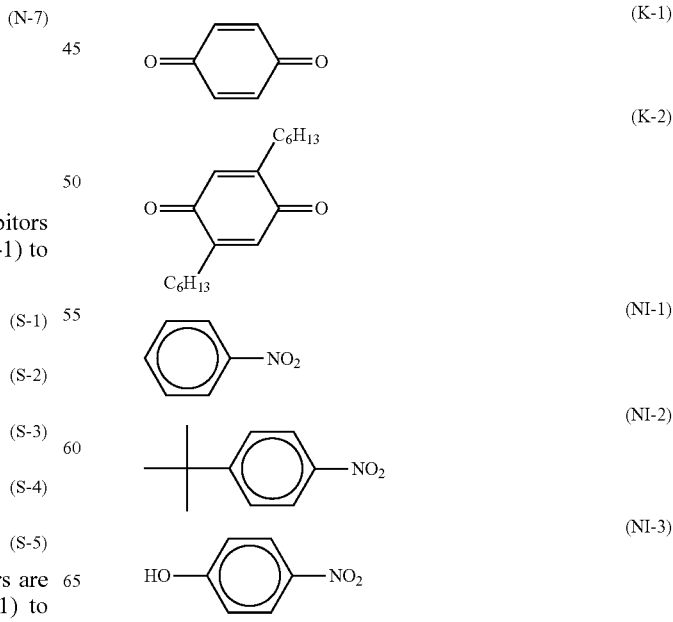

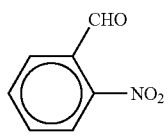 (NI-4)

CuCl₃ (C-1)

FeCl₃ (F-1)

FeBr₃ (F-2)

Among the above exemplary compounds, preferable examples include phenolic hydroxy group-containing compounds such as hydroquinone, p-methoxyphenol, di-t-butyl-p-cresol, pyrogallol, t-butyl catechol, benzoquinone, 4,4-thiobis(3-methyl-6-t-butylphenol), or 2,2'-methylene-bis(4-methyl-6-t-butylphenol); piperidine-1-oxyl free radical compounds, or piperidine-1-oxyl free radical compounds such as 2,2,6,6-tetramethylpiperidine-1-oxyl free radical, 4-oxo-2,2,6,6-tetramethyl piperidine-1-oxyl free radical, 4-hydroxy-2,2,6,6-tetramethylpiperidine-1-oxyl free radical, 4-acetamide-2,2,6,6-tetramethylpiperidine-1-oxyl free radical, 4-maleimide-2,2,6,6-tetramethylpiperidine-1-oxyl free radical, and 4-phosphonoxy-2,2,6,6-tetramethylpiperidine-1-oxyl free radical; and N -nitrosophenylhydroxylamine compounds such as N-nitrosophenylhydroxylamine cerium (III) salt and N-nitrosophenylhydroxylamine aluminum salt; and more preferable examples include piperidine-1-oxyl free radical compounds such as 2,2,6,6-tetramethylpiperidine-1-oxyl free radical, 4-oxo-2,2,6,6-tetramethylpiperidine-1-oxyl free radical, 4-hydroxy-2,2,6,6-tetramethylpiperidine-1-oxyl free radical, 4-acetamide-2,2,6,6-tetramethylpiperidine-1-oxyl free radical, 4-maleimide-2,2,6,6-tetramethylpiperidine-1-oxyl free radical, and 4-phosphonoxy-2,2,6,6-tetramethylpiperidine-1-oxyl free radical; or N -nitrosophenylhydroxylamine compounds such as N-nitrosophenylhydroxylamine cerium (III) salt and N-nitrosophenylhydroxylamine aluminum salt; and sill more preferable examples include N-nitrosophenylhydroxylamine compounds such as N-nitrosophenylhydroxylamine cerium (III) salt and N-nitrosophenylhydroxylamine aluminum salt.

The amount of the polymerization inhibitor to be added is preferably from 0.01 part by mass to 10 parts by mass, more preferably from 0.01 part by mass to 8 parts by mass, and most preferably from 0.05 part by mass to 5 parts by mass, with respect to 100 parts by mass of (E) the polymerization initiator.

When the amount is within the above ranges, the suppression of curing reaction in a non-image area, and the promotion of curing reaction in an image area can sufficiently be achieved, whereby good image formability and sensitivity can be obtained.

Binder Polymer

For the purpose of improving resolution and the film property, it is preferable that the photosensitive resin composition of the invention further includes at least one binder polymer.

As the binder polymer, it is preferable to use a linear organic polymer. As the linear organic polymer, any known polymer can be arbitrary used. In order to enable water development or weak alkaline-water development, a linear organic polymer that is soluble or swellable in water or weak alkaline water is selected. The linear organic polymer is used not only as a film-forming agent, but is selectively used in accordance with the usage as a water developer, a weak alkaline water developer or an organic solvent developer. For example, the use of a water-soluble organic polymer enables water development. Examples of such linear organic polymers include a radical polymer having a carboxy group in a side chain thereof, for example, polymers such as those disclosed in JP-A No. 59-44615, JP-B No. 54-34327, JP-B No. 58-12577, JP-B No. 54-25957, JP-A No. 54-92723, JP-A No. 59-53836, and JP-A No. 59-71048. That is, examples of the polymer include a resin formed by homopolymerization or copolymerization of a monomer having a carboxy group; a resin formed by hydrolyzing, half-esterifying or half-amidizing an acid anhydride unit formed by homopolymerization or copolymerization of a monomer having an acid anhydride; and an epoxy acrylate formed by modifying an epoxy resin with an unsaturated monocarboxylic acid and an acid anhydride. Examples of the monomer having a carboxy group include acrylic acid, methacrylic acid, itaconic acid, crotonic acid, maleic acid, fumaric acid, and 4-carboxyl styrene, and examples of the monomer having an acid anhydride include maleic anhydride.

Similarly, an acidic cellulose derivative having a carboxylic acid group in a side chain thereof may be used. In addition, a polymer formed by adding a cyclic acid anhydride to a polymer having a hydroxy group is also useful.

In the invention, when a copolymer is used as the binder polymer, monomers other than the monomers as described above may be used as a monomer to be copolymerized. Examples other monomers include the compounds described in (1) to (12) below:

(1) acrylates or methacrylates having an aliphatic hydroxy group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, or 4-hydroxybutyl methacrylate;

(2) alkyl acrylates such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexyl methylacrylate, vinyl acrylate, 2-phenylvinyl acrylate, 1-propenyl acrylate, allyl acrylate, 2-allyloxyethyl acrylate, or propargyl acrylate;

(3) alkyl methacrylates such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexyl methylmethacrylate, vinyl methacrylate, 2-phenylvinyl methacrylate, 1-propenyl methacrylate, allyl methacrylate, 2-allyloxyethyl methacrylate, or propargyl methacrylate;

(4) acrylamides or methacrylamides, such as acrylamide, methacrylamide, N -methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N -ethyl-N-phenyl acrylamide, vinyl acrylamide, vinyl methacrylamide, N,N-diallyl acrylamide; N,N-diallyl methacrylamide, allylacrylamide, or allylmethacryl amide;

(5) vinyl ethers such as ethyl vinyl ether, 2-chloroethyl vinyl ether, hydroxyethyl vinyl ether, propyl vinyl ether, butyl vinyl ether, octyl vinyl ether, or phenyl vinyl ether;

(6) vinyl esters such as vinyl acetate, vinyl chloroacetate, vinyl butyrate, or vinyl benzoate;

(7) styrenes such as styrene, α-methylstyrene, methylstyrene, chloromethylstyrene, or p-acetoxystyrene;

(8) vinyl ketones such as methyl vinyl ketone, ethyl vinyl ketone, propyl vinyl ketone, or phenyl vinyl ketone;

(9) olefins such as ethylene, propylene, isobutylene, butadiene, or isoprene;

(10) N-vinyl pyrrolidone, acrylonitrile, methacrylonitrile, or the like;

(11) unsaturated imides such as maleimide, N-acryloyl acrylamide, N-acetyl methacrylamide, N-propionyl methacrylamide, or N-(p-chlorobenzoyl)methacrylamide; and

(12) a methacrylic acid monomer in which a hetero atom is bonded to the α-position thereof (for example, compounds disclosed in JP-A Nos. 2002-309057 and 2003-311569).

It is preferable that the binder polymer contains a repeating unit obtained by polymerizing a monomer component that includes a compound represented by the following Formula (ED) (hereinafter, may be referred to as "ether dimer"), as an essential component.

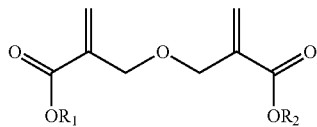

Formula (ED)

(In Formula (ED), $R^1$ and $R^2$ each independently represent a hydrogen atom or a hydrocarbon group having 1 to 25 carbon atoms, which may have a substituent.)

By using such a binder polymer, the curable resin composition of the invention is capable of forming a cured coating film having a highly excellent transparency as well as an highly excellent heat resistance. In Formula (ED), which represents an ether dimer, the hydrocarbon group having 1 to 25 carbon atoms, which is represented by $R^1$ or $R^2$ and may have a substituent, is not particularly limited. Examples thereof include a straight chain or branched alkyl group, such as a methyl group, an ethyl group, a n-propyl group, an isopropyl group, a n-butyl group, an isobutyl group, a t-butyl group, a t-amyl group, a stearyl group, a lauryl group, or a 2-ethylhexyl group; an aryl group such as a phenyl group; an alicyclic group such as a cyclohexyl group, a t-butylcyclohexyl group, a dicyclopentadienyl group, a tricyclodecanyl group, an isobornyl group, an adamantyl group, or a 2-methyl-2-adamantyl group; an alkyl group substituted by an alkoxy group, such as a 1-methoxyethyl group or a 1-ethoxyethyl group; and an alkyl group substituted by an aryl group such as a benzyl group. Among these, a substituent of primary or secondary carbon which is hardly eliminated by acid or heat, such as a methyl group, an ethyl group, a cyclohexyl group, or a benzyl group is particularly preferable in view of heat resistance.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, and di(2-methyl-2-adamantyl)-2,2'-[oxybis(methylene)]bis-2-propenoate. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. These ether dimers may be used singly or in combination of two or more kinds thereof. The structure unit derived from the compound represented by Formula (ED) may be copolymerized with another monomer.

Among these, a (meth)acrylate resin having an allyl group, a vinyl ester group, or the like and a carboxy group in a side chain thereof; an alkali soluble resin having a double bond in a side chain thereof such as those described in JP-A Nos. 2000-187322 2002-62698; and an alkali-soluble resin having an amide group in a side chain thereof such as those described JP-A No. 2001-242612 are suitable from the viewpoints of excellent balance of the film strength, the sensitivity and the developability.

Further, urethane binder polymers having an acid group, as disclosed in JP-B Nos. 7-12004, 7-120041, 7-120042, and 8-12424, JP-A Nos. 63-287944, 63-287947, and 1-271741, and urethane binder polymers having an acid group and a double bond such as those described in JP-A No. 2002-107918 have highly excellent strength, and therefore, are advantageous in terms of the film strength and low exposure suitability.

Further, acetal-modified polyvinyl alcohol binder polymers having an acid group such as those described in European Patent No. 993966, European Patent No. 1204000, and JP-A No. 2001-318463, or the like are excellent in the balance of the film strength and the developability, and therefore, are suitable.

In addition to these, polyvinylpyrrolidone, polyethylene oxide, or the like are also useful as the water-soluble linear organic polymer. In order to enhance the strength of a cured film, an alcohol-soluble nylon, a polyether of 2,2-bis-(4-hydroxyphenyl)propane and epichlorohydrin, and the like are useful.

The weight average molecular weight of the binder polymer that can be used in the photosensitive resin composition of the invention is preferably 5,000 or more, and more preferably in a range of from 10,000 to 300,000, and the number average molecular weight thereof is preferably 1,000 or more, and more preferably in a range of from 2,000 to 250,000. The polydispersity (weight average molecular weight/number average molecular weight) thereof is preferably 1 or more, and more preferably in a range of from 1.1 to 10.

The binder polymer may be a random polymer, a block polymer, a graft polymer, or the like.

The binder polymers that can be used in the invention can be synthesized by a conventionally known method. Examples of solvents used in the synthesis of the polymer include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propylacetate, N,N-dimethyl formamide, N,N-dimethyl acetamide, toluene, ethyl acetate, methyl lactate, ethyl lactate, dimethyl sulfoxide, and water. These solvents may be used singly or in combination of two or more kinds thereof.

Examples of the radical polymerization initiator used in the synthesis of the binder polymer that can be used in the photosensitive resin composition of the invention include conventionally known compounds such as an azo initiator and a peroxide initiator.

The amount of the binder polymer is preferably from 1% by mass to 40% by mass, more preferably from 3% by mass to 30% by mass, and still more preferably from 4% by mass to 20% by mass, with respect to a total solid content of the photosensitive resin composition.

Adhesion Promoter

In order to improve the adhesion to a hard surface such as a substrate surface, an adhesion promoter may be added to the photosensitive resin composition of the invention.

Examples of the adhesion promoter include silane coupling agents and titanium coupling agents.

Examples of the silane coupling agents include γ-(2-aminoethyl)aminopropyl trimethoxysilane, γ-(2-aminoethyl) aminopropyl dimethoxysilane, β-(3,4-epoxycyclohexyl) ethyl trimethoxysilane, γ-aminopropyl trimethoxysilane, γ-aminopropyl triethoxysilane, γ-methacryloxypropyl trimethoxysilane, γ-methacryloxypropyl triethoxysilane, γ-acryloxypropyl trimethoxysilane, γ-acryloxypropyl triethoxysilane, γ-isocyanate propyl trimethoxysilane, γ-isocyanate propyl triethoxysilane, N-β-(N -vinylbenzylaminoethyl)-γ-aminopropyl trimethoxysilane hydrochloride, γ-glycidoxypropyl trimethoxysilane, γ-glycidoxypropyl triethoxysilane, aminosilane, γ-mercaptopropyl trimethoxysilane, γ-mercaptopropyl triethoxysilane, methyl trimethoxysilane, methyl triethoxysilane, vinyl triacetoxysilane, γ-chloropropyl trimethoxysilane, hexamethyl disilazane, γ-anilinopropyl trimethoxysilane, vinyl trimethoxysilane, vinyl triethoxysilane, vinyl tris(β-methoxyethoxy)silane, octadecyldimethyl [3-(trimethoxysilyl)propyl]ammonium chloride, γ-chloropropylmethyl dimethoxysilane, γ-mercaptopropylmethyl dimethoxysilane, methyl trichlorosilane, dimethyl dichlorosilane, trimethyl chlorosilane, 2-(3,4-epoxycyclohexyl)ethyl trimethoxysilane, bisallyl trimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, and (acryloxymethyl)methyldimethoxysilane.

Among these, γ-methacryloxypropyl trimethoxysilane, γ-methacryloxypropyl triethoxysilane, γ-acryloxypropyl trimethoxysilane, γ-acryloxypropyl triethoxysilane, γ-mercaptopropyl trimethoxysilane, γ-aminopropyl triethoxysilane and phenyl trimethoxysilane are preferable, and γ-methacryloxypropyl trimethoxysilane is most preferable.

The amount of the adhesion promoter to be added is preferably from 0.5% by mass to 30% by mass, and more preferably from 0.7% by mass to 20% by mass, with respect to a total solid content of the photosensitive resin composition.

Other Additives

Further, in order to improve physical properties of the cured film, any one of known additives such as a plasticizer or a sensitizer may be added to the photosensitive resin composition.

Examples of the plasticizer include dioctyl phthalate, didodecyl phthalate, triethylene glycol dicaprylate, dimethylglycol phthalate, tricresyl phosphate, dioctyl adipate, dibutyl sebacate, and triacetyl glycerol. When a binder is used, the amount of the plasticizer to be added may be in an amount of 10% by mass or less, with respect to a total mass of the polymerizable compound and the binder polymer.

Ultraviolet Absorber

The photosensitive resin composition of the invention contains as an ultraviolet absorber at least one kind of compound represented by the following general formula (I), which is a conjugated diene compound. In the invention, when this conjugated diene compound is used, the changing in the developing performance, especially after performing the exposure with a low illuminance, can be suppressed, whereby the dependency on the exposure illuminance influencing on pattern forming properties such as a line width of a pattern, a film thickness, or a scattering spectrum is suppressed.

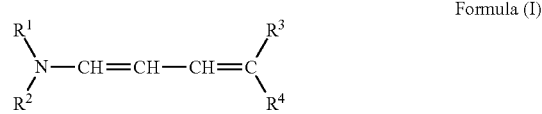

Formula (I)

In Formula (I), $R^1$ and $R^2$ each independently represent a hydrogen atom, an alkyl group having 1 to 20 carbon atoms, or an aryl group having 6 to 20 carbon atoms. $R^1$ and $R^2$ may be the same as or different from each other, but $R^1$ and $R^2$ do not simultaneously represent a hydrogen atom.

Examples of the alkyl group having 1 to 20 carbon atoms, which is represented by $R^1$ or $R^2$, include a methyl group, an ethyl group, a propyl group, an n-butyl group, an n-hexyl group, a cyclohexyl group, an n-decyl group, an n-dodecyl group, an n-octadecyl group, an eicosyl group, a methoxyethyl group, an ethoxypropyl group, a 2-ethylhexyl group, a hydroxy ethyl group, a chloropropyl group, an N,N-diethylamino propyl group, a cyanoethyl group, a phenethyl group, a benzyl group, a p-t-butylphenethyl group, a p-t-octyl phenoxy ethyl group, a 3-(2,4-di-t-amylphenoxy)propyl group, an ethoxycarbonyl methyl group, a 2-(2-hydroxyethoxy) ethyl group, and a 2-furylethyl group. A methyl group, an ethyl group, a propyl group, an n-butyl group, an n-hexyl group are preferable.

The alkyl group represented by $R^1$ and $R^2$ may have a substituent. Examples of the substituent of the alkyl group, which has the substituent, include an alkyl group, an aryl group, an alkoxy group, an allyloxy group, an acyloxy group, a halogen atom, an acylamino group, an acyl group, an alkylthio group, an arylthio group, a hydroxy group, a cyano group, an alkyloxy carbonyl group, an allyloxy carbonyl group, a substituted carbamoyl group, a substituted sulfamoyl group, a nitro group, a substituted amino group, an alkyl sulfonyl group, and an allyl sulfonyl group.

The aryl group having 6 to 20 carbon atoms, which is represented by $R^1$ or $R^2$, may be a monocyclic ring or a condensed ring, or either of a substituted aryl group with a substituent or an unsubstituted aryl group. Examples thereof include a phenyl group, a 1-naphthyl group, 2-naphthyl group, an anthryl group, a phenanthryl group, an indenyl group, an acenabutenyl group, and a fluorenyl group. Examples of the substituent of the substituted aryl group, which has the substituent, include an alkyl group, an aryl group, an alkoxy group, an allyloxy group, an acyloxy group, a halogen atom, an acylamino group, an acyl group, an alkylthio group, an arylthio group, a hydroxy group, a cyano group, an alkyloxy carbonyl group, an allyloxy carbonyl group, a substituted carbamoyl group, a substituted sulfamoyl group, a nitro group, a substituted amino group, an alkyl sulfonyl group, and an allyl sulfonyl group. Among these, a substituted or unsubstituted phenyl group, a 1-naphthyl group, and a 2-naphtyl group are preferable.

Furthermore, $R^1$ and $R^2$ may form a cyclic amino group together with the nitrogen atom to which $R^1$ and $R^2$ are linked. Examples of the cyclic amino group include a piperidino group, a morpholino group, a pyrrolidino group, a hexahydroazepine group, and a piperazino group.

Among these, as $R^1$ and $R^2$, a lower alkyl group having 1 to 8 carbon atoms (such as methyl, ethyl, isopropyl, butyl, sec-butyl, tert-butyl, pentyl, tert-pentyl, hexyl, octyl, 2-ethylhexyl, or tert-octyl), or a substituted or unsubstituted phenyl group (such as a tolyl group, a phenyl group, an anisyl group, a mesityl group, a chlorophenyl group, or a 2,4-di-t-amyl phenyl group) is preferable. It is also preferable that $R^1$ and $R^2$ are linked to each other to form a ring (such as a piperidine ring, a pyrrolidine ring, or a morpholine ring) which contains a nitrogen atom represented by N in the formula.

In the general formula (I), $R^3$ and $R^4$ represent an electron withdrawing group. The electron withdrawing group here is an electron withdrawing group whose Hammett substituent constant $\sigma_p$ value (hereinafter, simply referred to as a "$\sigma_p$ value") is from 0.20 to 1.0. Preferably, the electron withdrawing group is an electron withdrawing group whose $\sigma_p$ value is from 0.30 to 0.80.

The Hammett rule is an experimental rule which was proposed by L. P. Hammett in 1935 in order to quantitatively discuss an influence of a substituent group on a reaction or a balance of a benzene derivative. The validity of this rule is widely admitted these days. Substituent constants obtained by the Hammett rule include $\sigma_p$ value and $\sigma_m$ value, and description regarding these values can be found in many general books. For example, the detail thereof can be found in "Lange's Handbook of Chemistry" $12^{th}$ edition, edited by J. A. Dean, 1979 (McGraw Hill), "Kagaku no Ryoiki (Journal of Japanese Chemistry) special edition" vol. 122, pp 96-103, 1979 (Nankodo), and "Chemical Reviews" vol. 91, pp 165-195, 1991. It does not mean that the substituent of the invention is limited to a substituent with values known by these documents. As long as the value of the substituent is within the above ranges when measured based on the Hammett rule, the substituent with the value may be included in the electron withdrawing group even when the value is not known by these documents.

Specific examples of the electron withdrawing group with the $\sigma_p$ value from 0.20 to 1.0 include an acyl group, an acyloxy group, a carbamoyl group, an alkyloxy carbonyl group, an aryloxy carbonyl group, a cyano group, a nitro group, a dialkyl phosphono group, a diaryl phosphono group, a diaryl phosphinyl group, an alkyl sulfinyl group, an aryl sulfinyl group, an alkyl sulfonyl group, an aryl sulfonyl group, a sulfonyloxy group, an acylthio group, a sulfamoyl group, a thiocyanate group, a thiocarbonyl group, an alkyl group substituted with at least two or more halogen atoms, an alkoxy group substituted by at least two or more halogen atoms, an allyloxy group substituted with at least two or more halogen atoms, an alkyl amino group substituted by at least two or more halogen atoms, an alkylthio group substituted with at least two or more halogen atoms, an aryl group substituted with another electron withdrawing group with the $\sigma_p$ value of not less than 0.20, a heterocyclic group, a chlorine atom, a bromine atom, an azo group, and a selenocyanate group. Among these substituents, substituents that can further have a substituent may further include the substituent such as those described above.

Among these, $R^3$ and $R^4$ are preferably an acyl group, a carbamoyl group, an alkyloxy carbonyl group, an aryloxy carbonyl group, a cyano group, a nitro group, an alkyl sulfonyl group, an aryl sulfonyl group, a sulfonyloxy group, a sulfamoyl group, and more preferably an acyl group, a carbamoyl group, an alkyloxy carbonyl group, an aryloxy carbonyl group, a cyano group, an alkyl sulfonyl group, an aryl sulfonyl group, a sulfonyloxy group, or a sulfamoyl group.

Among these, $R^3$ is preferably a group selected from a cyano group, —COOR$^5$, —CONHR$^5$, —COR$^5$, and —SO$_2$R$^5$, and $R^4$ is preferably a group selected from a cyano group, —COOR$^6$, —CONHR$^6$, —COR$^6$, and —SO$_2$R$^6$ in the invention. $R^5$ and $R^6$ each independently represent an alkyl group having 1 to 20 carbon atoms, or an aryl group having 6 to 20 carbon atoms. The alkyl group having 1 to 20 carbon atoms and the aryl group having 6 to 20 carbon atoms, which are represented by $R^5$ and $R^6$, have the same definitions and the preferable definitions as $R^1$ and $R^2$, respectively.

Furthermore, $R^3$ and $R^4$ may be linked to each other to form a ring.

In addition, at least one of $R^1$, $R^2$, $R^3$, and $R^4$ may be a form of a polymer derived from a monomer that is connected with a vinyl group via a linking group, or may be a copolymer formed with another monomer. When at least one of $R^1$, $R^2$, $R^3$, and $R^4$ is a copolymer, examples of another monomer include acrylic acids, α-chloroacrylic acids, α-alacrylic acids (for example, esters derived from acrylic acids such as a methacrylic acid, preferably lower alkyl esters and amides, such as an acrylamide, a methacrylamide, a t-butyl acrylamide, a methyl acrylate, a methyl methacrylate, an ethyl acrylate, an ethyl methacrylate, an n-propyl acrylate, an n-butyl acrylate, a 2-ethylhexyl acrylate, an n-hexyl acrylate, an octyl methacrylate, a lauryl methacrylate, or a methylene bisacrylamide), vinyl esters (for example, a vinyl acetate, a vinyl propionate, and a vinyl laurate), an acrylonitrile, a methacrylonitrile, aromatic vinyl compounds (for example, a styrene or a derivative thereof such as a vinyl toluene, a divinyl benzene, a vinyl acetophenone, a sulfostyrene, and a styrene sulfinic acid), an itaconic acid, a citraconic acid, a crotonic acid, a vinylidene chloride, vinyl alkyl ethers (for example, a vinyl ethyl ether), maleic acid esters, an N-vinyl-2-pyrrolidone, N-vinyl pyridine, 2-vinyl pyridine, and 4-vinyl pyridine.

Among these, an acrylic acid ester, a methacrylic acid ester, and an aromatic vinyl compound are particularly preferable.

It is also possible to use two or more kinds of monomer compounds in combination. For example, a combination of an n-butyl acrylate and a divinyl benzene, a combination of a styrene and a methyl methacrylate, and a combination of a methyl acrylate and a methacrylic acid can be used.

Hereinbelow, specific examples (Exemplary Compounds (1) to (14)) of the preferable compound represented by Formula (I) are shown. However, the present invention is not limited thereto.

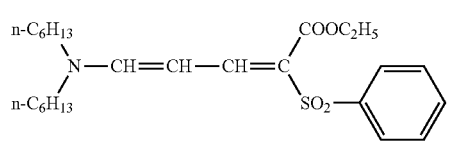

(1)

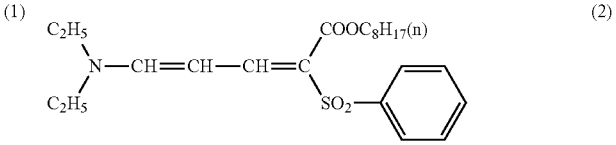

(2)

-continued

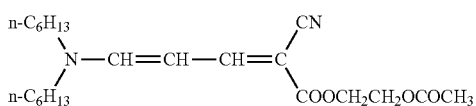  (3)

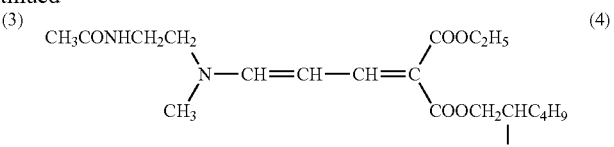  (4)

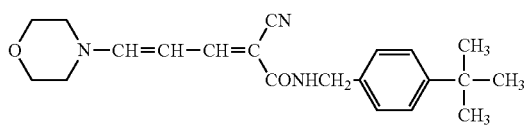  (5)

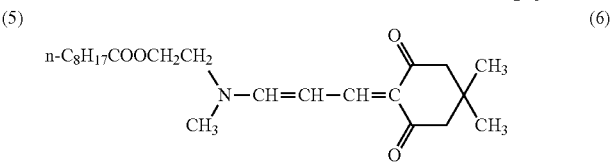  (6)

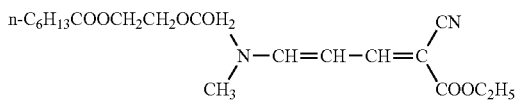  (7)

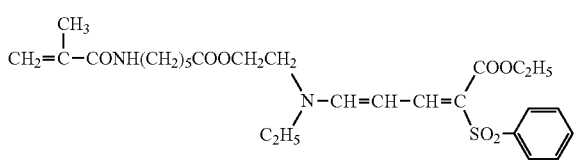  (8)

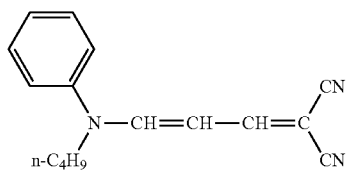  (9)

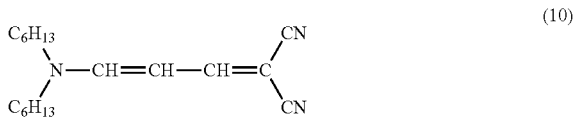  (10)

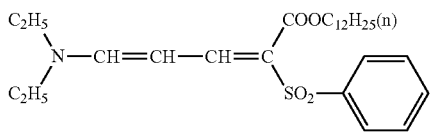  (11)

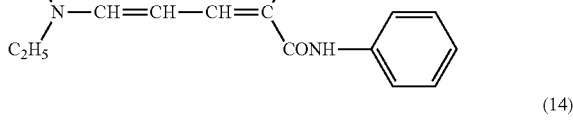  (12)

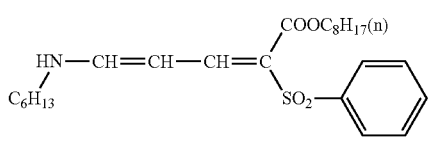  (13)

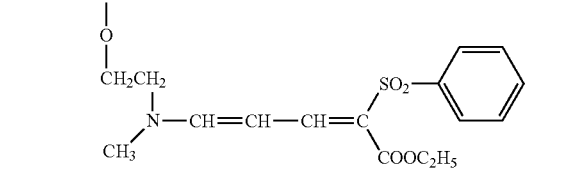  (14)

x:y = 80:20
(mass ratio)

The ultraviolet absorber represented by Formula (I) in the invention can be synthesized by a method such as those described in JP-B No. 44-29620, JP-A Nos. 53-128333, 61-169831, 63-53543, 63-53544, and 63-56651 or WO2009/123109A1. Specifically, above-mentioned Exemplary Compound (1) can be synthesized by the method described in the paragraph [0040] of WO2009/123109A1.

In the photosensitive resin composition of the invention, the content of the ultraviolet absorber (conjugated diene compound) represented by the general formula (I) is preferably in a range of from 0.01% by mass to 30% by mass, more preferably in a range of from 0.01% by mass to 20% by mass, and particularly preferably in a range of from 0.01% by mass to 15% by mass, with respect to a total solid content of the composition. When the content of this ultraviolet absorber is 0.01% by mass or more, light shielding performance at the time of the exposure is good, pattern thickening due to excessive proceeding of the polymerization is prevented making it easier to obtain a desirable pattern, and generation of the peripheral residue is suppressed. In addition, when the content of the ultraviolet absorber is 30% by mass or less, more favorable progression of the polymerization reaction can be achieved.

Microlens

The photosensitive resin composition of the invention can form a pattern having good resolution, a high refractive index, and a high transmittance. Accordingly, the photosensitive resin composition of the invention can be particularly suitable for use, for example, in forming microlenses and microlens arrays.

Method for Forming Microlens

The method for forming a microlens using the photosensitive resin composition of the invention is not specifically restricted, and a commonly used method can be used. Among these, a formation method that includes at least the following steps (I) to (IV) is preferable.

(I) A step for forming a coating film of the photosensitive resin composition of the invention on a substrate.

(II) A step of exposing at least a part of the coating film to radiation.

(III) A step of developing the coating film after exposure.

(IV) A step of heating the coating film after the development.

Hereinafter, these steps is described.

Step (I)

At this step, the photosensitive resin composition, preferably as a liquid composition, is applied onto the surface of a substrate and then the solvent is removed by prebaking, whereby a coating film is formed on the substrate.

Examples of the substrate include glass substrates, silicon wafers, glass substrates on which various metal layers are formed, silicon wafers on which various metal layers are formed, and substrates on which an on-chip color filter for image-sensors is provided.

The coating method is not specifically restricted, and any method such as spraying, roll coating, spin coating, or bar coating can be appropriately used.

The conditions for prebaking may be varied depending on the kind and amount of each component, but prebaking is usually performed for approximately 30 seconds to 15 minutes at 60° C. to 120° C. The thickness of a coating film to be formed, as a film thickness after pre-baking, is preferably approximately from 0.5 µm to 20 µm Step (II)

At this step, at least a part of the formed coating film is exposed to radiation.

When only a part of the coating film is exposed to radiation, radiation is applied through a mask having a predetermined pattern.

Examples of radiation that may be applied include ultraviolet ray such as g-ray or i-ray, deep-ultraviolet ray such as KrF excimer laser or ArF excimer laser, X ray such as synchrotron radiation, and charged particle beam such as electron beam. Among these, ultraviolet ray is preferable.

The irradiation dose can be appropriately selected according to the constitution of the photosensitive resin composition or the like, and it is preferable that the irradiation dose is approximately from 50 J/m$^2$ to 2,000 J/m$^2$.

Step (III)

At this step, the coating film after exposure is developed with a developer, preferably with an alkaline developer, to remove an unexposed area, whereby a pattern having a predetermined shape is formed.

Examples of the alkali developer include aqueous solutions of sodium hydroxide, potassium hydroxide, sodium carbonate, sodium silicate, sodium metasilicate, ammonia, ethylamine, n-propylamine, diethylamine, diethylaminoethanol, di-n-propylamine, triethylamine, methyl diethylamine, dimethyl ethanolamine, triethanolamine, tetramethylammonium hydroxide, tetraethylammonium hydroxide, pyrrole, piperidine, 1,8-diazabicyclo[5.4.0]-7-undecene, and 1,5-diazabicyclo[4.3.0]-5-nonene. Furthermore, an aqueous organic solvent such as methanol or ethanol, a surfactant, various kinds of organic solvents can be added to the alkaline developer for use.

The development method such as a puddle development, dipping development, shaking immersion development, or showering development can be appropriately used. Developing with an alkaline developer is usually followed by rinsing, for example, with running water.

Development time may be varied depending on the constitution of the photosensitive resin composition and the constitution of the developer, but development time is usually approximately from 30 seconds to 120 seconds at room temperature.

—Step (IV)—

At this step, the coating film after development is cured by heating (post-baking) using a heating apparatus such as a hot plate or an oven.

In the post-baking, heating is conducted usually at a temperature of from 120° C. to 250° C., and preferably from 160° C. to 230° C. The heating time may be varied depending on a heating method. When heating is performed on a hot plate, the heating time is usually approximately from 5 minutes to 30 minutes. When heating is performed in an oven, the heating time is usually approximately from 30 minutes to 90 minutes.

In addition, the post-baking may be conducted, for example, using a step baking method in which heating is repeated two or more times.

In this manner, a pattern corresponding to an intended microlens can be formed on the substrate.

According to the method for forming a microlens of the invention, high-resolution microlenses and microlens arrays having excellent characteristics (for example, a high refractive index and a high transmittance) can be easily formed at high product yield.

The microlens of the invention is formed using the photosensitive resin composition of the invention and thus has excellent balance of characteristics. Therefore, the microlens of the invention can be particularly suitable for use in liquid crystal display devices of various office automation apparatuses, liquid crystal TV, mobile phones, and projectors, optical imaging systems of on-chip color filters of facsimiles, electronic copying machines, and solid-state image pick-up elements, optical fiber connectors, and the like.

Solid-state Image Pick-up Element

The solid-state image pick-up element of the invention is provided with an optical member formed using the photosensitive resin composition of the invention. Examples of the optical member include microlenses, waveguides, reflection preventing films, and transparent pixels used as a part of color filter. These optical members may be made of a coating film formed using the photosensitive resin composition of the invention or a transparent pattern obtained by processing the photosensitive resin composition by photoreaction or dry etching. The transparent pattern is not specifically restricted, as long as it is used as a component of the solid-state image pick-up element. It is preferable that the transparent pattern is used as a transparent pattern processed by photoreaction. It is also preferable that the transparent pattern is used as a microlens.

EXAMPLES

The invention is described more specifically below by reference to examples. In the description below, "part(s)" and "%" are based on mass unless indicated otherwise.

Example 1

Preparation of Titanium Dioxide Dispersion (Dispersion Composition)

A mixed solution having the following composition was subjected to a dispersion treatment in a manner as described below using a rotary-type disperser (bead mill) ULTRA APEX MILL (trade name, manufactured by Kotobuki Industries Co., Ltd.), thereby obtaining a titanium dioxide dispersion as the dispersion composition.

Composition
  Titanium dioxide (trade name: TTO-51(C), manufactured by Ishihara Corporation,): 150 parts
  Specific resin 1 shown below: 40 parts
  Propylene glycol monomethyl ether acetate: 250 parts Specific Resin 1

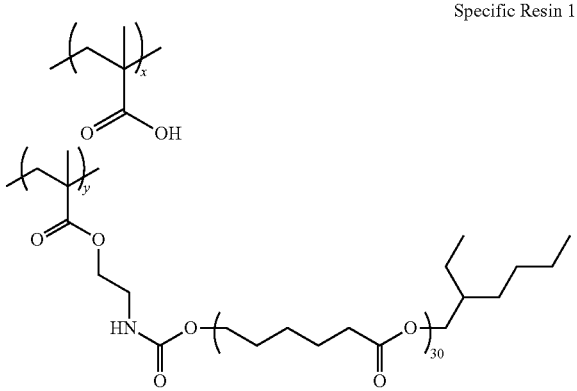

In the specific resin 1 represented by the above formula, the radio of x to y is 20 to 80; the number of atoms in the graft chain (other than the hydrogen atoms) is 257; and the weight-average molecular weight of the specific resin 1 is 20500.

In addition, the disperser was operated under the following conditions:
  Bead diameter: ∠0.05 mm
  Bead filling volume: 75% by volume
  Rotation speed: 8 m/sec
  Pump feed rate: 10 Kg/hour
  Cooling water: tap water
  Internal volume of annular passage of bead mill: 0.15 L
  Amount of mixed solution to be dispersed: 0.44 Kg After the start of dispersion treatment, an average particle diameter was measured at an interval of 30 minutes (run time of one pass).

The average particle diameter was reduced with an increase in dispersion time (the number of passes), and the amount of change in the average particle diameter was gradually reduced. Dispersion was terminated when the amount of change in the average particle diameter resulting from another 30-minutes extension of the dispersion time was 5 nm or less. Here, the average particle diameter of the titanium dioxide particles in the dispersion was 40 nm.

In addition, the average particle diameter of titanium dioxide in the example refers to a value obtained by diluting a mixed solution or dispersion including titanium dioxide 80-fold with propylene glycol monomethyl ether acetate and then performing measurement of an average particle diameter regarding the obtained diluted solution by using dynamic light scattering. The measurement is defined as a number-average particle diameter obtained using MICROTRACK UPA-EX150 manufactured by Nikkiso Co.; Ltd.

In addition, besides the measurement, with regard to 300 titanium dioxide particles contained in the obtain dispersion, respective projected areas of the titanium dioxide particles were obtained using a transmission electron microscope, and an arithmetical average value of the corresponding equivalent circular diameters was 40 nm.

Preparation of Photosensitive Resin Composition

Using the titanium dioxide dispersion (dispersion composition) obtained above, the respective components were mixed together so as to have the following composition, thereby obtaining a photosensitive resin composition.

Composition of Photosensitive Resin Composition
  Titanium dioxide dispersion (dispersion composition) prepared above: 10 parts
  Dipentaerythritol hexaacrylate (polymerizable compound, T-1 shown below): 8 parts
  Oxime photopolymerization initiator (polymerization initiator, K-1 shown below): 1 part
  Binder polymer (J-1 shown below; weight-average molecular weight (Mw) and copolymerization ratio (molar ratio) are as shown below. J-1 was synthesized based on a production method described in the description of Japanese Patent No. 4142973): 5 parts
  Compound (III) shown below (ultraviolet absorber): 1 part
  Propylene glycol monomethyl ether acetate: 76 parts

J-1

Mw=11000

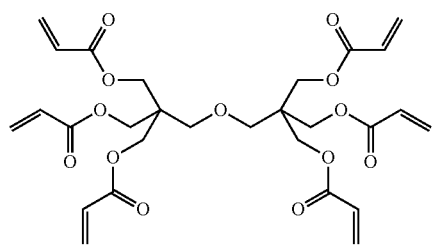

T-1

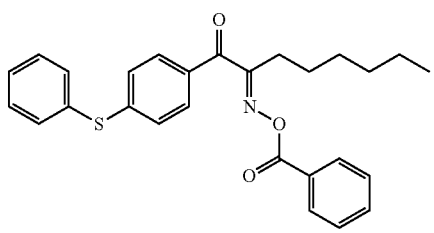

K-1

IRUGACURE OXE01
(manufactured by Ciba Japan)

-continued
K-2
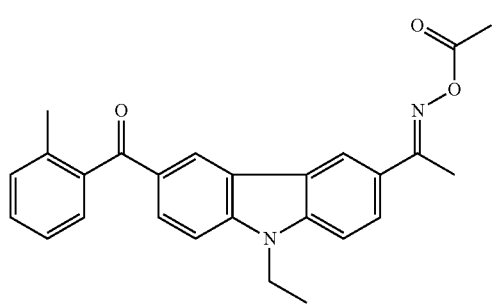
IRUGACURE OXE02
(manufactured by Ciba Japan)
K-3
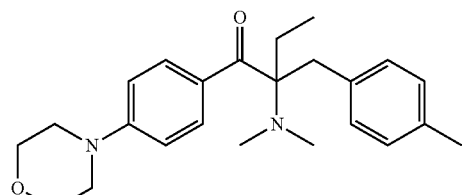
IRUGACURE 379
(manufactured by Ciba Japan)
K-4
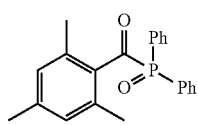
DAROCURE TPO
(manufactured by Ciba Japan)
K-5
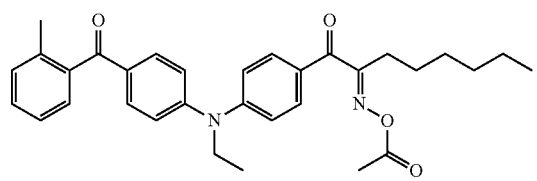
K-6
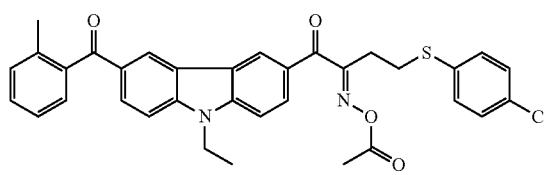
Compound (III)
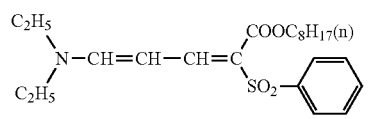
Compound (IV)
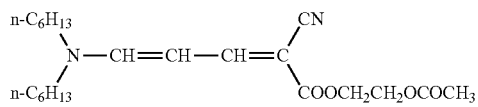
Compound (V)
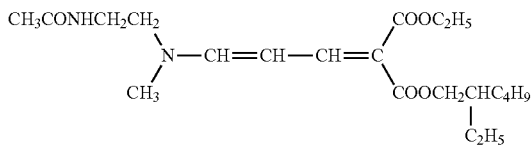
Compound (VI)
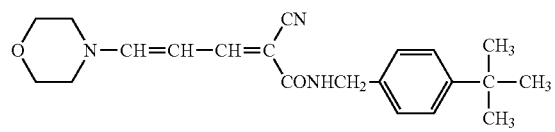
Compound (VII)
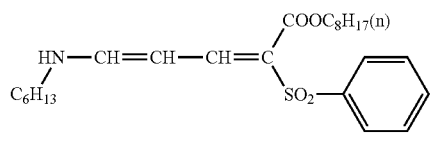
Compound (VIII)
Compound (IX)
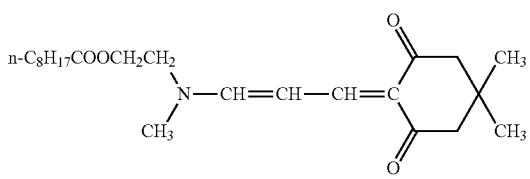

-continued

Compound (X)

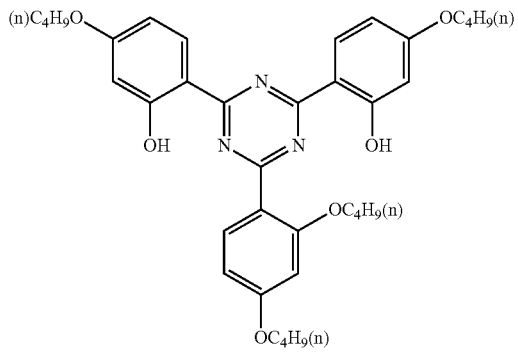

TINUVIN 460
(manufactured by Ciba Japan)

Compound (XI)

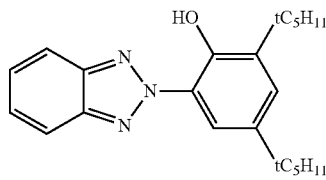

SumiSorb 350
(manufactured by Sumitomo
Chemical Co., Ltd.)

Formation of Transparent Patten

The photosensitive resin composition obtained above was applied onto a silicon wafer by spin coating, and then heating was performed on a hot plate at 100° C. for two minutes, thereby obtaining a photosensitive layer (coating film).

Subsequently, the photosensitive layer obtained was exposed through a mask to form five types of dot array patterns having different sizes, from 0.5 microns square to 2 microns square, using an i-ray stepper.

The photosensitive layer after the exposure was subjected to puddle development at 23° C. for 60 seconds using a 0.3% aqueous solution of tetramethylammonium hydroxide. Subsequently, rinsing was performed by a spin shower, followed by washing with pure water, thereby obtaining a transparent pattern having a thickness of 1.0 µm.

Evaluation of Resolution and Residue

The shape of the obtained transparent pattern was observed from the upper side of the silicon wafer at 30,000-fold magnification under a critical dimension SEM (trade name: S-7800H manufactured by Hitachi Ltd.). The minimum value of the sizes of the obtained dot pattern is shown as the resolution in Table 1.

Furthermore, Table 1 also indicates a case where a residue was observed near the pattern and a case where no residue was observed, as A and B, respectively.

Measurement of Transmittance and Refractive Index of Transparent Pattern

The photosensitive resin composition obtained above was applied onto a glass substrate by spin coating and then subjected to a heating treatment on a hot plate at 100° C. for two minutes, thereby obtaining a transparent pattern.

With regard to the substrate on which the transparent pattern was formed, transmittance of the transparent pattern was measured by using a spectrophotometer U-4100 (trade name, manufactured by Hitachi Ltd).

In a similar way, the photosensitive resin composition obtained above was applied onto a silicon wafer and then subjected to a heating treatment on a hot plate at 100° C. for two minutes, thereby obtaining a transparent pattern. With regard to the substrate on which the transparent pattern was formed, the refractive index of the transparent pattern was measured by using an ellipsometry VUV-VASE (trade name) manufactured by J.A. Woollam Japan Co., Inc.

The respective results are shown in Table 1.

Examples 2 to 22 and Comparative Examples 1 to 3

In the preparation of the titanium dioxide dispersion of Example 1, specific resins shown in Table 1 were used to prepare respective titanium dioxide dispersions instead of using specific resin 1.

In addition, using the obtained titanium dioxide dispersions, respective photosensitive resin compositions were prepared in the same manner as Example 1, except that the kind of the polymerization initiator and the amount of the ultraviolet absorber added were changed as shown in Table 1.

Furthermore, using the obtained photosensitive resin compositions, respective transparent patterns were formed and evaluated in the same manner as Example 1. The results are shown in Table 1.

Example 23

A photosensitive resin composition was prepared in the same manner as Example 1, except that titanium dioxide was replaced by a product shown below in the preparation of the titanium dioxide dispersion of Example 1.

Titanium dioxide (trade name: TTO-55(C), manufactured by Ishihara Sangyo Kaisha, Ltd.).

Here, projected areas of the titanium dioxide particles were obtained by using a transmission electron microscope, and an arithmetical average value for the corresponding equivalent circular diameters was 60 nm.

Using the obtained photosensitive resin composition, respective transparent patterns were produced and evaluated in the same manner as Example 1. The results are shown in Table 1.

TABLE 1

| | Specific resin/ Comparative resin | Polymerization initiator | UV absorber | Content of UV absorber (%) | Resolution | Residue | Refractive index (550 nm) | Transmittance (550 nm) | Note |
|---|---|---|---|---|---|---|---|---|---|
| Ex. 1 | Specific Resin 1 | K-1 | Compound (III) | 1 | 0.5 | A | 1.62 | 98.5 | Invention |
| Ex. 2 | Specific Resin 2 | K-1 | Compound (III) | 1 | 0.5 | A | 1.62 | 98.4 | Invention |
| Ex. 3 | Specific Resin 3 | K-1 | Compound (III) | 1 | 0.5 | A | 1.62 | 98.2 | Invention |
| Ex. 4 | Specific Resin 4 | K-1 | Compound (III) | 1 | 0.5 | A | 1.62 | 98.3 | Invention |
| Ex. 5 | Specific Resin 5 | K-1 | Compound (III) | 1 | 0.5 | A | 1.62 | 97.9 | Invention |
| Ex. 6 | Specific Resin 6 | K-1 | Compound (III) | 1 | 0.5 | A | 1.62 | 98.3 | Invention |
| Ex. 7 | Specific Resin 7 | K-1 | Compound (III) | 1 | 0.5 | A | 1.62 | 97.7 | Invention |
| Ex. 8 | Specific Resin 8 | K-1 | Compound (III) | 1 | 0.5 | A | 1.62 | 97.9 | Invention |
| Ex. 9 | Specific Resin 9 | K-1 | Compound (III) | 1 | 0.5 | A | 1.62 | 98.1 | Invention |
| Ex. 10 | Specific Resin 10 | K-1 | Compound (III) | 1 | 0.5 | A | 1.62 | 98.2 | Invention |
| Ex. 11 | Specific Resin 11 | K-1 | Compound (III) | 1 | 0.5 | A | 1.62 | 98.0 | Invention |
| Ex. 12 | Specific Resin 12 | K-1 | Compound (III) | 1 | 0.5 | A | 1.62 | 98.1 | Invention |
| Ex. 13 | Specific Resin 13 | K-1 | Compound (III) | 1 | 0.5 | A | 1.62 | 97.9 | Invention |
| Ex. 14 | Specific Resin 1 | K-2 | Compound (III) | 1 | 0.5 | A | 1.62 | 98.4 | Invention |
| Ex. 15 | Specific Resin 1 | K-3 | Compound (III) | 1 | 1 | A | 1.62 | 98.0 | Invention |
| Ex. 16 | Specific Resin 1 | K-4 | Compound (III) | 1 | 1 | A | 1.62 | 97.5 | Invention |
| Ex. 17 | Specific Resin 1 | K-5 | Compound (III) | 1 | 1 | A | 1.62 | 98.1 | Invention |
| Ex. 18 | Specific Resin 1 | K-6 | Compound (III) | 1 | 1 | A | 1.62 | 98.8 | Invention |
| Ex. 19 | Specific Resin 1 | K-1 | Compound (III) | 0 | 2 | A | 1.62 | 98.1 | Invention |
| Ex. 20 | Specific resin 1 | K-1 | Compound (III) | 0.5 | 0.8 | A | 1.62 | 97.6 | Invention |
| Ex. 21 | Specific Resin 1 | K-1 | Compound (III) | 2 | 1.5 | A | 1.62 | 97.9 | Invention |
| Ex. 22 | Specific Resin 14 | K-1 | Compound (III) | 1 | 0.5 | A | 1.62 | 98.6 | Invention |
| Ex. 23 | Specific Resin 1 | K-1 | Compound (III) | 1 | 0.5 | A | 1.62 | 98.4 | Invention |
| Comp. Ex. 1 | Comparative Resin 1 | K-1 | Compound (III) | 1 | 2 | B | 1.62 | 96.4 | Comparative Example |
| Comp. Ex. 2 | Comparative Resin 2 | K-1 | Compound (III) | 1 | 2 | B | 1.62 | 95.8 | Comparative Example |
| Comp. Ex. 3 | Comparative Resin 3 | K-1 | Compound (III) | 1 | 2 | B | 1.62 | 95.7 | Comparative Example |

As shown in Table 1, the photosensitive resin composition of the invention exhibits excellent pattern formability, in which resolution is high and generation of a residue is suppressed. It is also shown that the transparent patterns formed using the photosensitive resin composition of the invention have a high transmittance and a high refractive index.

Hereinbelow, the structures of the specific resins of Table 1 are shown. In addition, Table 2 shows a composition ratio (% by weight) of each structural unit, weight-average molecular weight, and the like of the following structural formulas.

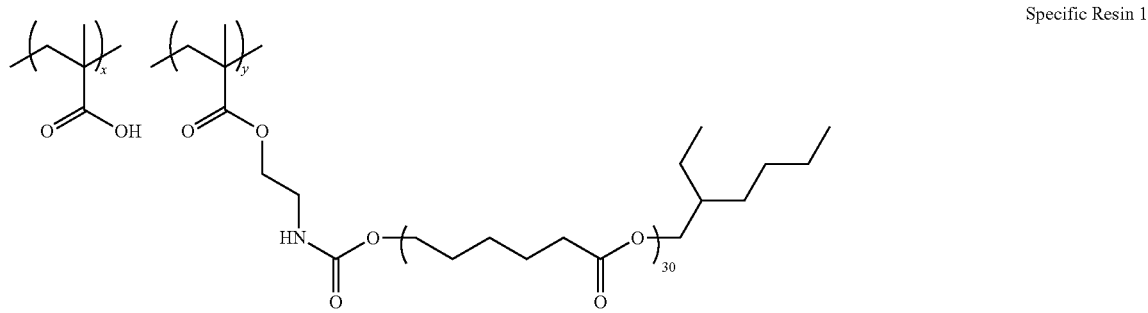

Specific Resin 1

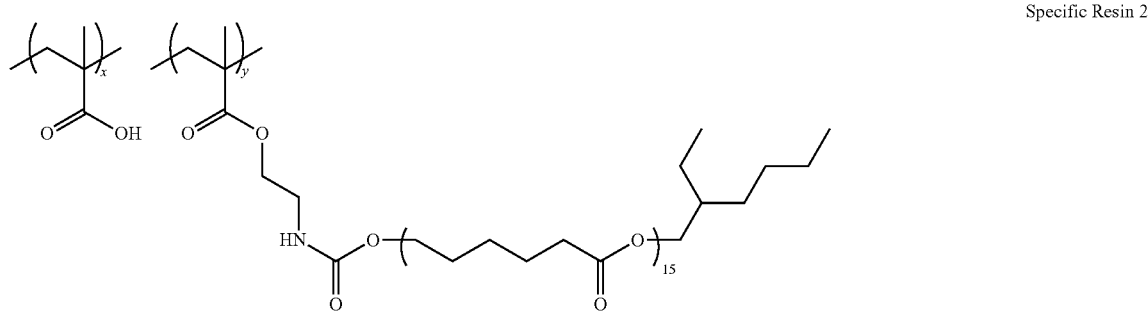

Specific Resin 2

-continued
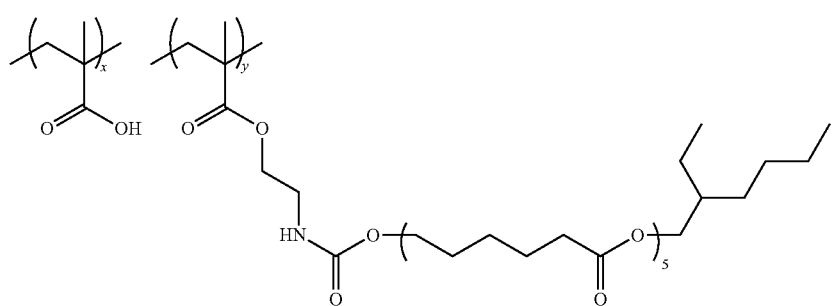
Specific Resin 3
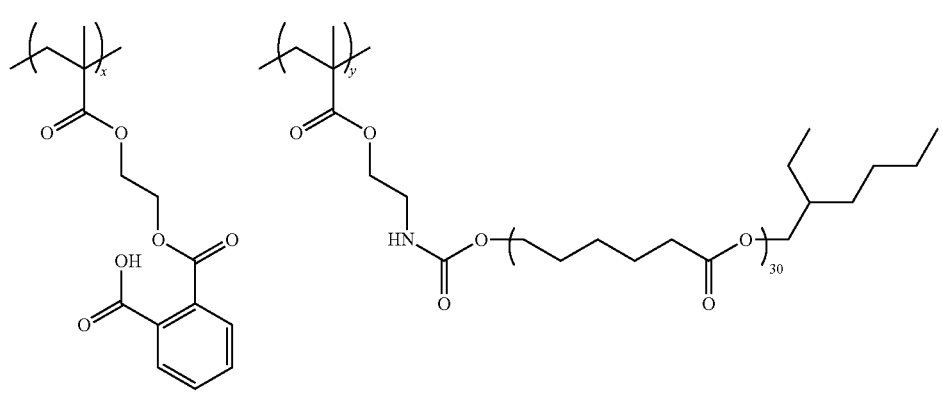
Specific Resin 4
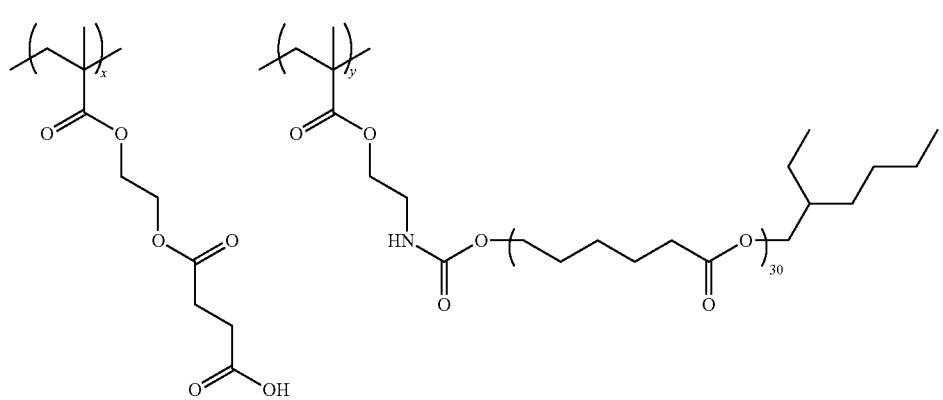
Specific Resin 5
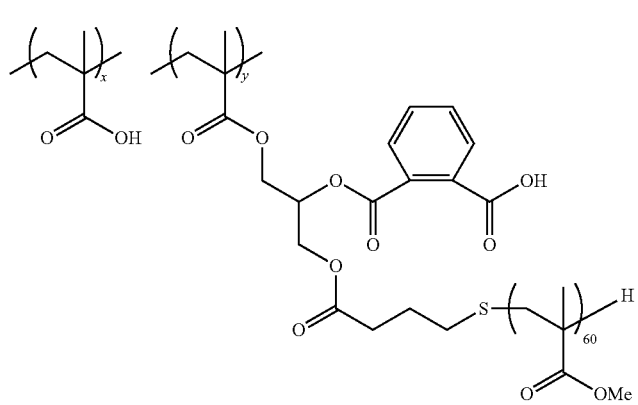
Specific Resin 6

-continued
Specific Resin 7
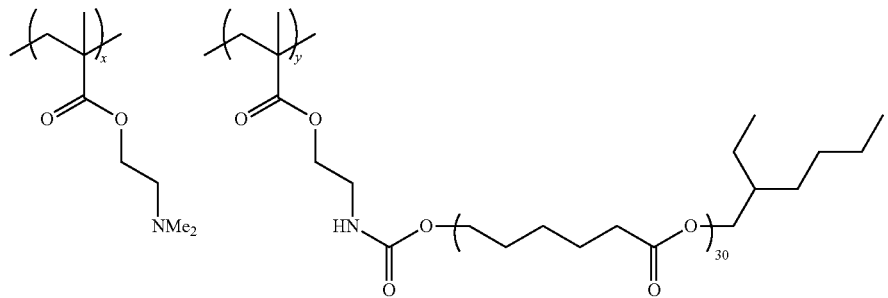
Specific Resin 8
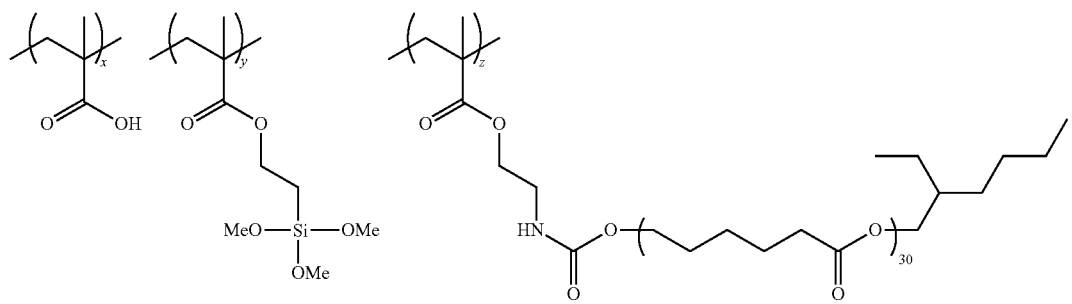
Specific Resin 9
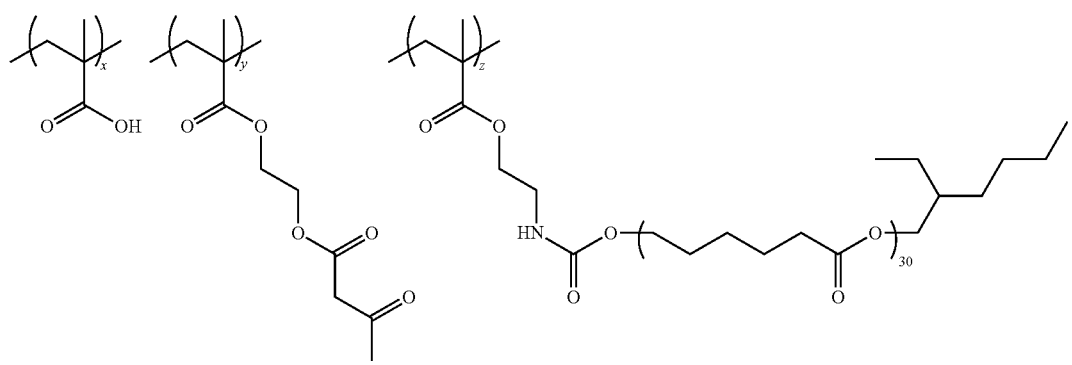
Specific Resin 10                                    Specific Resin 11
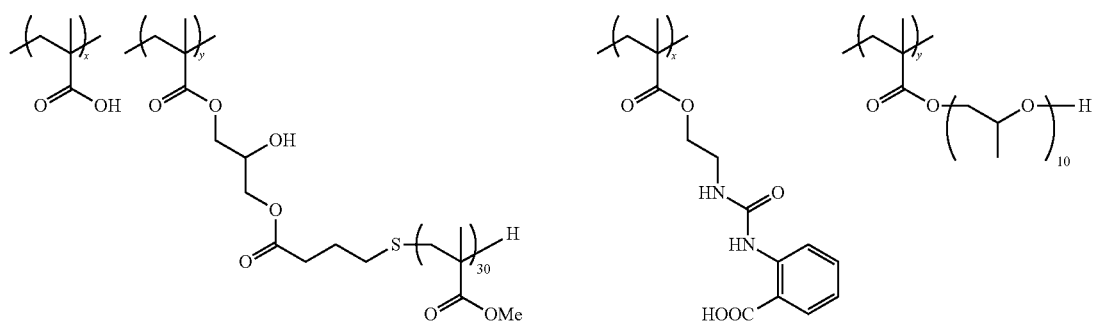

Specific Resin 12
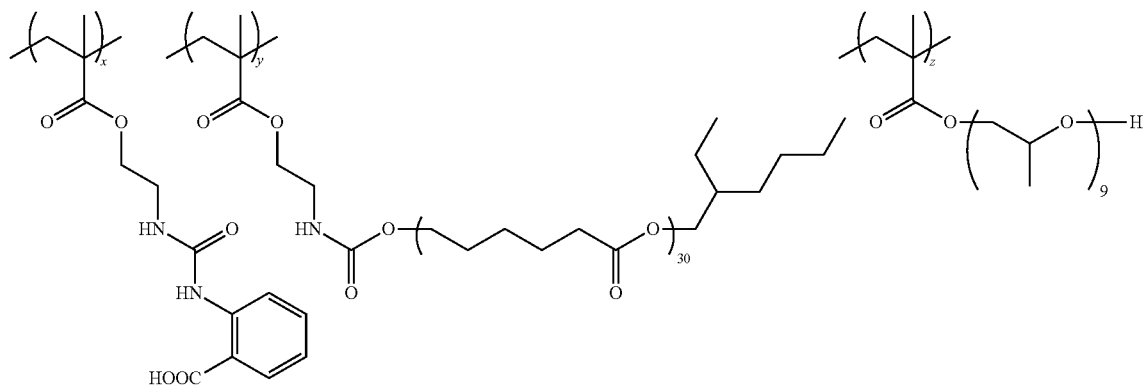
Specific Resin 13
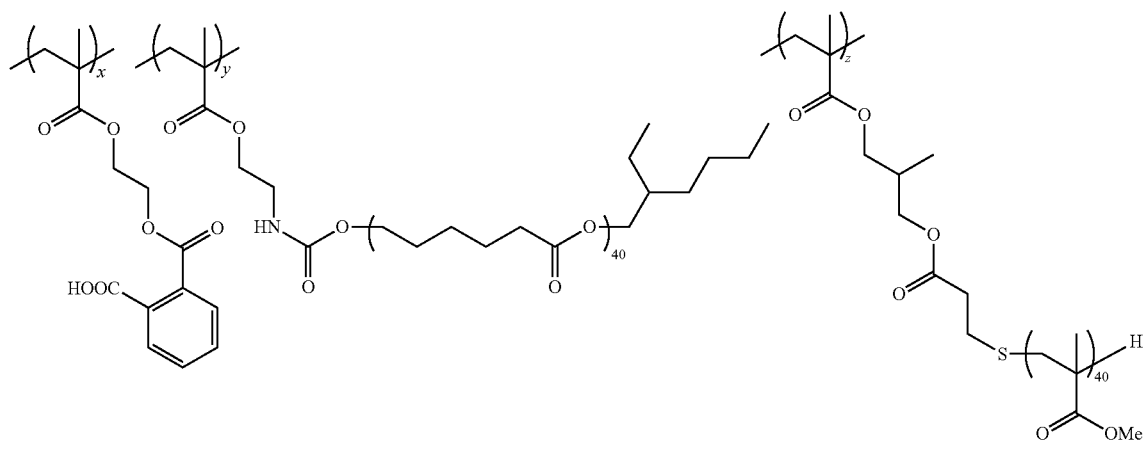
Specific Resin 14
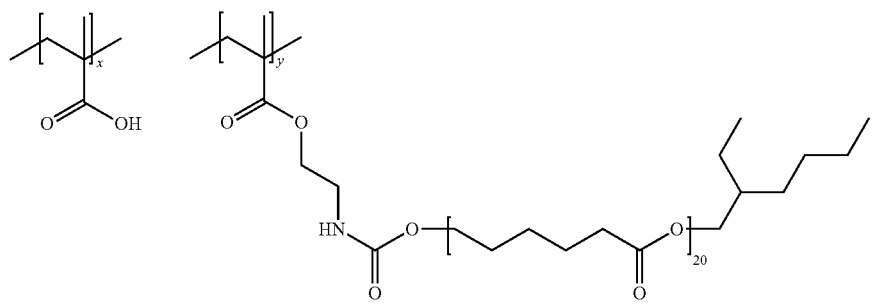
Comparative Resin 1
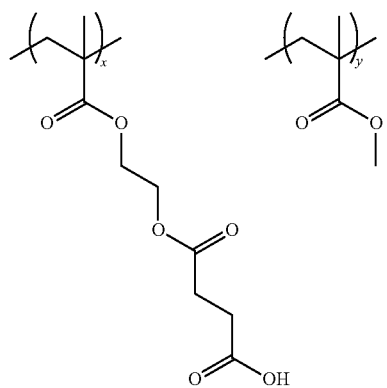
Comparative Resin 2
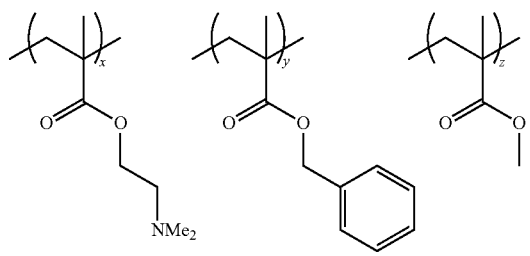

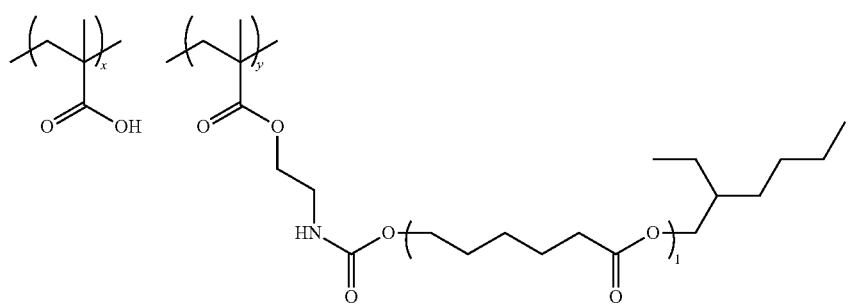

Comparative Resin 3

TABLE 2

| | Composition ratio (%) | | | Number of atoms in graft chain (other than hydrogen atoms) | Weight-average molecular weight |
|---|---|---|---|---|---|
| | x | y | z | | |
| Specific Resin 1 | 20 | 80 | — | 257 | 20500 |
| Specific Resin 2 | 20 | 80 | — | 137 | 22800 |
| Specific Resin 3 | 20 | 80 | — | 57 | 25500 |
| Specific Resin 4 | 20 | 80 | — | 257 | 26000 |
| Specific Resin 5 | 20 | 80 | — | 257 | 25800 |
| Specific Resin 6 | 20 | 80 | — | 444 | 27000 |
| Specific Resin 7 | 20 | 80 | — | 257 | 18000 |
| Specific Resin 8 | 10 | 10 | 80 | 257 | 17800 |
| Specific Resin 9 | 10 | 10 | 80 | 257 | 35000 |
| Specific Resin 10 | 20 | 80 | — | 224 | 36700 |
| Specific Resin 11 | 50 | 50 | — | 43 | 13000 |
| Specific Resin 12 | 30 | 30 | 40 | 257, 39 | 36700 |
| Specific Resin 13 | 40 | 30 | 30 | 337, 224 | 24500 |
| Specific Resin 14 | 15 | 85 | — | 177 | 35000 |
| Comparative Resin 1 | 10 | 80 | 10 | — | 28900 |
| Comparative Resin 2 | 10 | 45 | 45 | — | 25600 |
| Comparative Resin 3 | 20 | 80 | — | 25 | 26800 |

Example 101

A photosensitive resin composition was prepared in the same manner as Example 1 except that the composition of the photosensitive resin composition in Example 1 was changed as below.

In addition, using the obtained photosensitive resin composition, respective transparent patterns were formed and evaluated in the same manner as Example 1. The results are shown in Table 3.

Composition of Photosensitive Resin Composition
Titanium dioxide dispersion prepared in Example 1: 67 parts
Dipentaerythritol hexaacrylate (T-1): 3 parts
Oxime photopolymerization initiator (K-1): 0.5 parts
Binder polymer (J-1): 3 parts
Compound (III) (ultraviolet absorber): 2 parts
Propylene glycol monomethyl ether acetate: 24.5 parts Examples 102 to 109

Respective photosensitive resin compositions were prepared in the same manner as Example 101, except that, as the ultraviolet absorber, compounds shown in Table 3 were used instead of the compound (III) in the preparation of the photosensitive resin composition of Example 101.

Additionally, using the obtained photosensitive resin compositions, respective transparent patterns were formed and evaluated in the same manner as Example 1. The results are shown in Table 3.

Comparative Examples 101 to 102

Photosensitive resin compositions were prepared in the same manner as Example 101 except that, instead of the specific resin 1 used to prepare the titanium dioxide dispersion in Example 101, SOLSPERSE 5000 (trade name, a phthalocyanine derivative, manufactured by Lubrizol Japan Ltd.) and DISPER BYK180 (trade name, alkylol ammonium salt of a copolymer having an acidic group, manufactured by BYK Chemie), respectively, were used to prepare titanium dioxide dispersions.

Using the obtained photosensitive resin compositions, respective transparent patterns were formed and evaluated in the same manner as Example 1. The results are shown in Table 3.

TABLE 3

| | Specific resin/ Comparative resin | Polymerization initiator | UV absorber | Content of UV absorber (%) | Resolution | Residue | Refractive index (550 nm) | Transmittance (550 nm) | Note |
|---|---|---|---|---|---|---|---|---|---|
| Ex. 101 | Specific resin 1 | Compound 1 | Compound (III) | 2 | 1 | A | 1.85 | 96.4 | Invention |
| Ex. 102 | Specific resin 1 | Compound 1 | Compound (IV) | 2 | 1 | A | 1.85 | 97.1 | Invention |
| Ex. 103 | Specific resin 1 | Compound 1 | Compound (V) | 2 | 1.2 | A | 1.85 | 96.5 | Invention |
| Ex. 104 | Specific resin 1 | Compound 1 | Compound (VI) | 2 | 1.2 | A | 1.85 | 98.7 | Invention |
| Ex. 105 | Specific resin 1 | Compound 1 | Compound (VII) | 2 | 1.2 | A | 1.85 | 98.6 | Invention |
| Ex. 106 | Specific resin 1 | Compound 1 | Compound (VIII) | 2 | 1.2 | A | 1.85 | 98.5 | Invention |
| Ex. 107 | Specific resin 1 | Compound 1 | Compound (IX) | 2 | 1.2 | A | 1.85 | 98.4 | Invention |
| Ex. 108 | Specific resin 1 | Compound 1 | Compound (X) | 2 | 1 | A | 1.85 | 98.4 | Invention |
| Ex. 109 | Specific resin 1 | Compound 1 | Compound (XI) | 2 | 1.2 | A | 1.85 | 98.4 | Invention |

TABLE 3-continued

| Specific resin/ Comparative resin | Polymerization initiator | UV absorber | Content of UV absorber (%) | Resolution | Residue | Refractive index (550 nm) | Transmittance (550 nm) | Note |
|---|---|---|---|---|---|---|---|---|
| Com. Ex. 101 | SOLPERSE 5000 | Compound 1 | Compound (III) | 2 | * | B | 1.71 | 92.5 | Comparative Example |
| Com. Ex. 102 | DISPER BYK180 | Compound 1 | Compound (III) | 2 | * | B | 1.73 | 93.2 | Comparative Example |

*: No dot array pattern was obtained in the range (0.5 μm² to 2.0 μm²) covered by the experiment.

As shown in Table 3, the photosensitive resin composition of the invention exhibits excellent pattern formability, in which resolution is high and generation of a residue is suppressed. It is also shown that the transparent patterns formed using the photosensitive resin composition of the invention have a high transmittance and a high refractive index.

The invention claimed is:

1. A dispersion composition comprising (A) titanium dioxide particles having an average primary particle diameter of from 1 nm to 100 nm, (B) a graft copolymer that has a graft chain having a number of atoms other than hydrogen atoms in a range of from 40 to 10,000, and (C) a solvent, wherein (B) the graft copolymer is a graft copolymer including at least a structural unit represented by any of the following Formulae (1) to (4):

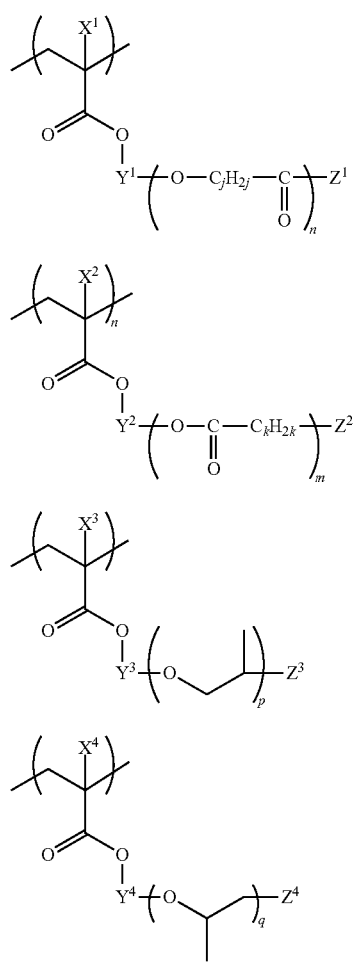

wherein in Formulae (1) to (4), $X^1$, $X^2$, $X^3$, and $X^4$ each independently represent a hydrogen atom or a monovalent organic group; $Y^1$, $Y^2$, $Y^3$, $Y^4$ each independently represent a divalent linking group; $Z^1$, $Z^2$, $Z^3$, and $Z^4$ each independently represent a hydrogen atom or a monovalent organic group; n, m, p, and q each independently represent an integer from 1 to 500;

and j and k each independently represent an integer from 2 to 8.

2. The dispersion composition according to claim 1, wherein the graft chain of (B) the graft copolymer is at least one selected from the group consisting of polyester structures, and polyether structures.

3. The dispersion composition according to claim 1, wherein (B) the graft copolymer is a graft copolymer including the structural unit represented by any of Formulae (1) to (4) in a range of from 10% by mass to 90% by mass with respect to a total mass of the graft copolymer.

4. The dispersion composition according to claim 1, wherein (B) the graft copolymer is a graft copolymer further comprising a structural unit that has a functional group capable of interacting with titanium dioxide particles.

5. The dispersion composition according to claim 4, wherein the functional group capable of interacting with titanium dioxide comprises at least one repeating unit obtained from a monomer represented by any one of the following Formulae (i) to (iii):

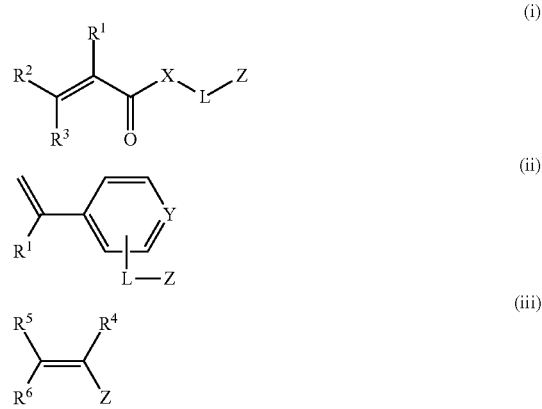

wherein in Formulae (i) to (iii), $R^1$, $R^2$, and $R^3$ each independently represent a hydrogen atom, a halogen atom, or an alkyl group having 1 to 6 carbon atoms; X represents an oxygen atom or an imino group; L is a single bond or a divalent linking group; Z represents a functional group capable of interacting with titanium dioxide; Y represents a methine group or a nitrogen atom; and $R^4$, $R^5$, and $R^6$ each independently represent a hydrogen atom, a halogen atom, or an alkyl group having 1 to 6 carbon atom, Z, or —L—Z, wherein L and Z have the same definitions as L and Z above, respectively.

6. The dispersion composition according to claim 1, wherein (B) the graft copolymer is a graft copolymer further comprising at least one selected from a carboxylic acid group, a sulfonate group, and a phosphate group.

7. A photosensitive resin composition comprising the dispersion composition according to claim 1, (D) a polymerizable compound, and (E) a polymerization initiator.

8. The photosensitive resin composition according to claim 7, further comprising a binder polymer.

9. The photosensitive resin composition according to claim 7, further comprising an ultraviolet absorber represented by the following Formula (I):

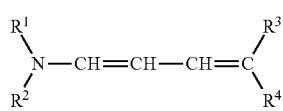

Formula (I)

wherein in Formula (I), $R^1$ and $R^2$ each independently represent a hydrogen atom, an alkyl group having 1 to 20 carbon atoms, or an aryl group having 6 to 20 carbon atoms; $R^1$ and $R^2$ may be the same as or different from each other, but $R^1$ and $R^2$ do not simultaneously represent a hydrogen atom, and $R^1$ and $R^2$ may form a cyclic amino group together with the nitrogen atom; and $R^3$ and $R^4$ each independently represent an electron withdrawing group.

10. The photosensitive resin composition according to claim 7, wherein (E) the polymerization initiator is an oxime polymerization initiator.

11. The photosensitive resin composition according to claim 7, which is used for microlens formation.

12. A solid-state image pick-up element comprising a transparent pattern formed using the photosensitive resin composition according to claim 7.

13. The solid-state image pick-up element according to claim 12, wherein the formed transparent pattern is a microlens.

14. The photosensitive resin composition according to claim 7, wherein
the graft chain of (B) the graft copolymer is at least one selected from the group consisting of polyester structures, polyether structures, and poly(meth)acrylic structures.

15. The dispersion composition according to claim 1, wherein, $Y^1$, $Y^2$, Y3, and $Y^4$ in Formulae (1) to (4) each independently represent a connecting group selected from the following (Y-1) to (Y-20):

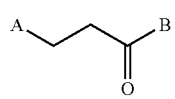
(Y-1)

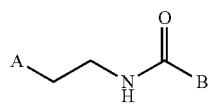
(Y-2)

-continued

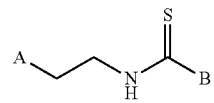
(Y-3)

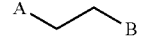
(Y-4)

(Y-5)

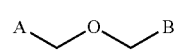
(Y-6)

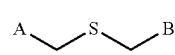
(Y-7)

(Y-8)

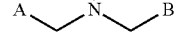
(Y-9)

(Y-10)

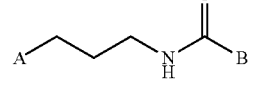
(Y-11)

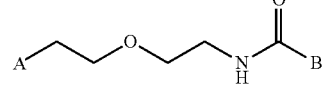
(Y-12)

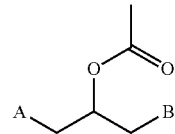
(Y-13)

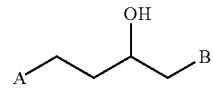
(Y-14)

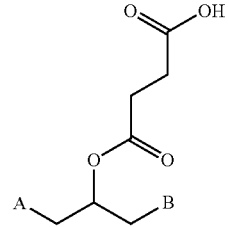
(Y-15)

(Y-16)

-continued (Y-17)

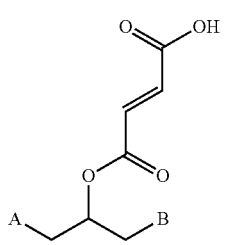

(Y-18)

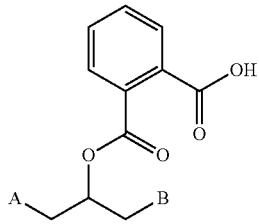

(Y-19)

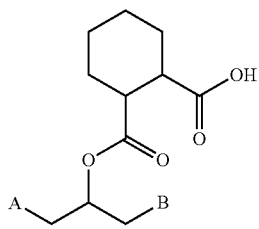

-continued (Y-20)

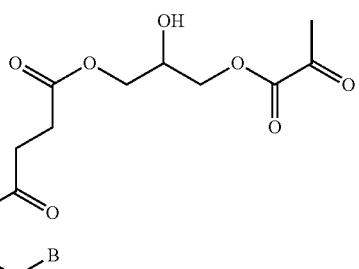

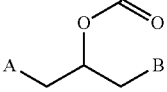

wherein "A" represents a bond to the left terminal end group of $Y^1$, $Y^2$, $Y^3$, or $Y^4$ in Formulae (1) to (4), and "B" represents a bond to the right terminal end group Of $Y^1$, $Y^2$, $Y^3$, or $Y^4$ in Formulae (1) to (4).

16. The dispersion composition according to claim 1, wherein m represents an integer from 3 to 500, and p represents an integer from 5 to 500.

17. The dispersion composition according to claim 1, wherein n, m, p, and q each independently represent an integer from 5 to 500.

18. A dispersion composition comprising (A) titanium dioxide particles having an average primary particle diameter of from 1 nm to 100 nm, (B) a graft copolymer that has a graft chain having a number of atoms other than hydrogen atoms in a range of from 40 to 10,000, and (C) a solvent, wherein the graft chain of (B) the graft copolymer is at least one selected from the group consisting of a polyester structure, a polyurethane structure, a polyurea structure, and a polyamide structure.

* * * * *